(12) United States Patent
Tsutsumi et al.

(10) Patent No.: US 6,577,210 B1
(45) Date of Patent: Jun. 10, 2003

(54) SURFACE ACOUSTIC WAVE FILTER HAVING PLURAL PROPAGATION PATHS AND A COUPLER

(75) Inventors: Jun Tsutsumi, Kawasaki (JP); Takashi Matsuda, Kawasaki (JP); Osamu Ikata, Kawasaki (JP); Yoshio Satoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/659,592

(22) Filed: Sep. 11, 2000

Related U.S. Application Data

(63) Continuation of application No. PCT/JP99/00233, filed on Jan. 21, 1999.

(30) Foreign Application Priority Data

| Mar. 11, 1998 | (JP) | 10-059977 |
| Aug. 12, 1998 | (JP) | 10-228068 |
| Oct. 22, 1998 | (JP) | 10-301161 |

(51) Int. Cl.$^7$ ................................ H03H 9/64
(52) U.S. Cl. ............ 333/195; 333/196; 310/313 D
(58) Field of Search .............. 333/193–196; 310/313 B, 313 D

(56) References Cited

U.S. PATENT DOCUMENTS

| 4,065,735 A | * | 12/1977 | Palfreeman et al. ......... 333/195 |
| 4,155,056 A | * | 5/1979 | Cross et al. ................. 333/195 |
| 4,166,987 A | * | 9/1979 | Coldren .................... 333/193 X |
| 4,237,433 A | * | 12/1980 | Tanski ......................... 333/195 |
| 4,325,038 A | * | 4/1982 | Coldren ....................... 333/195 |
| RE32,859 E | * | 2/1989 | Marshall et al. ......... 333/196 X |
| 6,104,260 A | * | 8/2000 | Yamada et al. ......... 333/196 X |
| 6,114,927 A | * | 9/2000 | Matsuda et al. ........ 333/196 X |

FOREIGN PATENT DOCUMENTS

| JP | 55-144423 | | 4/1954 | |
| JP | 50-17951 | | 2/1975 | |
| JP | 50-39445 | | 4/1975 | |
| JP | 57-5418 | | 1/1982 | |
| JP | 57-129514 | * | 8/1982 | |
| JP | 57-147316 | | 9/1982 | |
| JP | 58-190117 | | 11/1983 | |
| JP | 58-191514 | * | 11/1983 | ................. 333/155 |
| JP | 59-34712 | | 2/1984 | |
| JP | 59-72816 | | 4/1984 | |
| JP | 60-10905 | * | 1/1985 | ................. 367/191 |
| JP | 60-112307 | | 6/1985 | |

(List continued on next page.)

OTHER PUBLICATIONS

Surface Acoustic Wave Device Technological handbook, 1991, Printed in Japan.

G. Golan et al.; "Grating Assisted Saw Directional Couplers"; Forty–Fifth Annual Symposium on Frequency Control. IEEE, 1991. pp. 247–253.

*Primary Examiner*—Barbara Summons
(74) *Attorney, Agent, or Firm*—Armstrong, Westerman & Hattori, LLP

(57) ABSTRACT

The present invention relates to a surface acoustic wave filter which is characterized in that it includes a piezoelectric substrate, a plurality of surface acoustic wave propagation paths arranged in parallel on the piezoelectric substrate and a coupler for coupling the surface acoustic wave propagation paths, an input interdigital transducer and a first reflector are disposed on at least one of the surface acoustic wave propagation paths with intervention of the coupler, and an output interdigital transducer and a second reflector are disposed on at least one of the other surface acoustic wave propagation paths with intervention of the coupler. This construction can reduce the length of the surface acoustic wave filter in a surface acoustic wave propagation direction and can improve the shape factor of a frequency characteristic curve.

28 Claims, 78 Drawing Sheets

FOREIGN PATENT DOCUMENTS

| | | |
|---|---|---|
| JP | 62-501042 | 4/1987 |
| JP | 63-119310 | 5/1988 |
| JP | 1-268216 | 10/1989 |
| JP | 4-150217 | 5/1992 |
| JP | 5-235686 | 9/1993 |
| JP | 5-299969 | 11/1993 |
| JP | 7-50548 | 2/1995 |
| JP | 7-66678 | 3/1995 |

* cited by examiner

SAW mode profile input in the first propagation path (a)

(b)

Free surface

Fig. 16 — Grating of metal filim

SURFACE ACOUSTIC WAVE FILTER HAVING PLURAL PROPAGATION PATHS AND A COUPLER

This application is a continuation of international application PCT/JP99/00233 filed Jan. 21, 1999.

FIELD OF INVENTION

The present invention relates to a surface acoustic wave filter and more particularly to a surface acoustic wave filter having a plurality of surface acoustic wave propagation paths formed in parallel.

BACKGROUND ART

Recently, in mobile communication systems such as portable telephones, a new digital system referred to as a CDMA (Code Division Multiple Access) system is being adopted in addition to a TDMA (Time Division Multiple Access) system.

IF (Intermediate Frequency) filters used for the CDMA system are required to exhibit a frequency characteristic curve with remarkably excellent shape factor as compared with conventional portable telephone systems. Here the shape factor is the ratio of bandwidths (a first bandwidth and a second bandwidth) at two attenuation amounts, i.e., the second bandwidth/the first bandwidth, as shown in FIG. 32. The bandwidths at the two attenuation amounts are, for example, a 3-dB bandwidth and a 10-dB bandwidth. The closer to one the ratio of the bandwidths at the two attenuation amounts is, the more excellent the shape factor is. Thus, excellent shape factor indicates that a filter characteristic curve shows a sharp change.

FIG. 31 shows a transversal filter which is one of surface acoustic waver filters currently in use. This filter is composed of an IDT (interdigital transducer) for inputting signals on one side and an IDT for outputting signals on another side.

The IDT on the right in FIG. 31 is comprised of regular electrodes whose electrode fingers, extending upward and downward, have a fixed length while the IDT on the left is comprised of electrodes weighted by apodization whose electrode fingers differ in length according to a certain rule.

The shape factor of frequency characteristic curves of surface acoustic waver filters has been improved by weighting IDTs like such apodization of electrodes for weighting.

However, for realizing a surface acoustic wave filter having a sufficiently good shape factor by weighting an IDT as by weighting electrodes by apodization, a huge number of electrode pairs are required. That gives rise to a problem that the length in a surface acoustic wave propagation direction (the right and left direction in FIG. 31) increases. For satisfying the portability and size reduction of portable telephones and the like, surface acoustic wave filters also need to be smaller. However, increase in the size of the surface acoustic wave filters for improving the shape factor contradicts the need for their size reduction.

Therefore, it is difficult to realize a surface acoustic wave filter which has characteristics with excellent shape factor and is small in size by improving the shape factor through the conventional weighting of IDTs as shown in FIG. 31.

DISCLOSURE OF THE INVENTION

The present invention is characterized by providing a surface acoustic wave filter whose length in the surface acoustic wave propagation direction is small and which has a frequency characteristic with excellent shape factor by use of an IDT having a small number of electrode fingers.

The present invention provides a surface acoustic wave filter characterized in that it comprises a piezoelectric substrate, a plurality of surface acoustic wave propagation paths arranged in parallel to each other on the piezoelectric substrate and a coupler for coupling the surface acoustic wave propagation paths, an input interdigital transducer and a first reflector are disposed on at least one of the surface acoustic wave propagation paths with intervention of the coupler, and an output interdigital transducer and a second reflector are disposed on at least one of the other surface acoustic wave propagation paths with intervention of the coupler.

By providing this construction, it is possible to reduce the length of the surface acoustic wave filter in the surface acoustic wave propagation direction as compared with conventional ones and to provide a surface acoustic wave filter having a frequency characteristic curve with excellent shape factor.

The present invention also provides a surface acoustic wave filter characterized in that the input interdigital transducer and the output interdigital transducer are disposed side by side in a direction perpendicular to a surface acoustic wave propagation direction, and the length in the surface acoustic wave propagation direction of a portion in which the input interdigital transducer and the output interdigital transducer overlay each other in said perpendicular direction is shorter than the length in the surface acoustic wave propagation direction of the shorter one of the input interdigital transducer and output interdigital transducer.

With this construction, isolation between the input and output IDTs of the surface acoustic wave filter can be improved and the degree of suppression out of a passband can be improved.

Further, the present invention provides a surface acoustic wave filter characterized in that an earth electrode is formed on the piezoelectric substrate between the aforesaid input interdigital transducer and the aforesaid output interdigital transducer.

By thus forming the earth electrode, the isolation between input and output can be further improved.

PREFERRED EMBODIMENTS OF THE INVENTION

Figure 1:
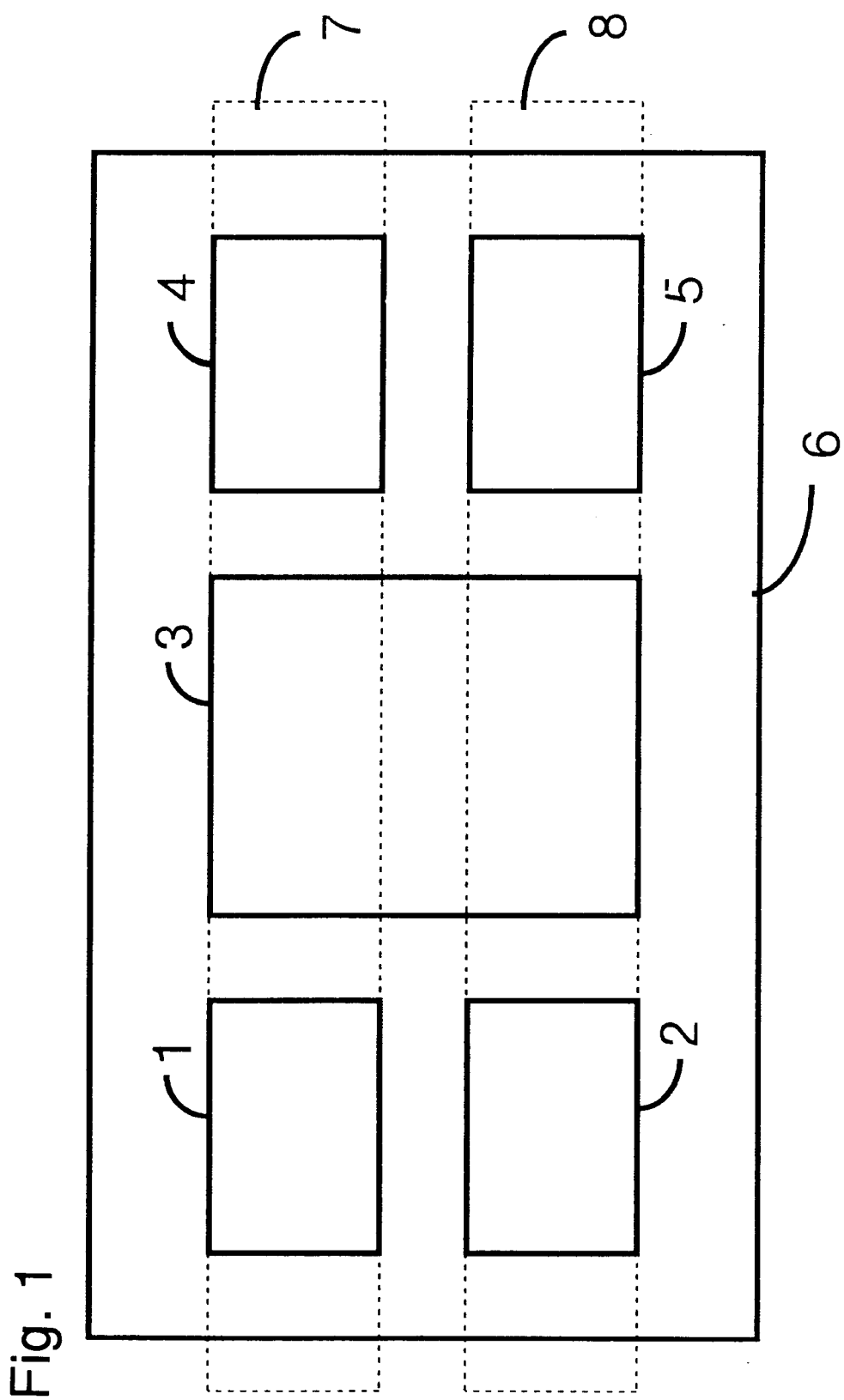
FIG. 1 is a block diagram illustrating the construction of a surface acoustic wave filter according to the present invention.

The present invention is comprised of a piezoelectric substrate, a plurality of surface acoustic wave propagation paths existing on the piezoelectric substrate in parallel to each other, and a coupler for coupling these surface acoustic wave propagation paths. On at least one of the surface acoustic wave propagation paths, an input interdigital transducer and a first reflector is arranged to sandwich the coupler. On at least one of the other surface acoustic wave propagation paths, an output interdigital transducer and a second reflector is arranged to sandwich the coupler. With this construction, the invention is characterized in that the length of the surface acoustic wave filter in the surface acoustic wave propagation direction is decreased and the frequency characteristic is improved.

Here, a waveguide-directional coupler or a multi-strip coupler may be used as the coupler.

As regards the input interdigital transducer (input IDT) and the output interdigital transducer (output IDT), at least one of them may be weighted. The interdigital transducers are referred to as IDTs hereinafter.

Examples of weighting include "weighting by apodization," "weighting by withdrawal out" and the like. Such weighting can improve the shape factor of the frequency characteristic of the surface acoustic wave filter as explained below.

Further, a unidirectional IDT may be used as at least one of the input and output IDTs. The use of the unidirectional IDT can reduce loss in the surface acoustic wave filter.

The waveguide-directional coupler is composed of a plurality of waveguide sections for transmitting an excited surface acoustic wave and gap sections located between the waveguide sections.

Where the waveguide-directional coupler is used as the coupler, its waveguide sections are formed of a metal film having a uniform surface structure or a metal film having a grating surface structure.

Further, the gap sections are also formed of a metal film having a uniform surface structure or a metal film having a grating surface structure.

Further, a grating width in the grating surface structure of the waveguide sections and a grating width of the grating surface structure of the gap section may be so adjusted that the velocity of surface acoustic waves propagating in the gap section is higher than the velocity of surface acoustic waves propagating in the waveguide sections. This adjustment of the velocities of the surface acoustic waves allows the length of the coupler in the surface acoustic wave propagation direction to be shortened.

Further, a metal film having a uniform surface structure or a metal film having a grating surface structure may be formed in a region outside the waveguide-directional coupler which region does not contact the gap section between the waveguide sections. This allows more reduction of loss in the coupler.

Further, as regards the reflectors, they may be weighted by withdrawal.

The reflector of one surface acoustic wave propagation path may be constructed of a plurality of separate reflectors. This weighting or separation can improve the shape factor of the frequency characteristic of the surface acoustic wave filter. The period of electrode fingers of the input and output IDTs may be slightly different from double the electrode period of the reflector. This can improve the frequency characteristic of the saw surface acoustic wave filter.

Further, the present invention provides a surface acoustic waver filter characterized in that the aforesaid input interdigital transducer and the aforesaid output interdigital transducer are arranged side by side in a direction perpendicular to the surface acoustic wave propagation direction and the length in the surface acoustic wave propagation direction of a portion where the input and output interdigital transducers overlap each other in said perpendicular direction is shorter than the length in the surface acoustic wave propagation direction of either one of the input and output interdigital transducers which is shorter than the other interdigital transducer. This construction can improve isolation between the input and output IDTs and the degree of suppression outside a passband.

Also the present invention provides a surface acoustic wave filter characterized in that an earth electrode is formed on the piezoelectric substrate between the input interdigital transducer and the output interdigital transducer. This can further improve the isolation between input and output.

The present invention is now described in detail with reference to embodiments shown in the drawings. It is noted that these embodiments are not to limit the scope of the invention.

In FIG. 1, shown is a block diagram illustrating the construction of a surface acoustic wave filter according to the present invention.

FIG. 1 shows the construction of a surface acoustic wave filter having two surface acoustic wave propagation paths (a first propagation path 7 and a second propagation path 8) for simplicity of explanation, but this is not limitative. Three or more surface acoustic wave propagation paths may be provided.

The first propagation path 7 is composed of an input IDT 1, a coupler 3 and a reflector 4 and the second propagation path 8 is comprised of an output IDT 2, the coupler 3 and a reflector 5.

Further, the input IDT 1, the output IDT 2, the coupler 3 and the reflectors 4, 5 are all constructed by forming metal films (such as Cu, Al and the like) on a piezoelectric substrate 6 of quartz or the like.

Here, the coupler 3 is for switching surface acoustic waves excited by the input IDT 1 to the second propagation path 8 having the output IDT 2. The reflectors 4, 5 are for reversing the surface acoustic wave propagation direction to direct surface acoustic waves toward the output IDT 2. In FIG. 1, out of surface acoustic waves excited by the input IDT, ones propagating on the first propagation path 7 toward the right contribute to the surface acoustic wave filter.

Figure 2:
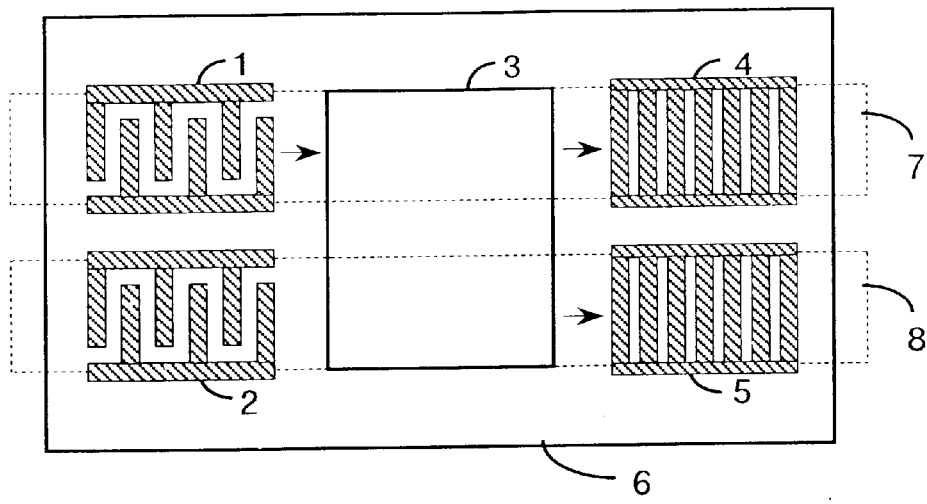
FIGS. 2(a)–2(c) are diagrams explaining a working principle of a surface acoustic wave filter according to the present invention.
Figure 2:
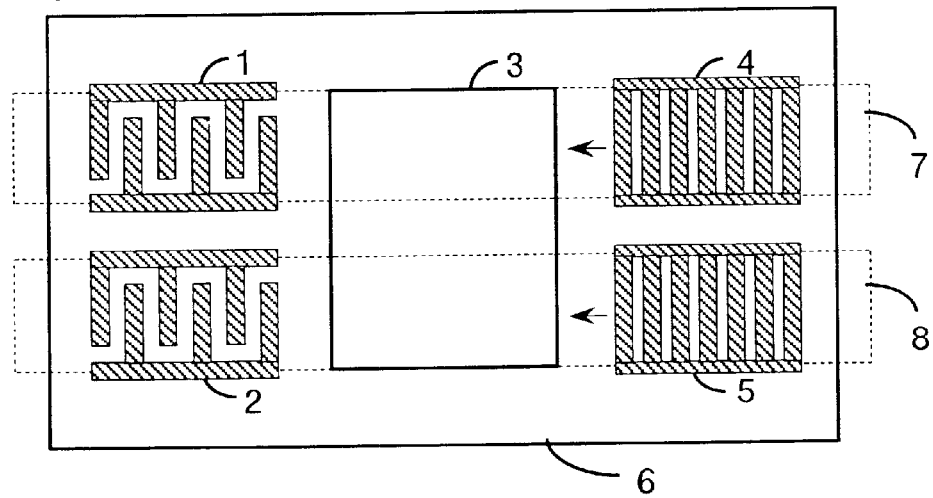
Figure 2:
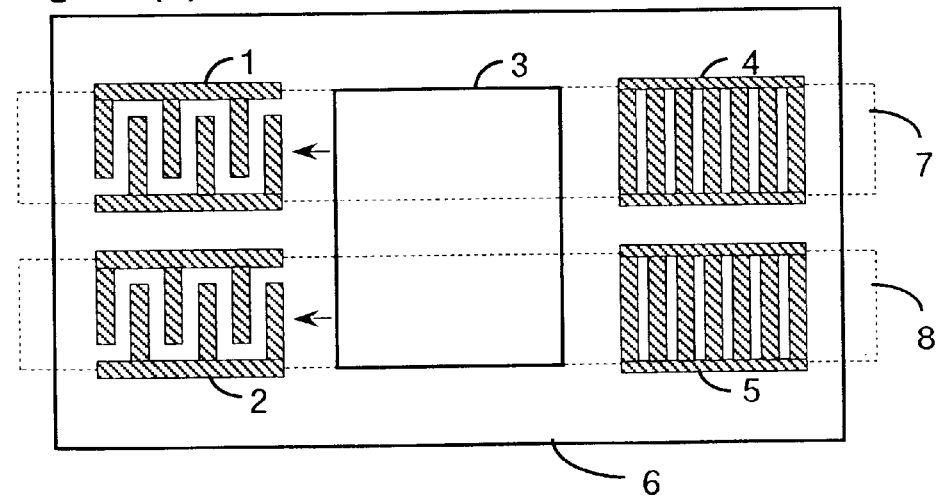

FIG. 2 shows a diagram explaining the operational principle of the surface acoustic wave filter of the present invention. The surface acoustic wave is referred to as SAW hereinafter.

First, described is a propagation route of the SAW excited by the input IDT 1 until it reaches the output IDT 2.

As shown in FIG. 2(a), the SAW sent out from the input IDT 1 enters the left end of the coupler 3 and is sent out from the right end of the coupler 3 onto both the first propagation path 7 and the second propagation path 8.

Subsequently, as shown in FIG. 2(b), the SAW on each of the propagation paths reaches the reflector 4 or 5, where it is reflected, and enters the right end of the coupler 3 again. Then, the SAW is sent out from the left end of the coupler 3 onto both the first propagation path 7 and the second propagation path 8. The SAW sent out onto the second propagation path 8 is detected at the output IDT 2. The above is the propagation route of the SAW excited by the input IDT until it reaches the output IDT 2.

Here, if the coupler 3 is optimized, the SAW sent out from the input IDT 1 can be allowed to reach the output IDT 2 entirely and does not return to the input IDT 1.

Only the case of two propagation paths has been described, but the same is true of cases where three or more propagation paths exist. The SAW sent out from the input IDT is switched to the propagation path having the output IDT through the coupler and is detected at the output IDT 2.

The input IDT 1 and the output IDT 2 are each composed of a plurality of electrode fingers which extend in a direction perpendicular to the SAW propagation direction and are alternately arranged to form comb-like shapes. The reflectors 4 and 5 are each composed of a plurality of electrode fingers forming a grating structure.

Figure 3:
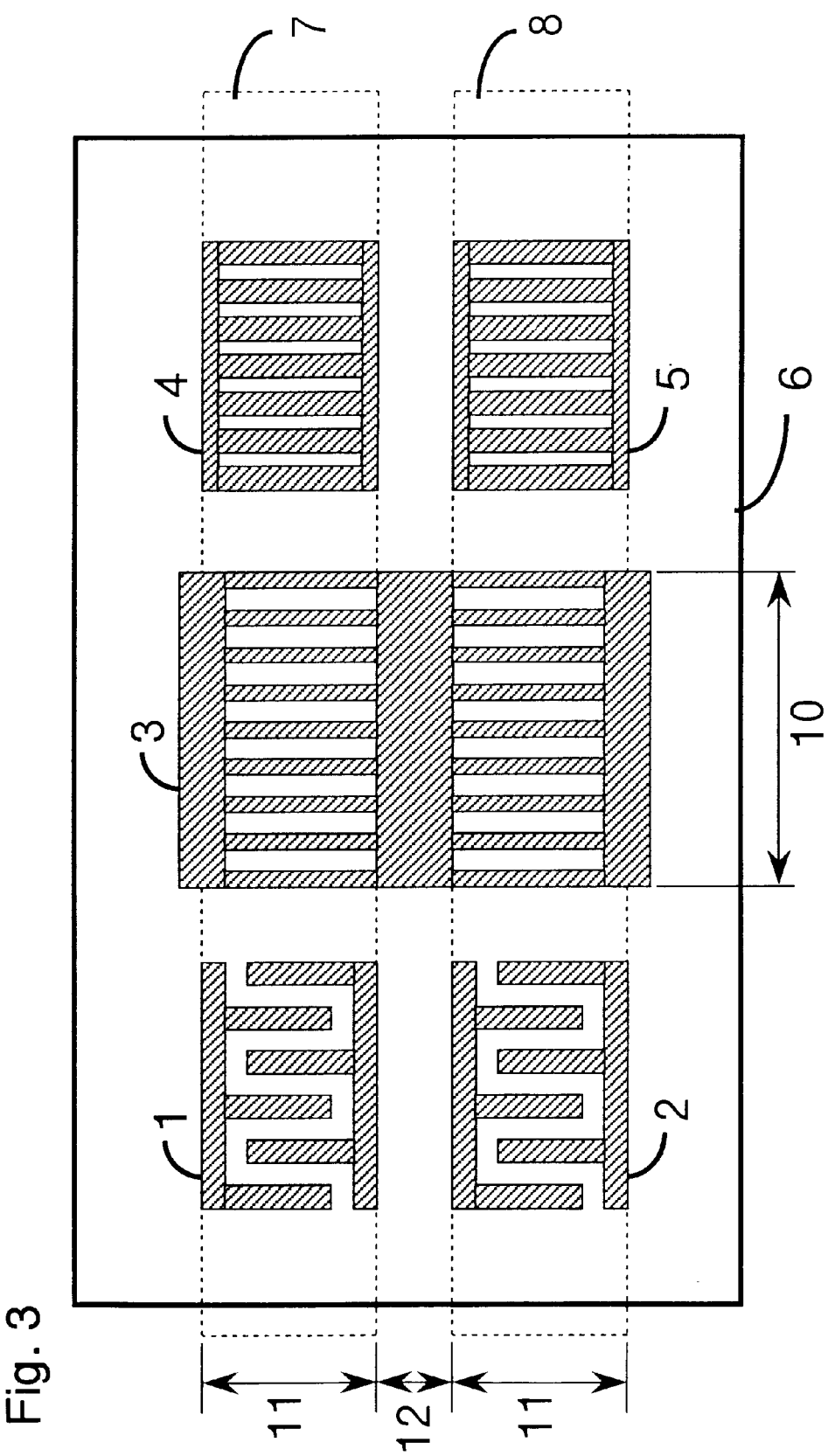
FIG. 3 is a diagram illustrating the construction of an example of a surface acoustic wave filter according to the present invention.

FIG. 3 shows a diagram illustrating the construction of an example of a surface acoustic wave filter according to the present invention.

Here, a waveguide-directional coupler is used as the coupler 3.

The waveguide-directional coupler 3 is provided with a plurality of electrode fingers of a grating structure in each of its propagation paths. The first propagation path 7 and the second propagation path 8 are connected with a metal film having a uniform surface structure, that is, a film of metal formed uniformly.

Also, in FIG. 3, a film of a stretched metal is formed in an upper part of the electrode fingers of the grating structure in the first propagation path 7 and in a lower part of the electrode fingers of the grating structure in the second propagation path 8.

By use of such a waveguide-directional coupler 3 and by optimizing a coupling length 10 of the waveguide-directional coupler, the SAW sent out from the input IDT is entirely allowed to reach the output IDT 3.

In FIG. 3, a portion of the grating structure of the waveguide-directional coupler 3 is a portion for transmitting surface acoustic waves and is referred to as a waveguide section 11. Further, a portion between the first propagation path 7 and the second propagation path 8 is referred to as a gap section 12.

Figure 4:
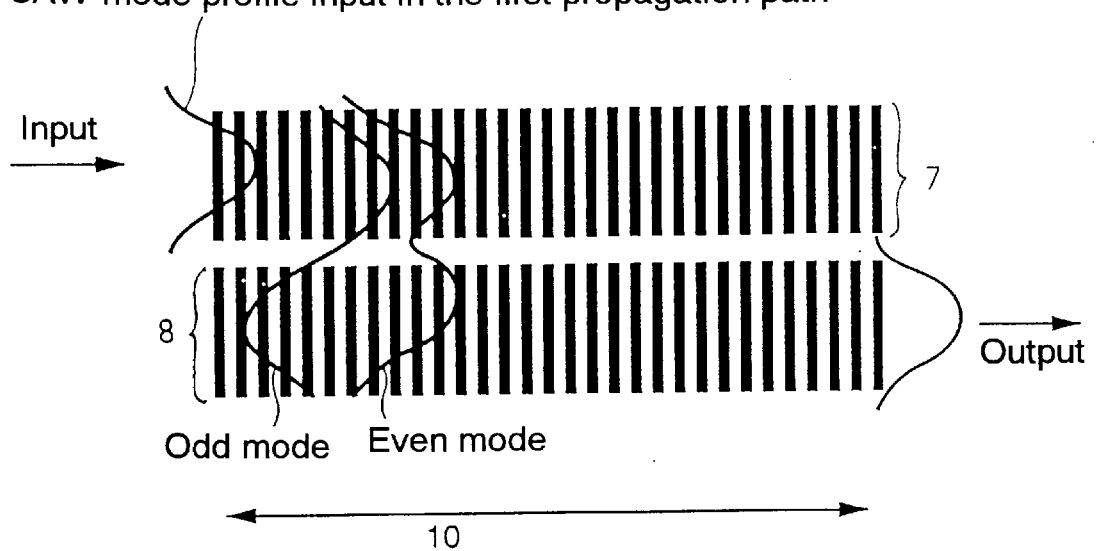
FIG. 4 is a diagram explaining workings of a waveguide-directional coupler used in a surface acoustic wave filter according to the present invention.

A filtering principle of the surface acoustic wave filter of the present invention is now explained using FIG. 4.

FIG. 4 is a diagram illustrating the operation of the waveguide-directional coupler 3 used in the surface acoustic wave filter of the present invention. FIG. 4 only shows the portions of the grating structure in the respective propagation paths of the waveguide-directional coupler 3, for explanation.

In the waveguide-directional coupler 3, the two propagation paths are connected by being disposed adjacently. That is, the SAW from the input IDT is transmitted not only in the first propagation path 7 but also in the second propagation path 8. As a result, even if a surface acoustic wave is input from the left end of the waveguide-directional coupler 3 only in the first propagation path 7, a waveguide mode is not enclosed only in the first propagation path 7, but there appear SAWs of an even mode and of an odd mode in a single system formed of the first propagation path 7 and the second propagation path 8.

Therefore, a composite wave of the SAWs of the even and odd modes is output from the first propagation path 7 and the second propagation path 8 at the right end of the waveguide-directional coupler 3.

Here, since the propagation velocities of the SAWs of the even mode and of the odd mode are slightly different, the intensity of the SAWs propagating in the first and second propagation paths 7 and 8 varies depending upon the distance that the SAWs have traveled, i.e., the coupling length 10. When a specific coupling length is traveled, output is obtained only from the second propagation path 8. This coupling length 10 is referred to as a complete coupling length. In the state of the complete coupling length, the SAW input in the first propagation path 7 is entirely switched to the second propagation path 8. The above is the operational principle of the waveguide-directional coupler.

Next, explanation is given of the operational principle of the surface acoustic wave filter of the present invention to which this waveguide-directional coupler is applied.

Figure 5:
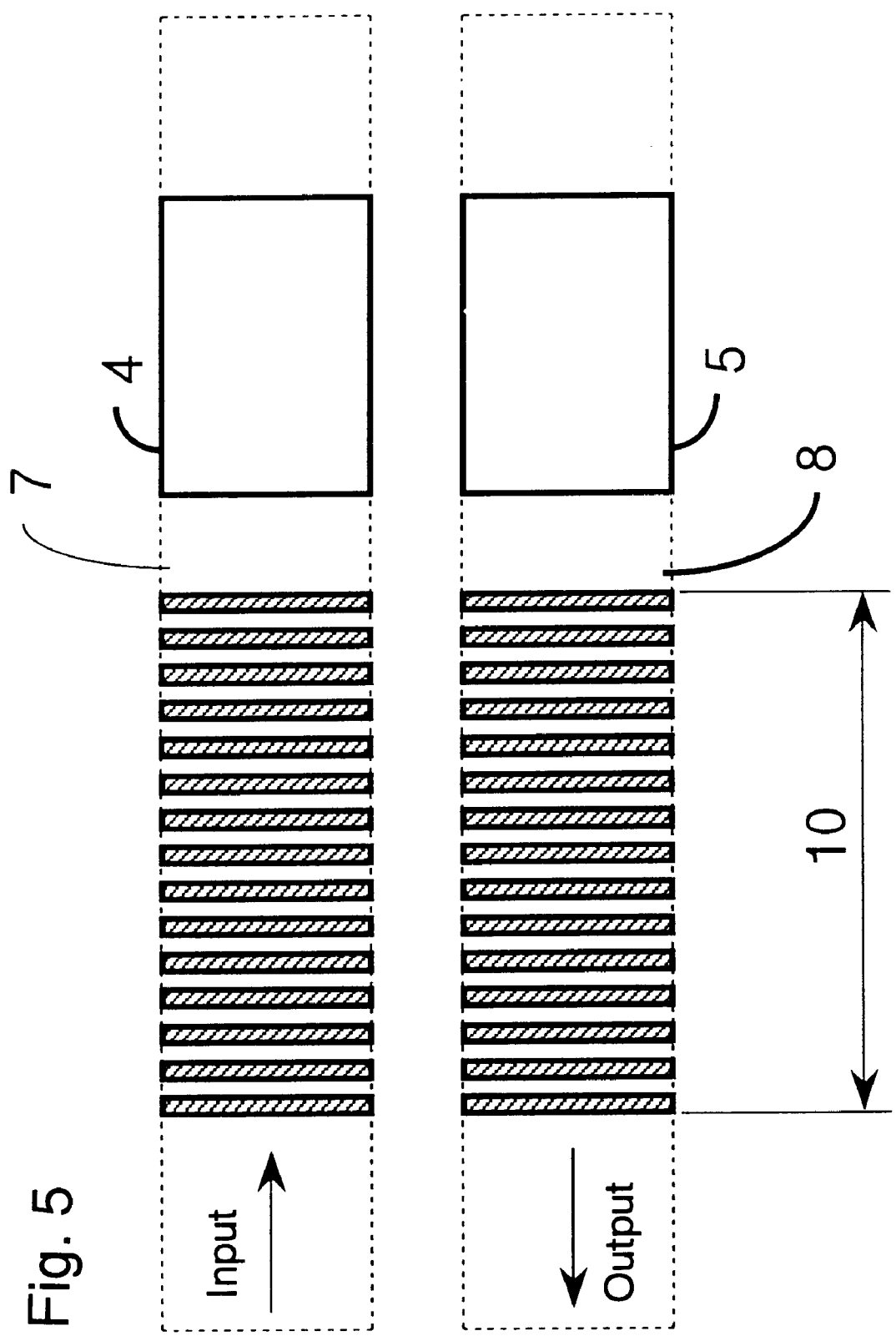
FIG. 5 is a diagram explaining the workings of a surface acoustic wave filter according to the present invention to which a waveguide-directional coupler is applied.

FIG. 5 is a diagram illustrating the operation of a case wherein the waveguide-directional coupler is applied to the surface acoustic wave filter of the present invention.

In FIG. 5, the coupling length 10 of the waveguide-directional coupler is set to half the complete coupling length shown in FIG. 4. In this case, the SAW input from the left end of the first propagation path 7 travels a distance of half the complete coupling length in the waveguide-directional coupler 3. Therefore, at the right end of the waveguide-directional coupler 3, the SAW is not entirely shifted to the second propagation path 8.

However, the SAW sent out from the right ends of the first and second propagation paths 7 and 8 of the waveguide-directional coupler 3 is reflected by the reflectors 4 and 5 and enters the waveguide-directional coupler 3 again from the right end thereof. Then the SAW travels half the complete coupling length to reach the left end of the waveguide-directional coupler 3.

As a result, the SAW having first entered the first propagation path 7 at the left end of the waveguide-directional coupler goes forth and back in the waveguide-directional coupler. That is, the SAW travels a distance corresponding to the complete coupling length, and therefore, the output can be obtained only from the second propagation path 8 at the left end of the waveguide-directional coupler 3.

Next, explanation is given of the frequency characteristic of the surface acoustic wave filter of the present invention.

Since the frequency characteristic of the coupler shown in FIGS. 3 and 4 is considerably gentle as compared with the frequency characteristics of the IDTs and reflectors, they hardly affect the frequency characteristic of the surface acoustic wave filter itself. Therefore, the frequency characteristic of the surface acoustic wave filter is determined by the characteristics of the IDTs and reflectors and is a composite characteristic of the frequency characteristics of the IDTs and the reflection characteristics of the reflectors.

It is generally known that the reflection characteristics of reflectors can be superior in the shape factor to the frequency characteristics of IDTs.

That is, with the surface acoustic wave filter of the present invention, a frequency characteristic excellent in the shape factor is more easily obtained than with the conventional transversal surface acoustic wave filters which have utilized the frequency characteristics of IDTs alone.

Next, it is shown that, if the same shape factor is realized with the conventional transversal surface acoustic filter and with the surface acoustic filter of the present invention, the surface acoustic filter of the present invention can be formed to have a smaller length in the SAW propagation direction.

First, explanation is given of the length of the reflector in the SAW propagation direction.

The reflector is composed of a plurality of electrode fingers as shown in FIG. 3. The reflectivity of the reflector varies depending upon the number of the electrode fingers.

Figure 6:
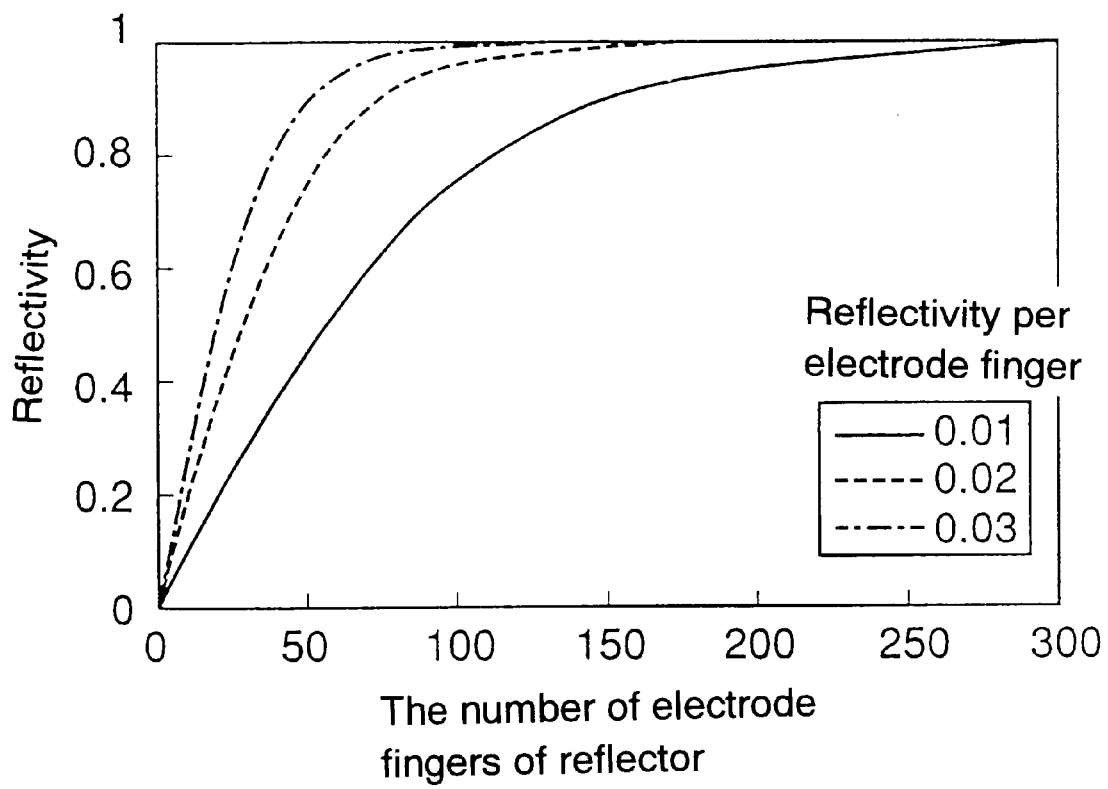
FIG. 6 is a graphical representation of a relationship between reflectivity at a center frequency and the number of electrode fingers of a reflector according to the present invention.

FIG. 6 is a graphical representation of changes in the reflectivity of the reflector of the present invention at a center frequency with respect to the number of the electrode fingers thereof. Here, an ST-cut quartz is used as a piezoelectric substrate.

This graph shows that, given the reflectivity per electrode finger is 0.01, the reflectivity of the reflector becomes 1 and the surface acoustic wave is reflected completely where the reflector has 300 electrode fingers.

Given the period of electrode fingers of the input and output IDTs is $\lambda$, the electrode fingers of the reflector is given as a period of $\lambda/2$. Accordingly, if the reflector has 300 electrode fingers, then it is about 150 $\lambda$ long in the SAW propagation direction.

Further, from FIG. 6, the use of a substrate having a greater reflectivity per electrode finger enables the reflectivity of the reflector to be close to 1 even with a decreased number of electrode fingers. For example, if the reflectivity per electrode finger is 0.03, the reflector has a reflectivity of 1 with 100 electrode fingers.

From the above, the size of the reflector in the SAW propagation direction can be estimated to be about 150 $\mu$ at the largest.

Next, explanation is given of the length of the coupler in the SAW propagation direction.

Figure 7:
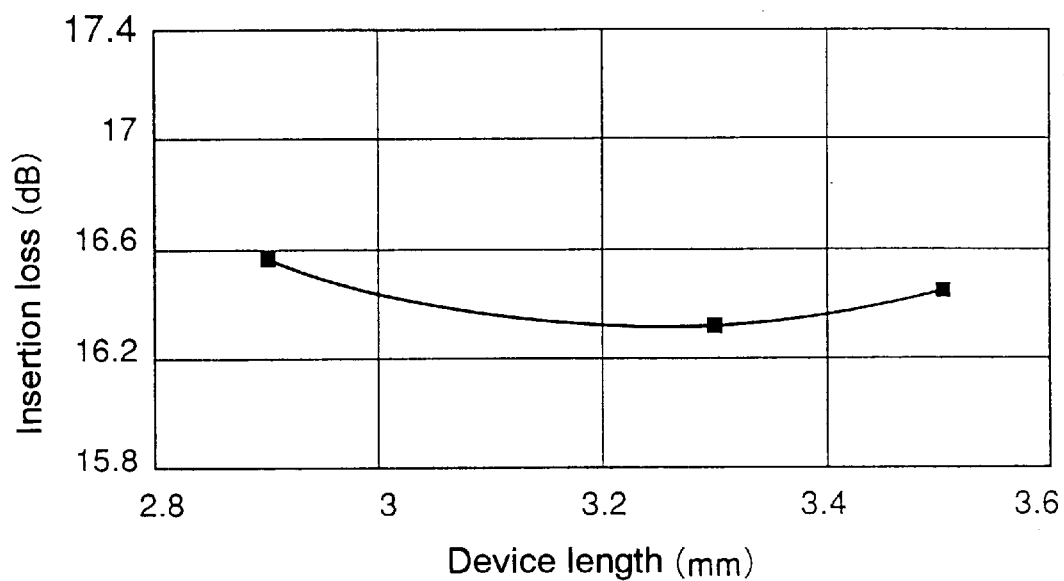
FIG. 7 is a graphical representation of a relationship between insertion loss and coupling length of a waveguide-directional coupler according to the present invention.

FIG. 7 is a graphical representation showing the relationship between the device length (coupling length 10) in the SAW propagation direction of the waveguide-directional coupler having the grating waveguide shown in FIG. 3 and the insertion loss of the surface acoustic wave filter.

In FIG. 3, the electrode period $\lambda$ of the electrode fingers of the input and output IDTs is set to 15 $\mu$m, the number of electrode pairs 95, the film thickness of the electrodes 0.32 $\mu$m, the electrode period of the grating waveguide of the coupler 5.7 $\mu$m, and the number of electrode fingers of the reflector 180. The material for the piezoelectric substrate is an ST cut quartz.

Further, the width 11 of the waveguide section of the waveguide-directional coupler is set to 9.5 λ, and the width 12 of the gap section between the waveguides 0.2 λ.

In FIG. 7, it is found that, when the device length (coupling length 10) is about 3.2 mm (=about 220 λ), the insertion loss is smallest and the coupler is under the optimal condition for passing the surface acoustic wave. Therefore, the coupling length 10 of the waveguide-directional coupler is preferably set to about 220 λ. However, even if the coupling length 10 is smaller than 220 λ, the shape factor of the surface acoustic wave filter hardly changes and good shape factor is obtained, although the insertion loss increases as shown in FIG. 7.

From the above, it is possible to set the length of the reflector in the SAW propagation direction to about 150 λ and the coupling length 10 of the waveguide-directional coupler to about 220 λ in FIG. 3. The sum of the length of the coupler and the length of the reflector in the SAW propagation direction may sufficiently be 370 λ at the largest.

Further, with use of a multi-strip coupler as the coupler, it is possible to obtain a surface acoustic wave filter having the same shape factor as with use of the waveguide-directional coupler of FIG. 3.

Figure 8:
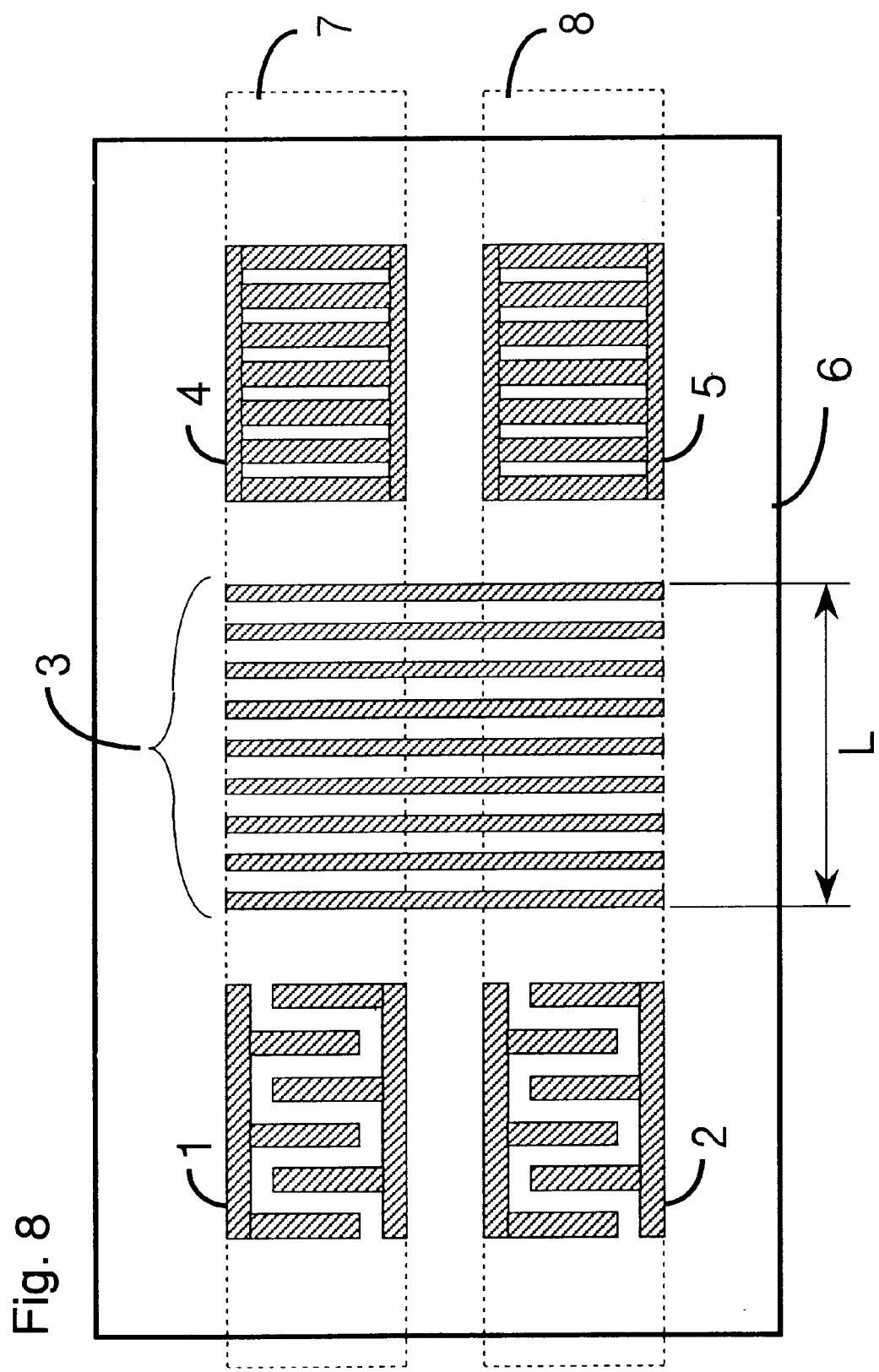
FIG. 8 is a diagram illustrating the construction of an example of a surface acoustic wave filter according to the present invention.

FIG. 8 is a diagram illustrating the construction of an example of a surface acoustic wave filter using a multi-strip coupler as the coupler according to the present invention.

In the multi-strip coupler 3, a plurality of electrode fingers spaced apart are placed in the direction perpendicular to the SAW propagation direction.

In the surface acoustic wave filter using such a multi-strip coupler, a length (device length) L of the multi-strip coupler 3 in the SAW propagation direction for completely delivering the SAW excited by the input IDT 1 to the output IDT 2 is given by the following formula:

$$L = \lambda/RK^2,$$

wherein λ is the electrode period of the IDTs, R is a filing factor and $K^2$ is an electromechanical coupling coefficient.

Given R=0.6, the device length L is 490 λ provided that the piezoelectric substrate is of an ST cut quartz ($K^2$= 0.17%), 119 λ provided that the piezoelectric substrate is of X- 112Y:LiTaO$_3$ ($K^2$=0.7%) and 37 λ provided that the piezoelectric substrate is of Y-Z:LiNbO$_3$ ($K^2$=4.5%). This shows that with use of the multi-strip coupler, an ST cut quartz has a little effect in size reduction, but that X-112Y:LiTaO$_3$ and Y-Z: LiNbO$_3$ can give extremely small couplers.

In FIG. 8, if the length of the reflectors 4 and 5 in the SAW propagation direction is the maximum 150 λ, the sum of the device length of the multi-strip coupler 3 and the length of the reflector in the SAW propagation direction is 269 λ in the case of an X-112Y:LiTaO$_3$ substrate and 187 λ in the case of a Y-Z:LiNbO$_3$ substrate, which are smaller than the length (370 λ) in the case of using the waveguide-directional coupler.

Incidentally, the length of the surface acoustic wave filter of the invention in the SAW propagation direction is substantially equal to the sum of the length of one IDT, the length of the above-explained coupler 3 and the length of the reflector 4 or 5 in the SAW propagation direction.

Figure 9:
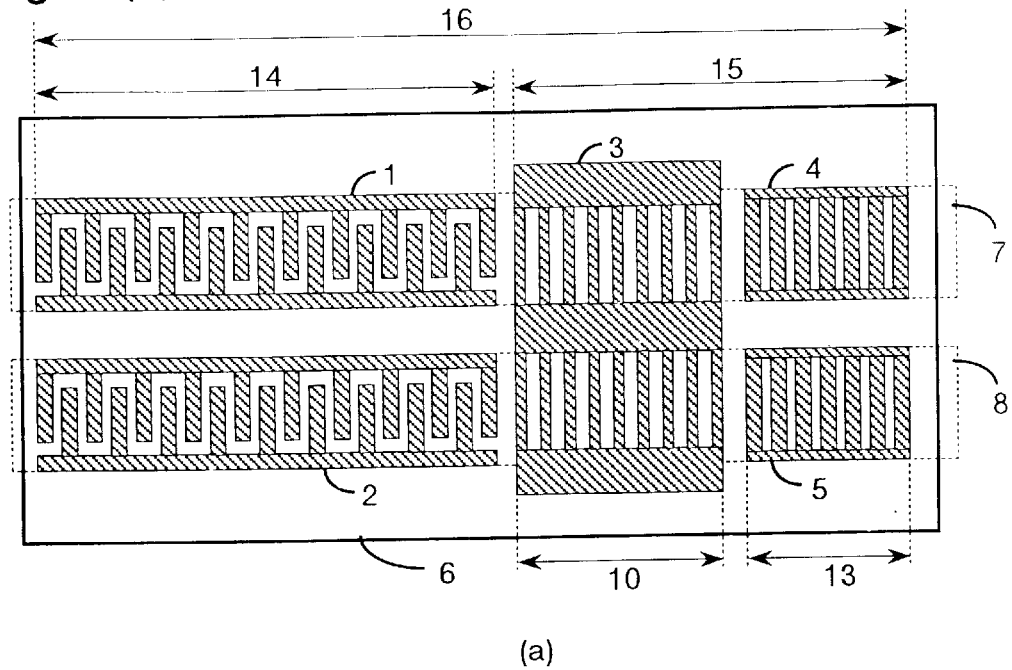
FIGS. 9(a) and 9(b) are comparative diagrams of the lengths of surface acoustic wave filters in the surface acoustic wave propagation direction.
Figure 9:
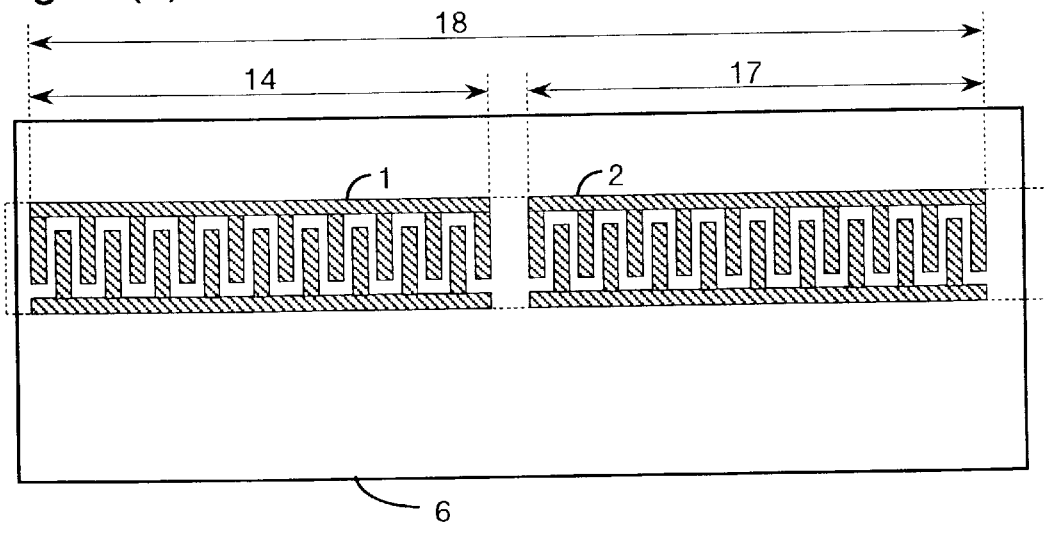

FIG. 9 is a comparative diagram of the lengths of surface acoustic wave filters in the SAW propagation direction.

FIG. 9(a) is a diagram illustrating the construction of the surface acoustic wave filter of the present invention and FIG. 9(b) is a diagram illustrating the construction of the conventional transversal surface acoustic wave filter.

In FIG. 9(a), the length 16 of the surface acoustic wave filter of the present invention in the SAW propagation direction is represented by the sum of the length 14 of the IDT, the length 10 of the coupler 3 and the length 13 of the reflector 4 or 5.

Here, intervals between the respective lengths are extremely small and therefore are disregarded. The sum of the length 10 of the coupler 3 and the length 13 of the reflector is substantially equal to the reference numeral 15 in FIG. 9(a). In the aforesaid example of FIG. 3, it has been shown that the length 15 can be 370 λ or less in the case of the ST cut quartz substrate.

In FIG. 9(b), the length 18 of the conventional surface acoustic wave filter in the SAW propagation direction is represented by the sum of the length 14 of an input IDT 1 and the length 17 of an output IDT 2.

Comparing FIG. 9(a) with FIG. 9(b), if the lengths (14, 17) of the input IDT 1 and the output IDT 2 in the SAW propagation direction are both 370 λ or more, the length 16 (=14+15) of the filter of the present invention in the SAW propagation direction can be shorter than the length 18 (=14+17) of the conventional filter in the SAW propagation direction. For, in FIG. 9(a) and FIG. 9(b), the length 15 according to the present invention (≦370 λ) is shorter than the conventional length 17 (≧370 λ).

That is, the surface acoustic wave filter of the present invention can be reduced in the length in the SAW propagation direction as compared with the conventional surface acoustic wave filter.

As regards the frequency characteristics of the filters, on the other hand, the surface acoustic wave filter of the present invention surely has a better shape factor by the addition of the reflection characteristics of the reflectors as detailed before, if the IDTs are the same in the length.

From the above, in the case where the ST cut quartz is used and the length 14 of the input IDT and the length 17 of the output IDT are set to 370 λ or more, the construction of the surface acoustic wave filter of the present invention (FIG. 9(a)) can be smaller and have more excellent shape factor than that of the conventional one (FIG. 9(b)).

If the length of either one of the input IDT and the output IDT is smaller than 370 λ in the conventional surface acoustic wave filter, the length 14 of the input and output IDT of the present invention needs to be smaller than 370 λ in order that the length of the surface acoustic filter of the present invention in the SAW propagation direction is smaller than that of the conventional one.

If the length 14 of the IDT of the present invention is reduced, the frequency characteristic of the IDT becomes milder, but the reflection characteristics of the reflectors work effectively. Thus a surface acoustic wave filter is obtained which has a filter frequency characteristic with excellent shape factor according to the present invention.

Also in the case of an X-112Y:LiTaO$_3$ or Y-Z:LiNbO$_3$ substrate, a surface acoustic wave filter can be realized which is smaller in size and has more excellent shape factor than the conventional filter.

Particularly in the case where the length (14, 17) of the input IDT 1 and the output IDT 2 are 269 λ or more on an X-112Y:LiTaO$_3$ substrate and in the case where the length (14, 17) of the input IDT 1 and the output IDT 2 are 187 λ or more on a Y-Z:LiNbO$_3$ substrate, a surface acoustic wave filter can be realized which is surely smaller in size and more excellent in the shape factor than a conventional filter having IDTs of the same length.

For example, explanation is now given about the filter size in the case where the surface acoustic wave filter of the present invention is applied to an IF filter for an N-CDMA base station.

Since the center frequency of the passband in the IF filter for the N-CDMA base station is 70 MHz, the period A of electrode fingers of the IDT is 45 μm.

Figure 31:
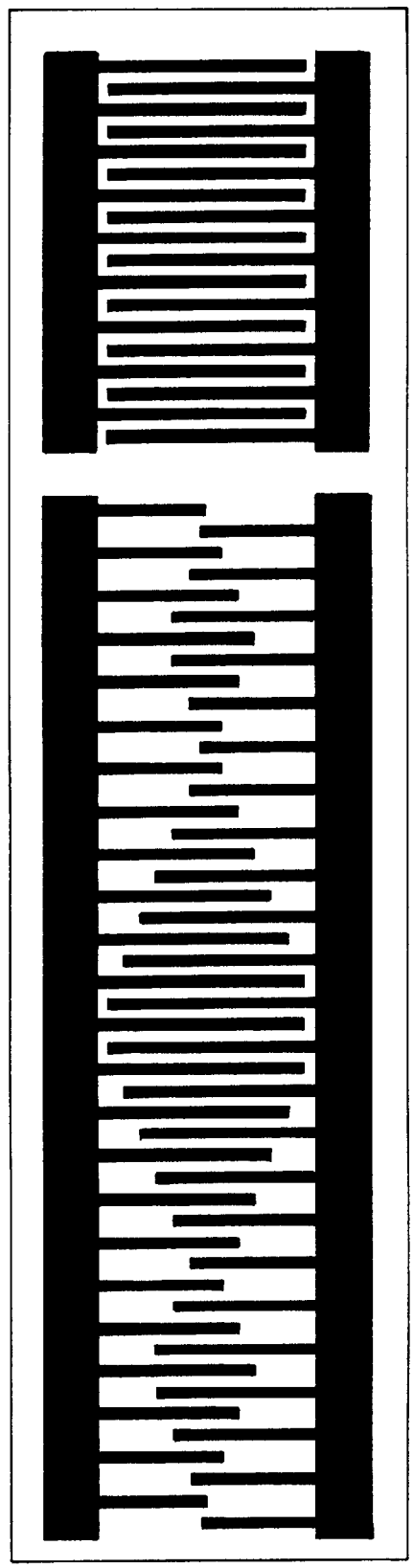
FIG. 31 is a diagram illustrating the construction of a conventional transversal surface acoustic wave filter.
Figure 32:
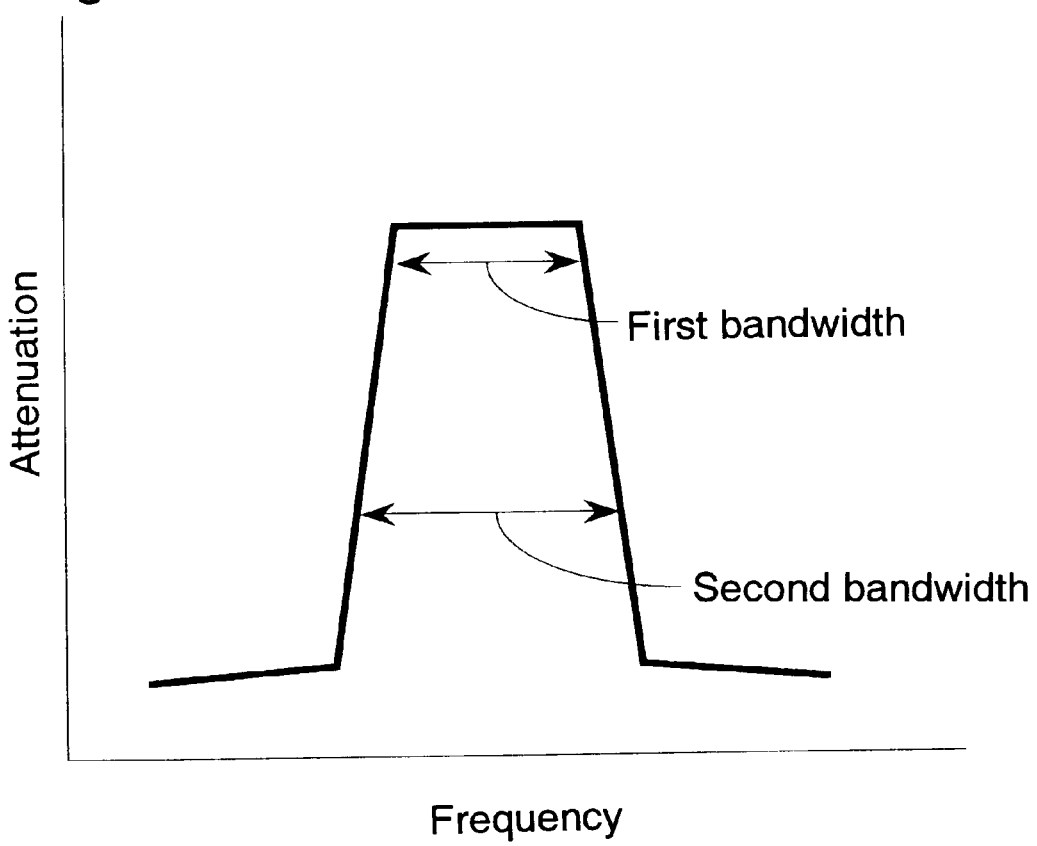
FIG. 32 is a diagram explaining shape factor.

Here, for comparison, a conventional transversal surface acoustic wave filter uses, for the input IDT, electrodes weighted by apodization and, for the output IDT, electrodes weighted by withdrawal which are produced by removing a part of electrode fingers from a normal electrode, as shown in FIG. 31.

Given that the number of electrode pairs of the input IDT is 1,000 and that of the output IDT is 355, the length of the surface acoustic wave filter in the SAW propagation direction is 60.975 mm (=1355 pairs×45 μm).

On the other hand, for realizing the same shape factor as that of the above-detailed conventional surface acoustic wave filter with the surface acoustic wave filter of the present invention, the following construction may be adopted.

In the case where the input IDT is composed of electrodes weighted by apodization and the output IDT is composed of electrodes weighted by withdrawal, the number of electrode pairs of each of the input and output IDTs is set to 400. That is, the length 14 of the IDT is 400 λ.

Further, in the case where an ST cut quartz substrate is used, the sum 15 of the lengths of the coupler and the reflector in the SAW propagation direction is set to 370 λ or more. Then the same shape factor can be realized.

Accordingly, the length 16 of the surface acoustic wave filter of the present invention in the SAW propagation direction can be 34.65 mm (=770 λ=770×45).

From the above, the length of the conventional transversal surface acoustic wave filter in the SAW propagation direction is 60.975 mm, while the length of the surface acoustic wave filter of the present invention in the SAW propagation direction can be reduced to 34.65 mm. In this case, a size reduction by about 56.8% is enabled.

Figure 10:
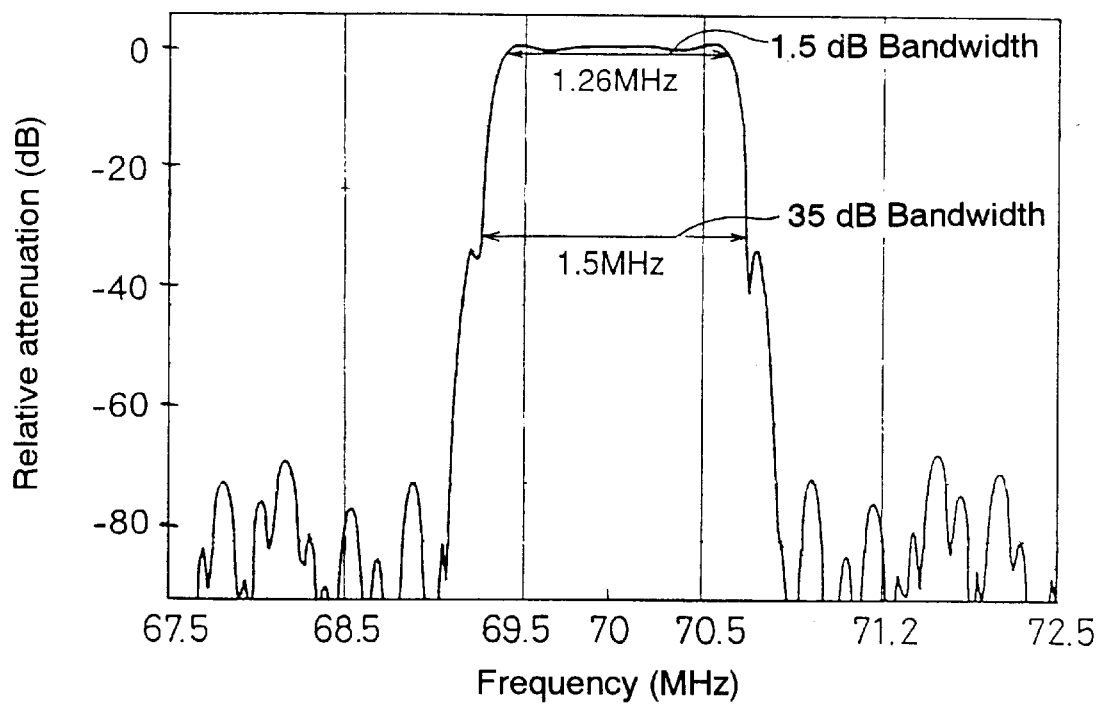
FIG. 10 is a graphical representation of the frequency characteristic of an example of a surface acoustic wave filter according to the present invention.
Figure 11:
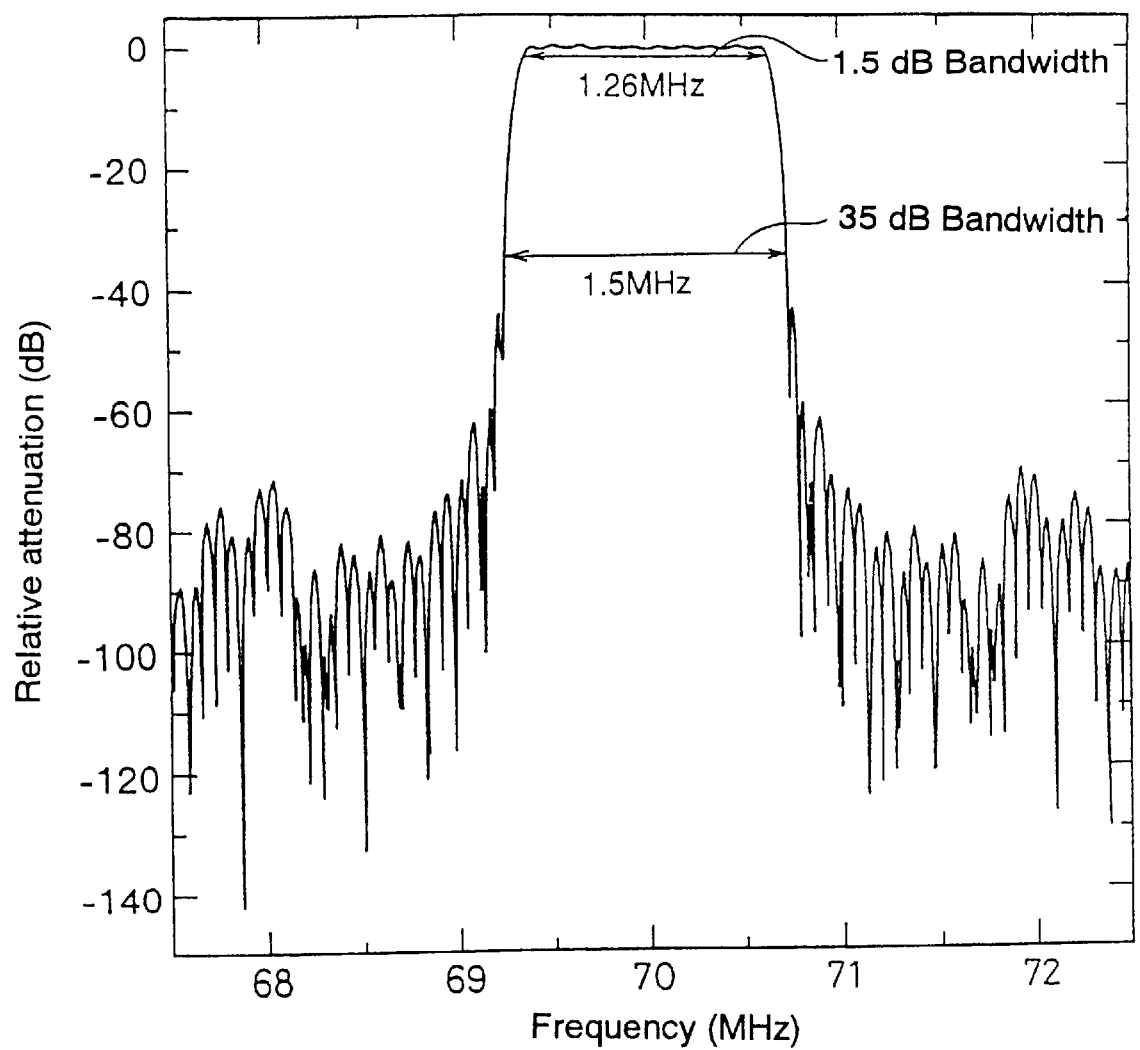
FIG. 11 is a graphical representation of the frequency characteristic of a conventional transversal filter.

FIG. 10 is a graphical representation of the frequency characteristic of the surface acoustic wave filter of the present invention having the above-detailed construction, and FIG. 11 is a graphical representation of the frequency characteristic of the conventional transversal filter having the above-detailed construction.

These graphical representations show that in both the filters, the bandwidth at an attenuation of 1.5 dB is 1.26 MHz and the bandwidth at an attenuation of 35 dB is 1.5 MHz. That is, the construction of the surface acoustic wave filter of the present invention can realize the same shape factor even though the size of the filter in the SAW propagation direction is decreased.

In the above-described example, the IDTs weighted by apodization and withdrawal are used for improvement of the shape factor, but these weightings are not limitative ones. Any weighting may be carried out which can improve the shape factor.

For example, at least one IDT or all IDTs may be weighted. A plurality of IDTs may include (a) non-weighted IDT(s).

Alternatively, at least one of a plurality of IDTs may be a unidirectional IDT. In this case, insertion loss in the surface acoustic filter can be reduced.

Figure 12:
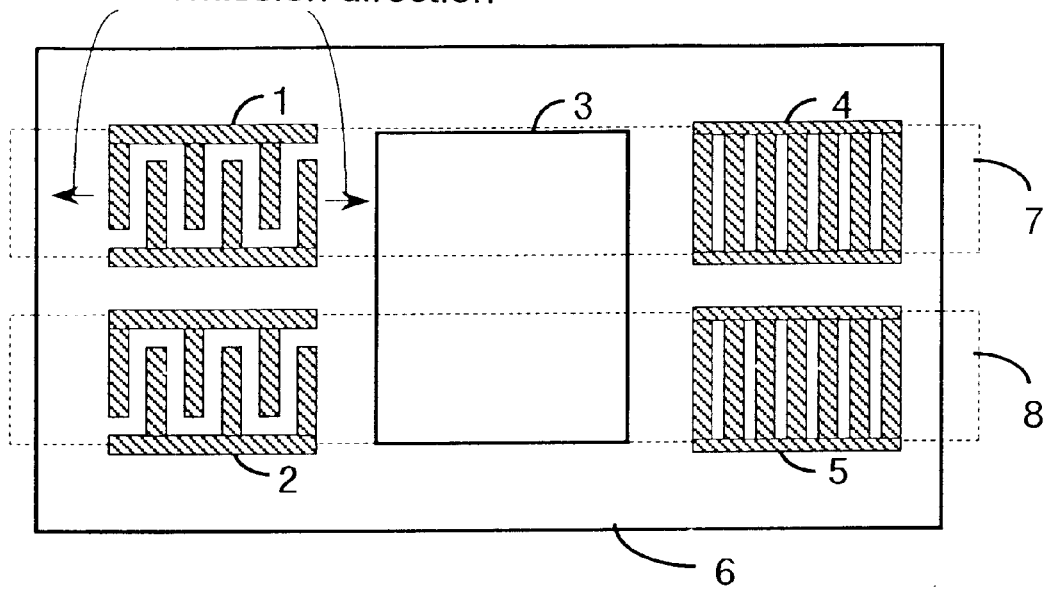
FIGS. 12(a) and 12(b) are comparative explanatory diagrams of a unidirectional IDT and a bidirectional IDT according to the present invention.
Figure 12:
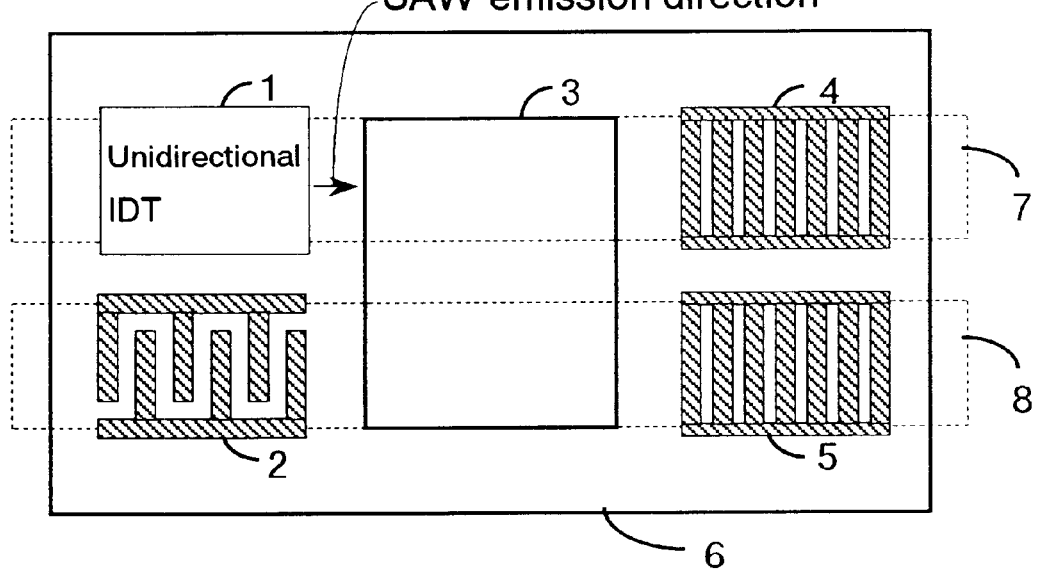

FIG. 12 is a diagram explaining effects of the use of the unidirectional IDT.

FIG. 12(a) shows directions in which the SAW is sent out from a bidirectional IDT.

The SAW excited by the bidirectional IDT 1 travels in both right and left directions as shown in the figure. The SAW travelling toward the right enters the coupler 3 and contributes to the filter, but the SAW travelling toward the left goes out of the piezoelectric substrate and becomes a loss. In other words, by the bidirectional IDT 1, only half the energy of the excited SAW contributes to the filter. Thus the insertion loss is great.

FIG. 12(b) shows a direction in which the SAW is sent out from a unidirectional IDT.

The SAW excited by the unidirectional IDT, travels almost in one direction, i.e., toward the right in FIG. 12(b). Thus most of the energy of the excited SAW enters the coupler, and the insertion loss can be reduced.

Figure 13:
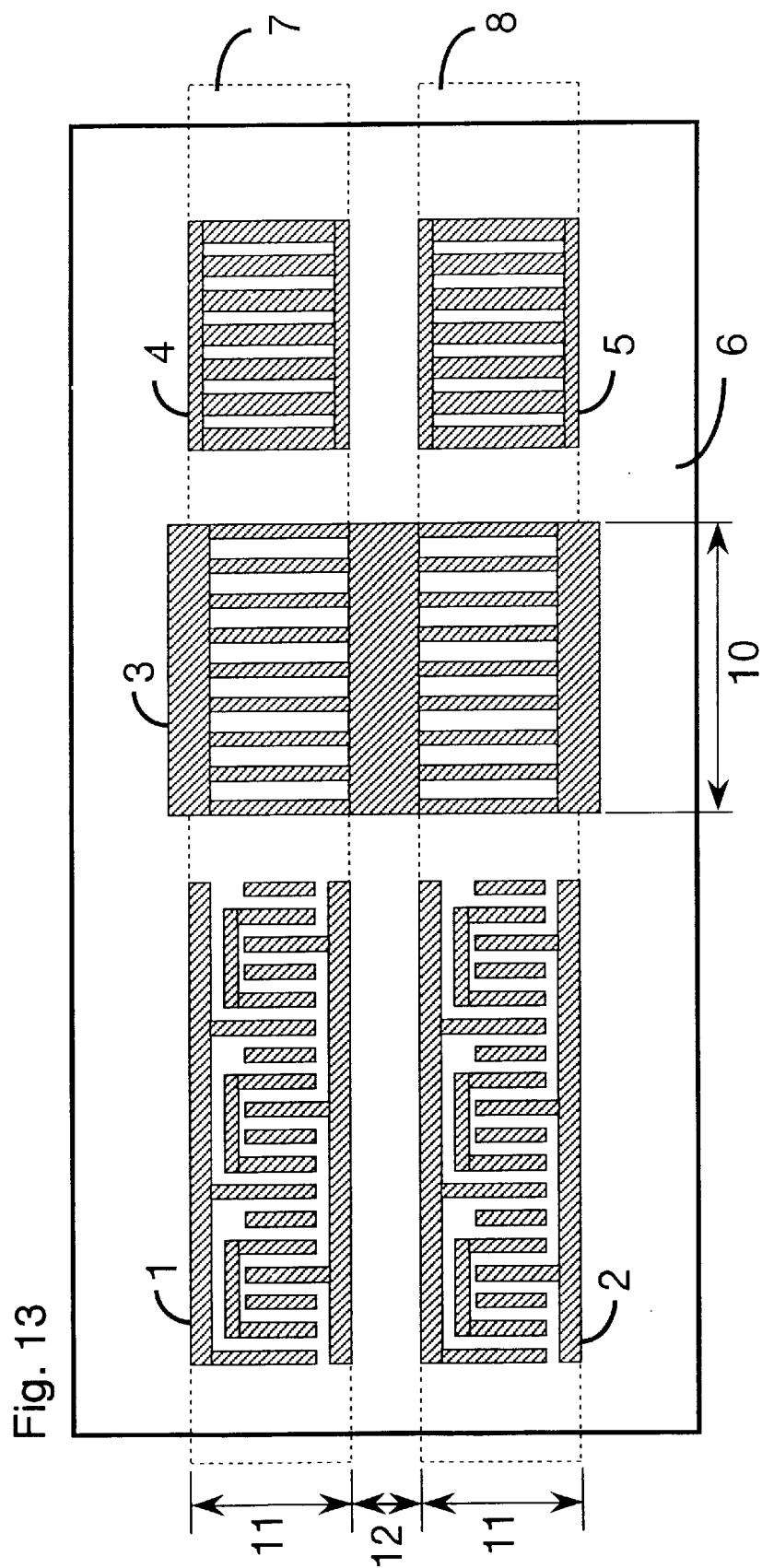
FIG. 13 is a diagram illustrating the construction of an example of a surface acoustic wave filter using a unidirectional IDT of a floating electrode type according to the present invention.

FIG. 13 is a diagram illustrating the construction of an example of a surface acoustic wave filter using unidirectional IDTs 1 and 2.

Here, those having floating electrodes are used as the unidirectional IDTs 1 and 2.

However, the unidirectional IDTs 1 and 2 themselves are not limited to this construction. Other kinds of unidirectional IDTs have been proposed, which may also be used.

The waveguide section 11 of the waveguide-directional coupler 3 shown in FIG. 13 is formed of a metal film having a grating surface structure. In addition to this, a metal film having a uniform surface structure may also be used.

Figure 14:
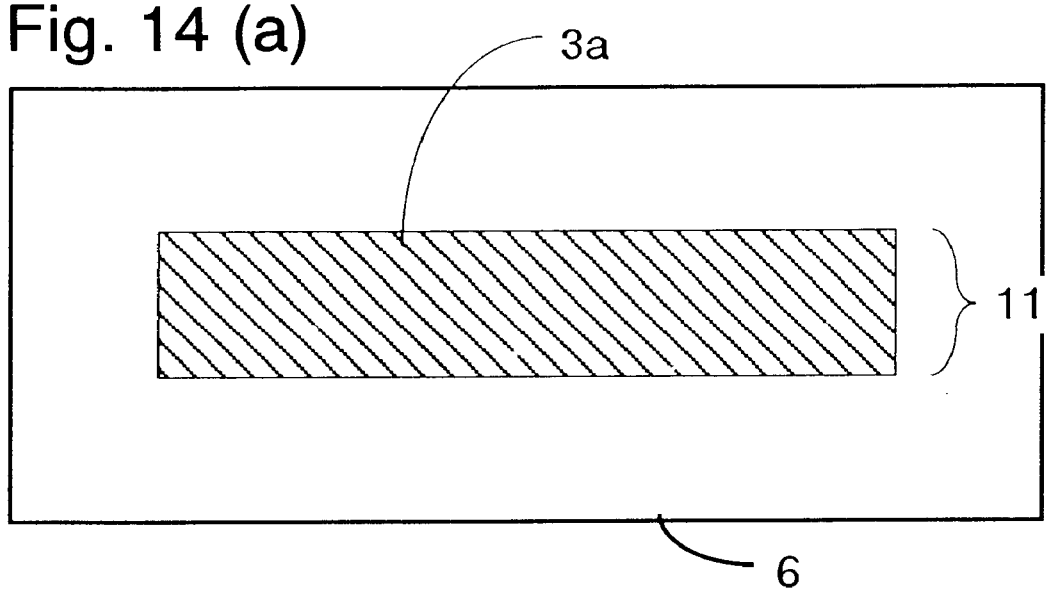
FIGS. 14(a) and 14(b) are diagrams illustrating the construction of a waveguide section of a coupler according to the present invention.
Figure 14:
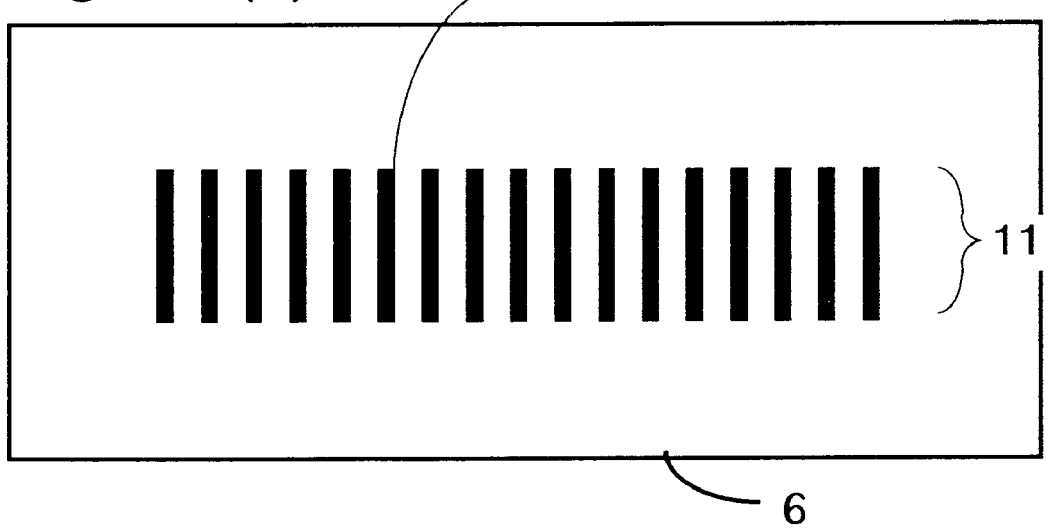

FIG. 14 is a diagram illustrating the construction of the waveguide section of the coupler 3 of the present invention.

In order to form the waveguide for passing the SAW, the waveguide section 11 of the coupler 3 needs to be so constructed that the propagation velocity of the SAW propagating in the waveguide section 11 is slower than its propagation velocity on a free surface of the piezoelectric substrate without a metal film.

The propagation velocity of the SAW propagating in the waveguide section 11 can be slowed as compared with the propagation velocity on the free surface by forming the waveguide section 11 not only as having a grating surface structure 3b (FIG. 14(b)) of a metal film but also as having a uniform surface structure 3a (FIG. 14(a)) of a metal film.

In the case where the coupler 3 is formed by use of a metal film as mentioned above, the metal film can be formed of the same material at the same time as the metal film of the IDT, and therefore, production steps only for the coupler are not needed.

As the metal film, Al, an Al—Au alloy, Au, Ag or the like may be used. The waveguide section 11 may be formed of an insulating film as well as the metal film. As the insulating film, $SiO_2$ may be used, for example.

Further, in the case where as the waveguide section 11 of the coupler is formed of the grating surface structure of a metal film as shown in FIG. 3, the gap section 12 may be formed of a metal film having a grating surface structure as well as of a metal film having a uniform surface structure as shown in FIG. 3.

Figure 15:
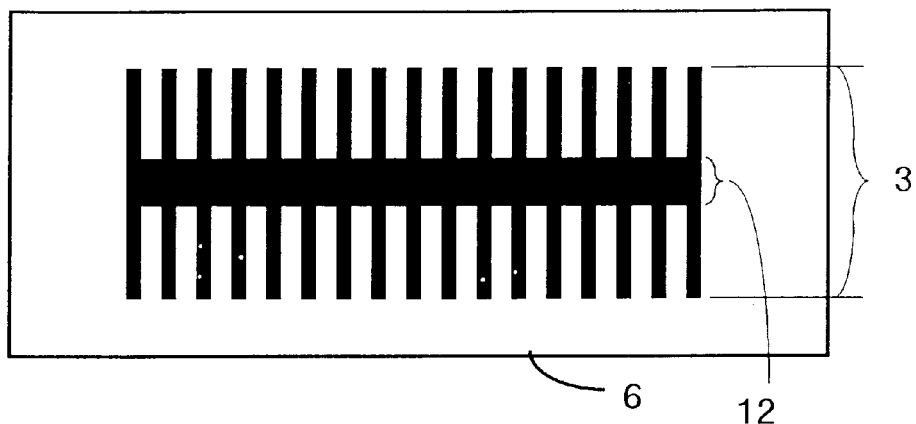
FIGS. 15(a)–15(c) are diagrams illustrating the construction of an example of a waveguide-directional coupler according to the present invention.
Figure 15:
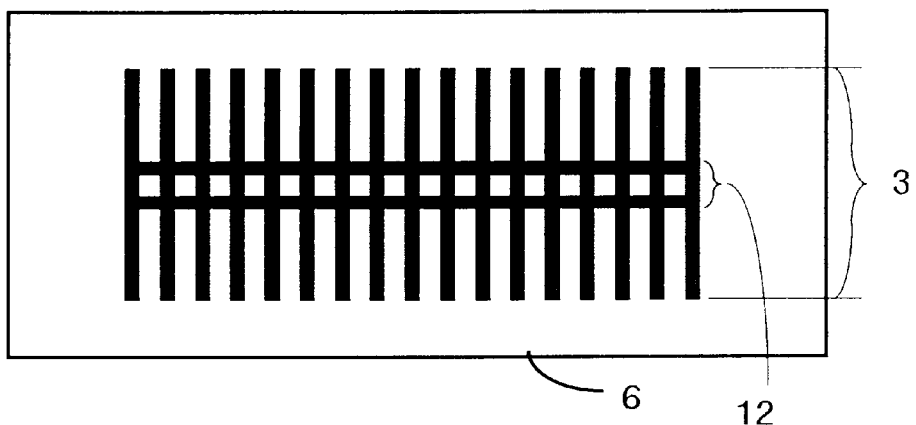
Figure 15:
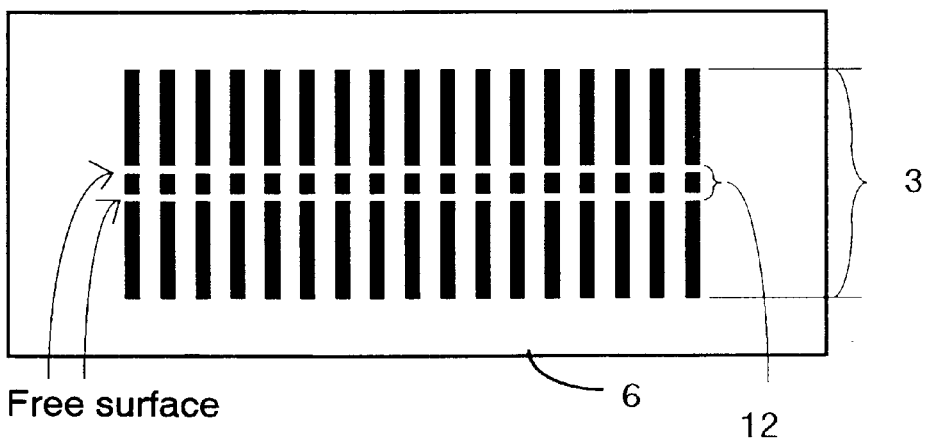
Figure 16:
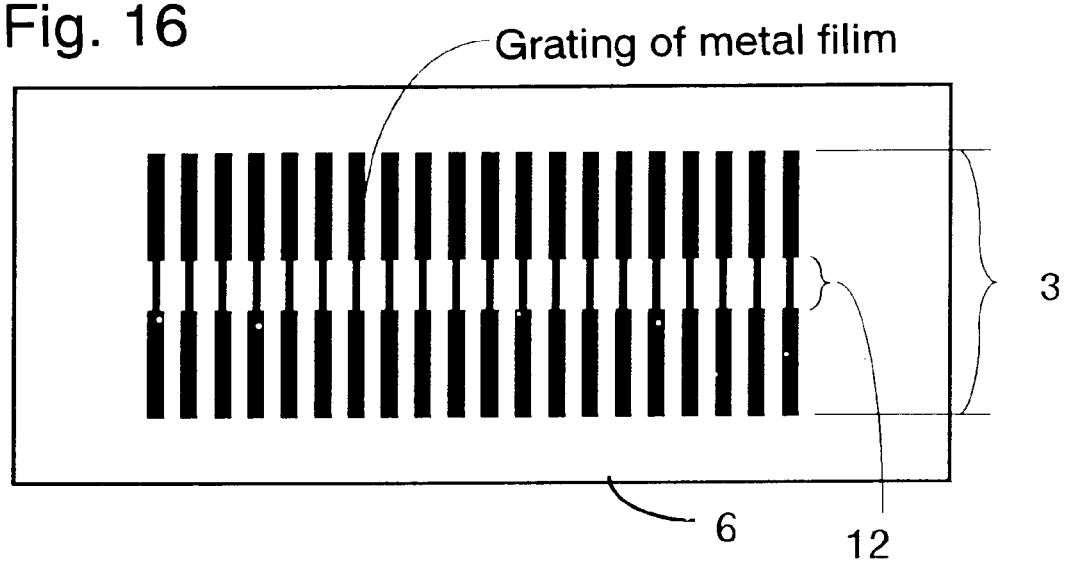
FIG. 16 is a diagram illustrating the construction of an example of a waveguide-directional coupler according to the present invention.

FIGS. 15 and 16 show exemplary structures for the gap section 12 of the waveguide-directional coupler 3 of the present invention.

FIG. 15(a) shows an example in which the gap section 12 is formed of a metal film having a uniform surface structure, FIG. 15(b) an example in which the gap section 12 is formed of a metal film having a grating surface structure I part and of a metal film having a uniform surface structure in other part, and FIG. 15(c) an example in which the gap section 12 is formed of a metal film having a grating structure in part and has a free surface in other part.

FIG. 16 shows an example in which the entire gap section 12 has a grating surface structure.

Here, since the gap section 12 is a portion for coupling two waveguide sections 11, the velocity of SAW propagating in the gap section 12 must be higher than the SAW propagation velocity in the waveguide sections 11.

Therefore, it is necessary to adjust the grating width of the grating surface structure of the gap section 12 and the grating width of the grating surface structure of the waveguide sections 11 so that the velocity of the SAW propagating in the gap section 12 is higher than the velocity of the SAW propagating in the waveguide sections 11.

An example of this adjustment is that a metallization ratio of the grating in the gap section 12 is set smaller than the metallization ratio of the grating in the waveguide sections 11 as shown in FIG. 16.

By thus introducing the metal film having the uniform surface structure or the grating surface structure into the gap section 12, the SAW propagation velocity in the gap section 12 can be set slower than that on the free surface. That strengthens the coupling of the upper and lower two waveguide sections by the gap section 12, so that even if the length of the coupler in the SAW propagation direction is shortened, a propagation route along which the surface acoustic wave travels can be switched.

Therefore, the structures of the gap section shown in FIG. 15 and FIG. 16 can contribute to reduction in the length of the entire surface acoustic wave filter in the SAW propagation direction.

Figure 17:
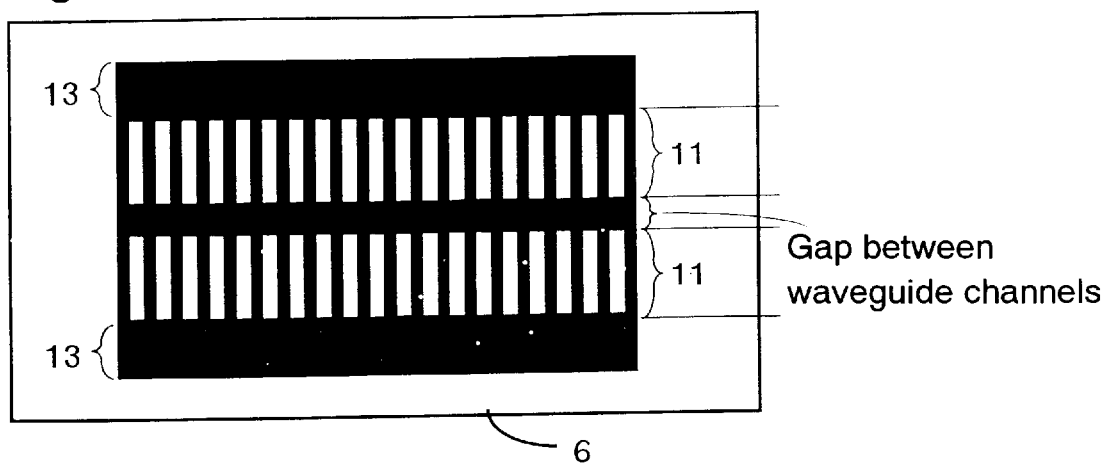
FIG. 17 is a diagram illustrating the construction of an example of a waveguide-directional coupler according to the present invention.
Figure 18:
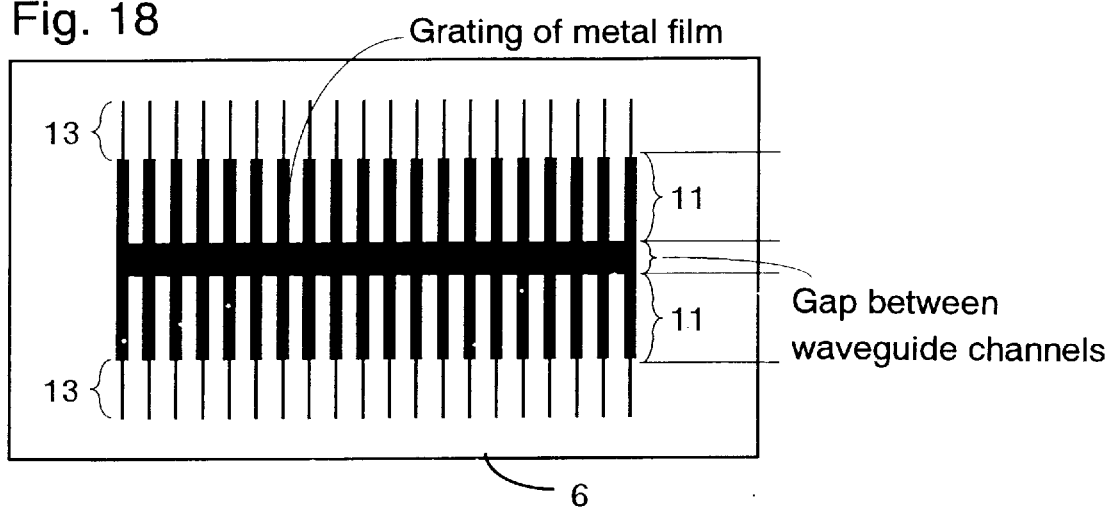
FIG. 18 is a diagram illustrating the construction of an example of a waveguide-directional coupler according to the present invention.

FIG. 17 and FIG. 18 show constructions in which a metal film having a uniform surface structure or a metal film having a grating surface structure is formed in an outside portion 13 which is outside the waveguide-directional coupler and does not contact the gap section.

With such constructions adopted, the SAW propagation velocity in the portion outside the waveguide section becomes lower than the SAW propagation velocity on the free surface and the enclosure of energy within the waveguide section weakens. As a result, a higher order waveguide mode is less easily propagated and the SAW energy is concentrated on a fundamental mode. Loss in the waveguide-directional coupler is reduced more.

Further, the weighting of the electrode fingers of the reflector can contribute to the improvement of the shape factor of the surface acoustic wave filter because it suppresses a sidelobe in a reflection characteristic curve of the reflector.

Figure 19:
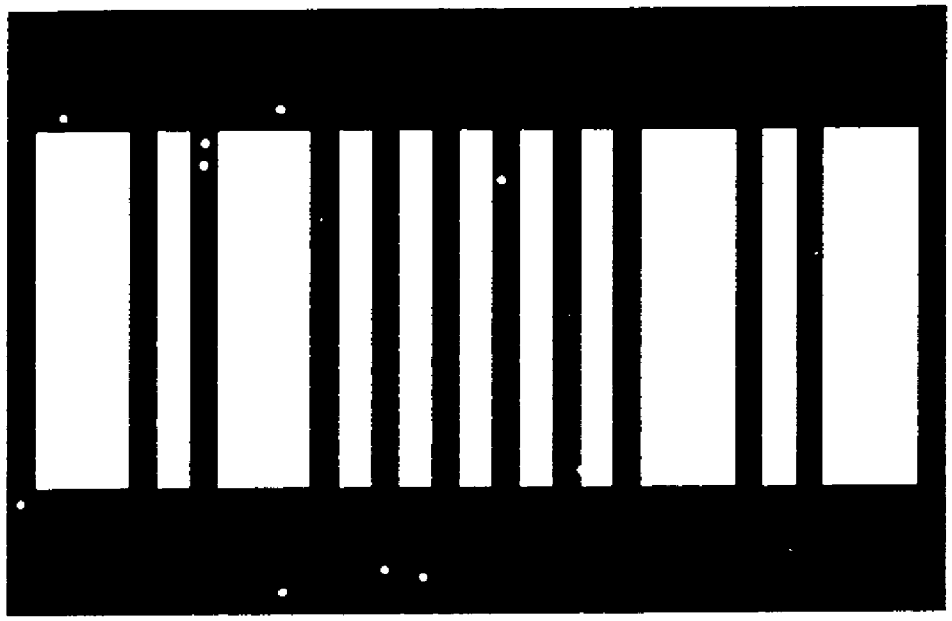
FIG. 19 is a diagram illustrating the construction of an example of a reflector weighted by withdrawal according to the present invention.

FIG. 19 shows a diagram illustrating the construction of an example of a reflector weighted by withdrawal which is used for the surface acoustic wave filter of the present invention.

Figure 20:
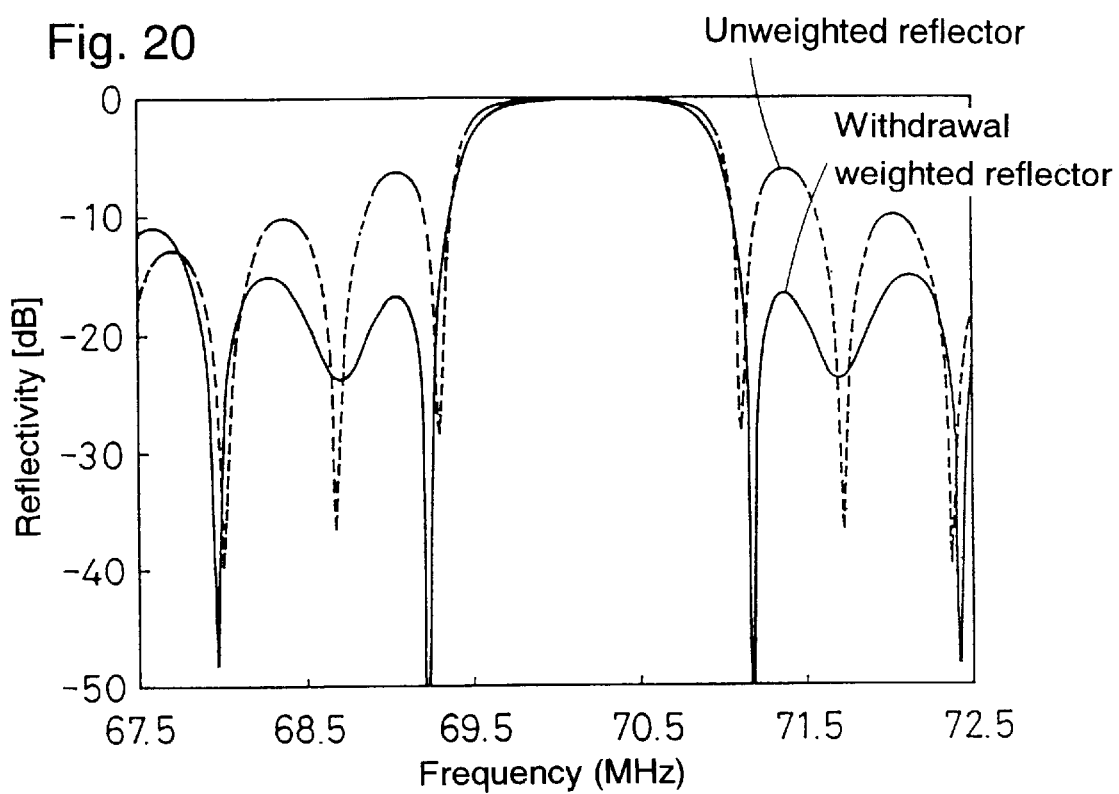
FIG. 20 is a graphical representation of the reflection characteristic of a reflector weighted by withdrawal according to the present invention.

FIG. 20 shows the reflection characteristic of the reflector weighted by withdrawal shown in FIG. 19.

A solid line in FIG. 20 is a curve for the reflector weighted by withdrawal and a dotted line in FIG. 20 is a curve for an unweighted reflector.

In FIG. 19, the number of electrode fingers of the unweighted reflector is 114. The reflector weighted by withdrawal of FIG. 19 is one in which 22 electrode fingers of the 114 electrode fingers have been withdrawn. The positions of the withdrawal electrode fingers are the 1st, 8th to 14th, 18th to 20th, 95th to 97th and 101st to 107th from the leftmost electrode finger of the reflector.

In FIG. 20, the comparison of both the curves shows that the reflector weighted by withdrawal exhibits a more suppressed frequency characteristic curve particularly near a first sidelobe.

Figure 21:
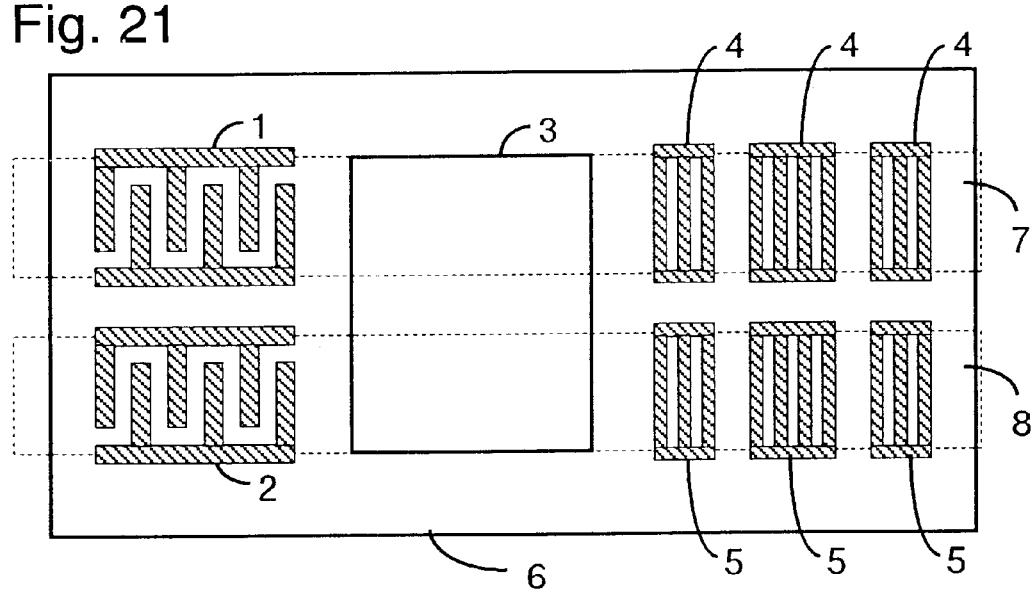
FIG. 21 is a diagram illustrating the construction of an example of a surface acoustic wave filter according to the present invention (in which a plurality of reflectors are provided in one propagation path)

FIG. 21 shows a diagram illustrating the construction of a surface acoustic wave filter according to the present invention in which a plurality of reflectors 4 or 5 are provided in one propagation path.

With this construction, it is also possible to suppress a reflection characteristic curve at the sidelobe and improve the shape factor in the characteristics of the surface acoustic wave filter.

Figure 22:
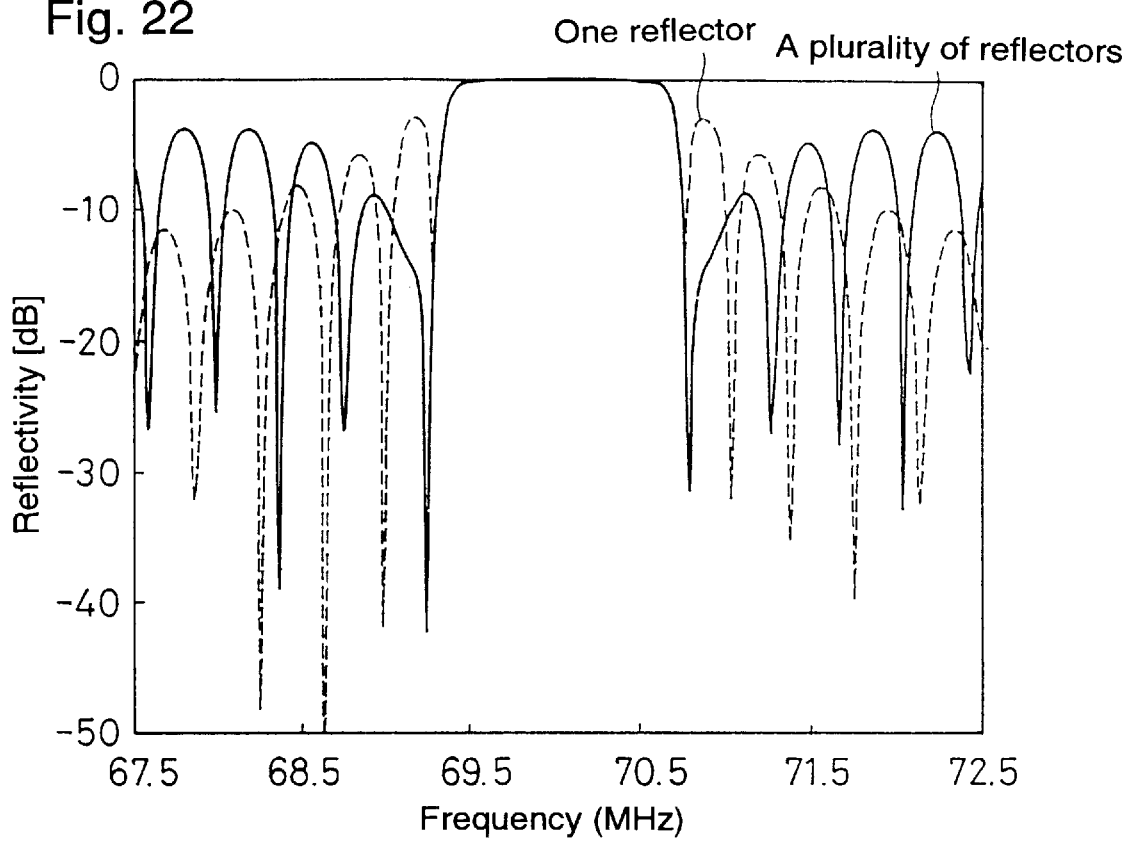
FIG. 22 is a comparative graphical representation of the reflection characteristics of reflectors according to the present invention.

FIG. 22 is a comparative graphical representation of the reflection characteristics of reflectors.

A solid line in FIG. 22 shows the reflection characteristic of a reflector which is composed of three separate reflectors as shown in FIG. 21 which have 11, 149 and 11 electrode fingers, respectively. A dotted line in FIG. 22 shows the reflection characteristic of a reflector having 171 electrode fingers.

FIG. 22 shows that the reflection ratio is more suppressed at the first sidelobe with the reflector composed of a plurality of separate reflectors.

Figure 23:
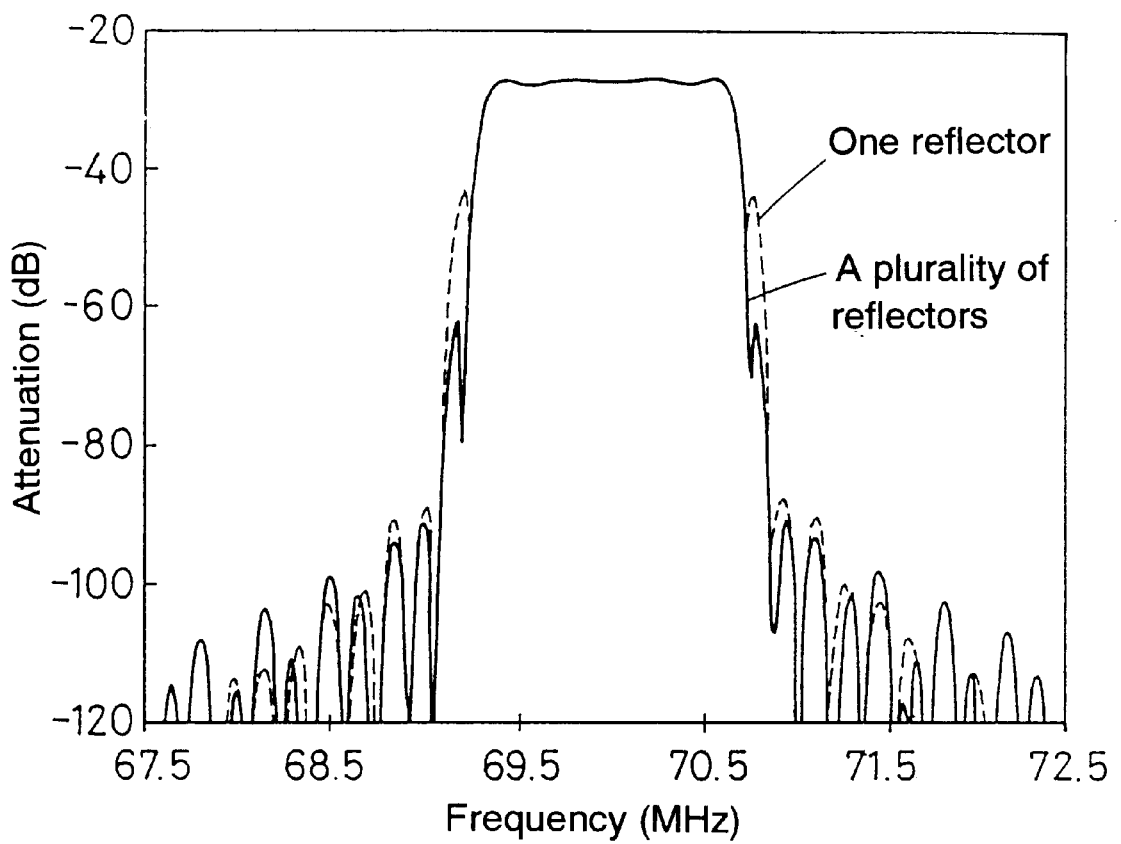
FIG. 23 is a comparative graphical representation of the frequency characteristics of surface acoustic wave filters according to the present invention (comparing one provided with a single reflector and one provided with a plurality of reflectors)

FIG. 23 is a graphical representation of the frequency characteristic (a solid line) of a surface acoustic wave filter constructed with use of the reflectors 4 and 5 each composed of a plurality of separate reflectors and the frequency characteristic (a dotted line) of a surface acoustic wave filter constructed with use of a single reflector.

Since the first sidelobe of the reflectors is suppressed as shown in FIG. 22, an abrupt change is also seen near the pass-band of the surface acoustic wave filter in FIG. 23, which shows the improvement of the shape factor.

Next, explanation is given of examples in which the electrode period of the IDT agrees with double the electrode period of the reflector and disagrees with double the electrode period of the reflector.

Figure 24:
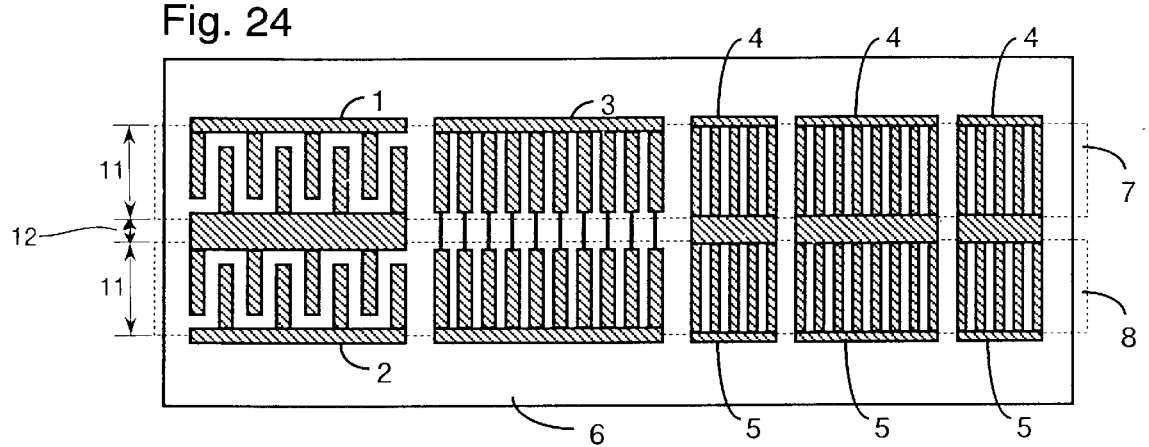
FIG. 24 is a diagram illustrating the construction of an example of a surface acoustic wave filter according to the present invention.

FIG. 24 shows a diagram illustrating the construction of an example of a surface acoustic wave filter according to the present invention.

Here is shown a surface acoustic wave filter in which a waveguide-directional coupler is used as the coupler 3 and the reflectors 4 and 5 on the respective propagation paths are each composed of three reflectors.

Two SAW propagation paths are provided as in FIG. 1, and one input IDT 1 and one output IDT 2 are each composed of normal electrodes. The number of electrode pairs is 95, the electrode period $\lambda$ is 15 $\mu$m and the thickness of the electrodes is 0.32 $\mu$m.

The waveguide section 11 of the waveguide-directional coupler 3 is formed of a metal (aluminum) film having a grating surface structure. The grating period is 11.4 $\mu$m, the metallization ratio of the grating is 50% and the waveguide length is 3.1 mm.

The gap section 12 between the waveguides is also formed of a metal (aluminum) film having a grating surface structure. The grating period is 11.4 $\mu$m, the metallization ratio of the grating is 30% and the width of the gap (the length of the gap in the up and down direction in the figure) is 0.3 $\lambda$. The number of electrode fingers of the three reflectors is 17, 151 and 17, respectively. The distance between the reflectors is 7 $\lambda$ and the electrode period of each of the reflectors is 7.5 $\mu$m.

Figure 25:
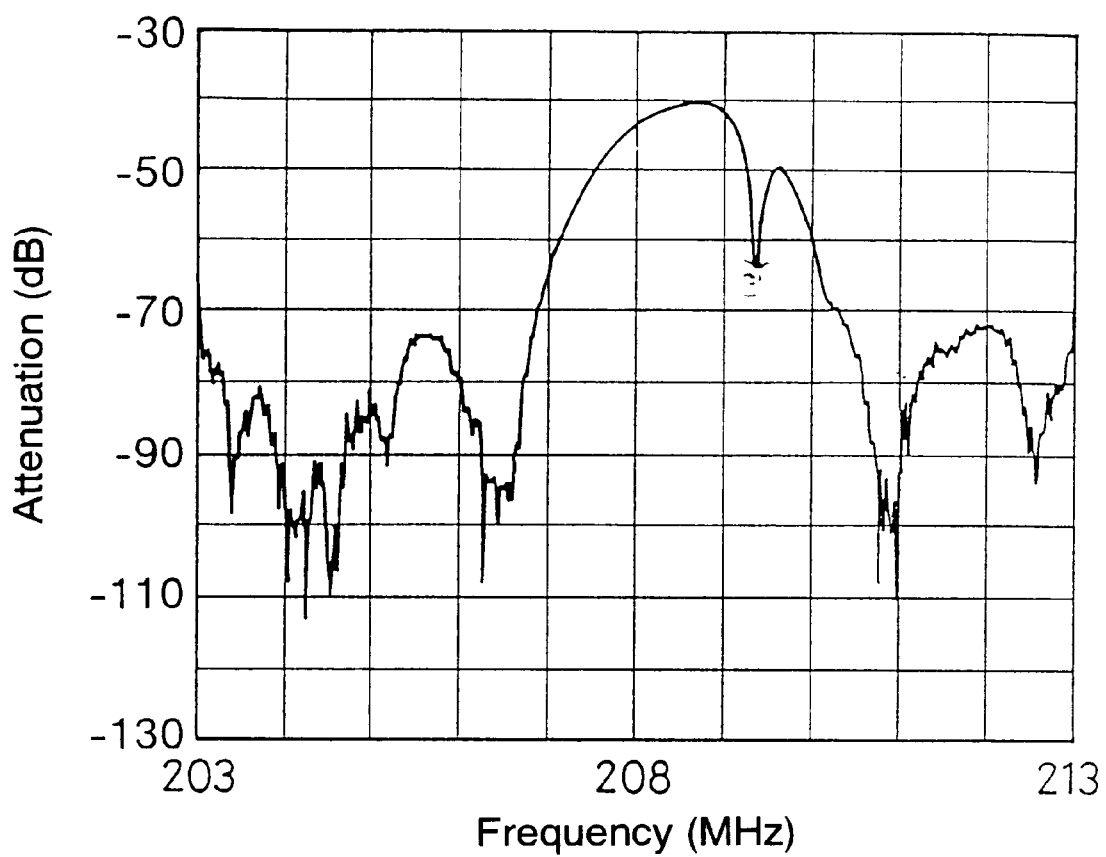
FIG. 25 is a graphical representation of the frequency characteristic of an example of a surface acoustic wave filter according to the present invention (in which an electrode period of an IDT equals to double the electrode period of a reflector)

Here, double the electrode period of the reflectors equals to the electrode period $\lambda$ of the IDTs. FIG. 25 shows the frequency characteristic of the surface acoustic wave filter of this example. Generally, in the case where double the electrode period of a reflector agrees with the electrode period $\lambda$ of an IDT, the velocity of the SAW propagating under the IDT is a little different from the velocity of the SAW propagating under the reflector. Thus, the center frequency of the frequency characteristic of the IDT differs from the center frequency of the frequency characteristic of the reflector, and the frequency characteristic curve of the surface acoustic wave filter is not symmetric (see FIG. 25).

Figure 26:
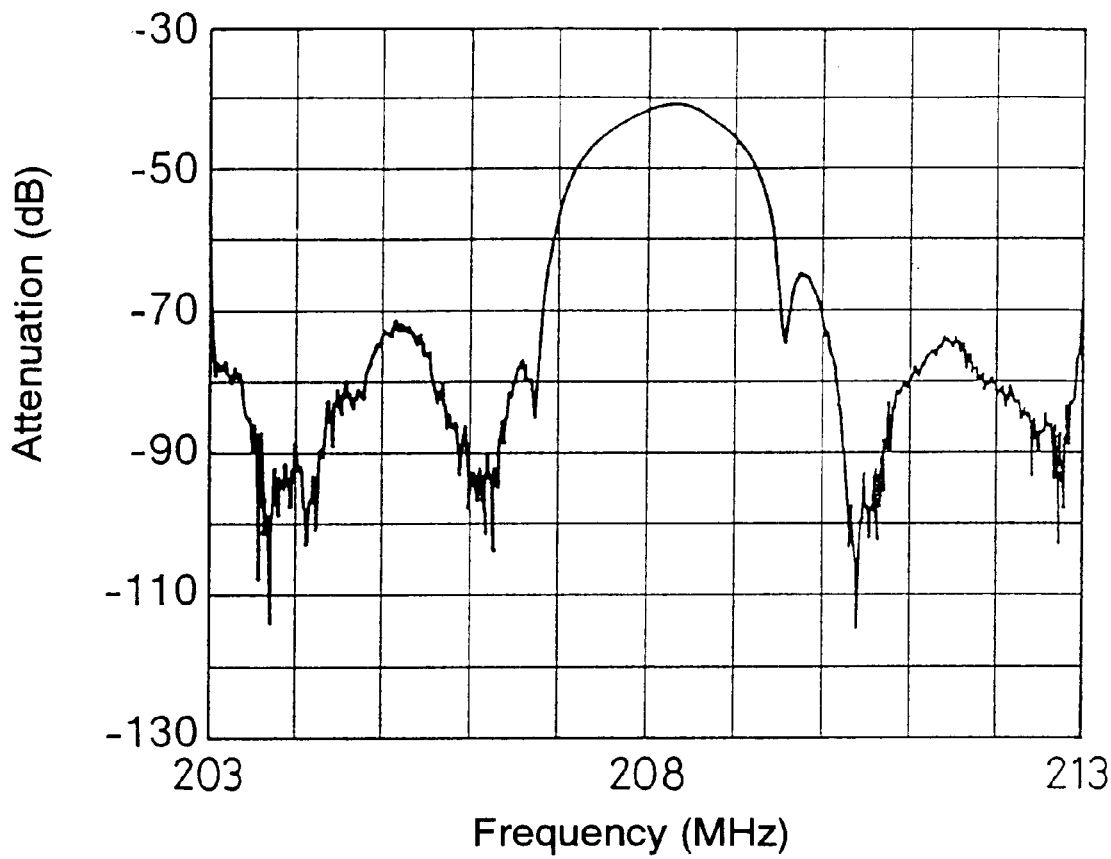
FIG. 26 is a graphical representation of the frequency characteristic of an example of a surface acoustic wave filter according to the present invention (in which the electrode period of an IDT disagrees with double the electrode period of a reflector)

FIG. 26 shows the frequency characteristic of a surface acoustic wave filter in which double the electrode period of the reflector disagrees with the electrode period of the IDT in the present invention.

Here, the electrode period of the IDT is 15 μm and the electrode period of the reflector is 7.45 μm. In other respects, the constitution of the filter is the same as shown in FIG. 24.

With this construction, the center frequency of the frequency characteristic of the IDT and the center frequency of the frequency characteristic of the reflector can be brought in substantial agreement (208.23 MHz) and an almost symmetric frequency characteristic curve is obtained. The obtainment of the almost symmetric frequency characteristic curve means the obtainment of frequency characteristic excellent in the shape factor.

In the surface acoustic wave filter shown in FIG. 26, the length of the entire filter in the SAW propagation direction is abut 6 mm, which is considerably smaller than the conventional transversal filter.

Figure 27:
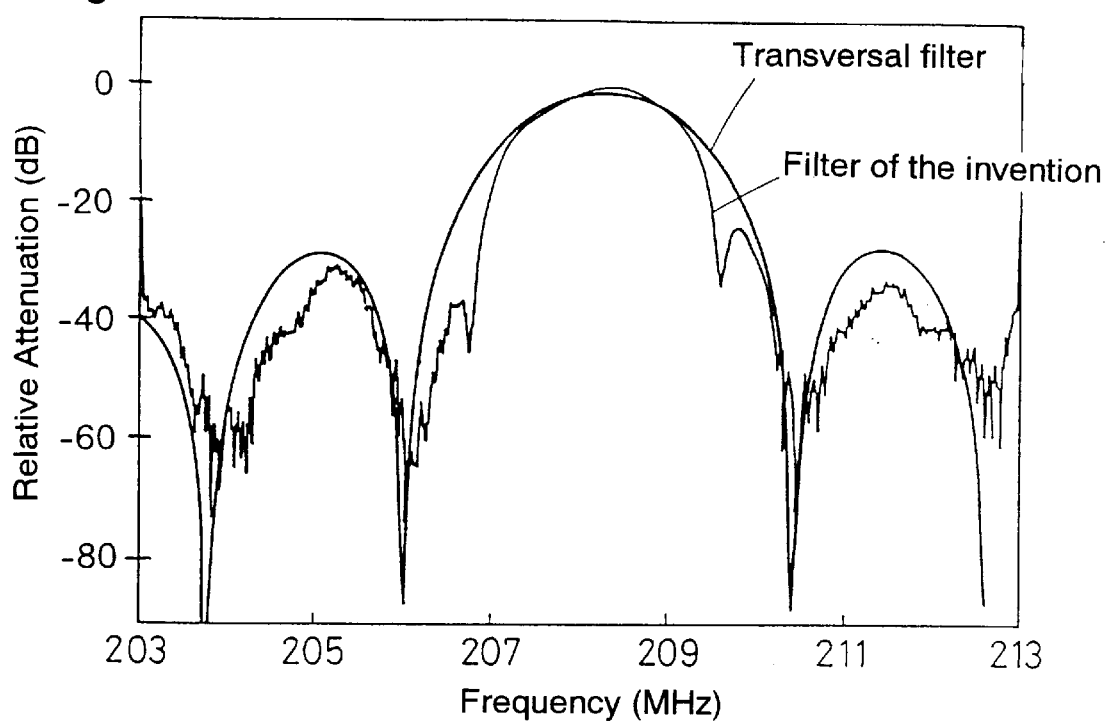
FIG. 27 is a comparative graphical representation of the frequency characteristics of surface acoustic wave filters.

FIG. 27 is a comparative graphical representation of the frequency characteristic of a surface acoustic wave filter according to the present invention in which double the electrode period of the reflector disagrees with the electrode period of the IDT and the frequency characteristic of a conventional transversal surface acoustic wave filter in which the pair number of the IDT is also 95.

This comparative graphical representation shows that the characteristic of the conventional transversal filter is remarkably gentle. That is, it is understood that a surface acoustic wave filter excellent in the shape factor can be obtained by constructing the filter of the present invention such that double the electrode period of the reflector is different from the electrode period of the IDT.

Figure 28:
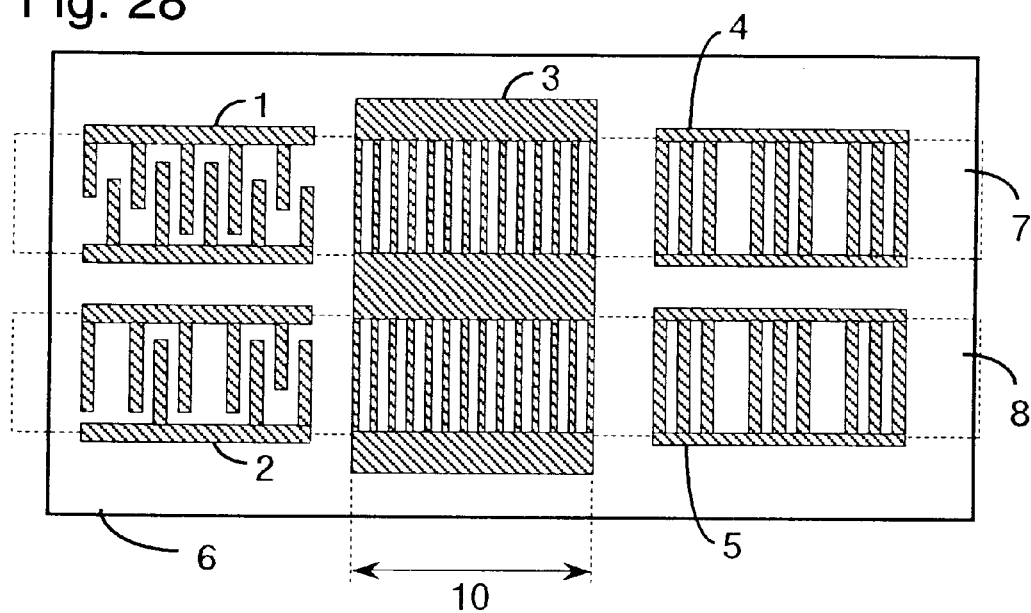
FIG. 28 is a diagram illustrating the construction of an example of a surface acoustic wave filter according to the present invention.

Next, FIG. 28 shows an example of a surface acoustic wave filter according to the present invention in which the input IDT 1 and the output IDT 2 are weighted.

In FIG. 28, the input IDT 1 is weighted by apodization and the output IDT 2 is weighted by withdrawal.

Here, a substrate 6 of ST cut quarts is used. The electrode period of both the IDTs is 45 μm, the film thickness of electrodes is 2.2 μm, the number of electrode pairs of the input IDT 1 is 400, and the number of electrode pairs of the output IDT 2 is 399.

As the coupler 3, used is a waveguide-directional coupler having a waveguide of a grating surface structure of a metal film. The grating period is 34.6 μm and the coupling length is about 7 mm.

The reflectors 4 and 5 are weighted reflectors in which electrode fingers are withdrawal. In each of the two reflectors 4 and 5 disposed in a vertical direction, the number of electrode fingers is 171 and the period of the electrode fingers is 22.5 μm.

The length of the entire surface acoustic wave filter thus constructed is about 30 mm in the SAW propagation direction.

Figure 29:
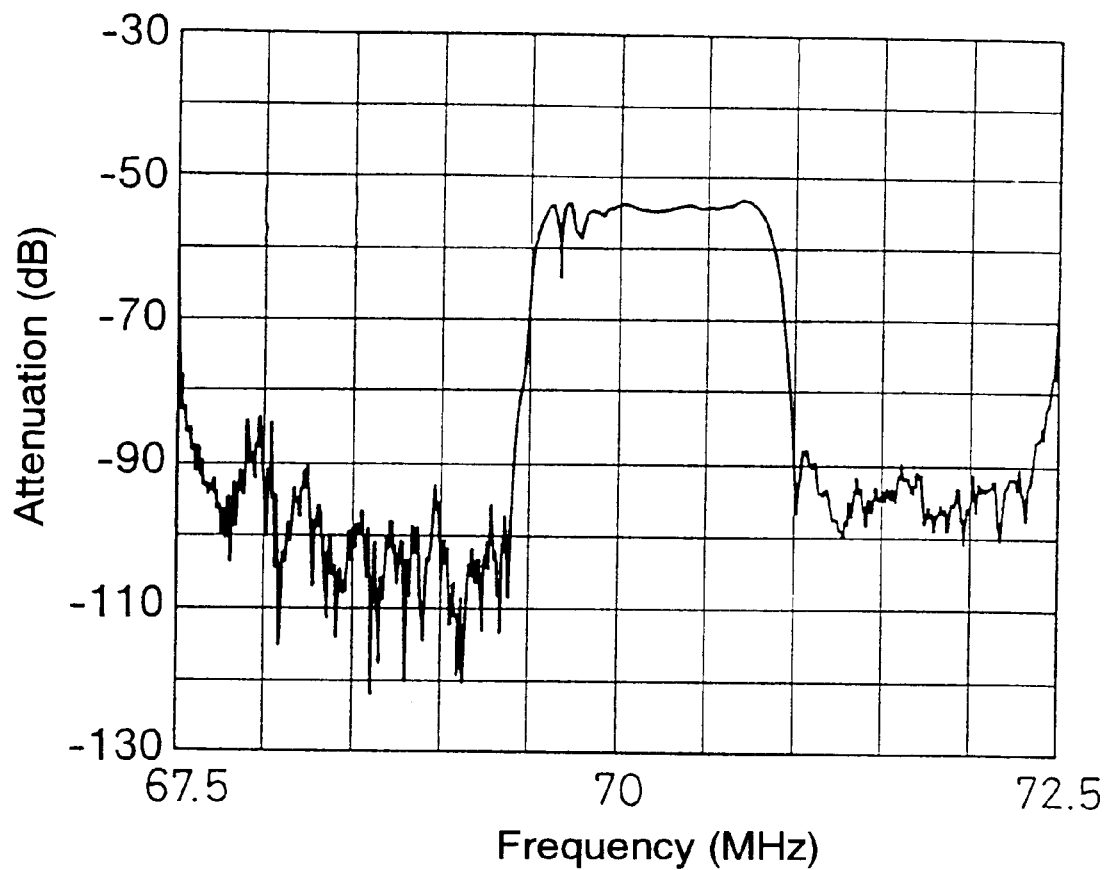
FIG. 29 is a graphical representation of the frequency characteristic of an example of a surface acoustic wave filter according to the present invention.

FIG. 29 shows a graphical representation of the frequency characteristic of the surface acoustic wave filter which has the weighted IDTs 1 and 2 shown in FIG. 28.

This graphical representation shows that by weighting the IDTs as in FIG. 28, the characteristic of excellent shape factor can be obtained.

Figure 30:
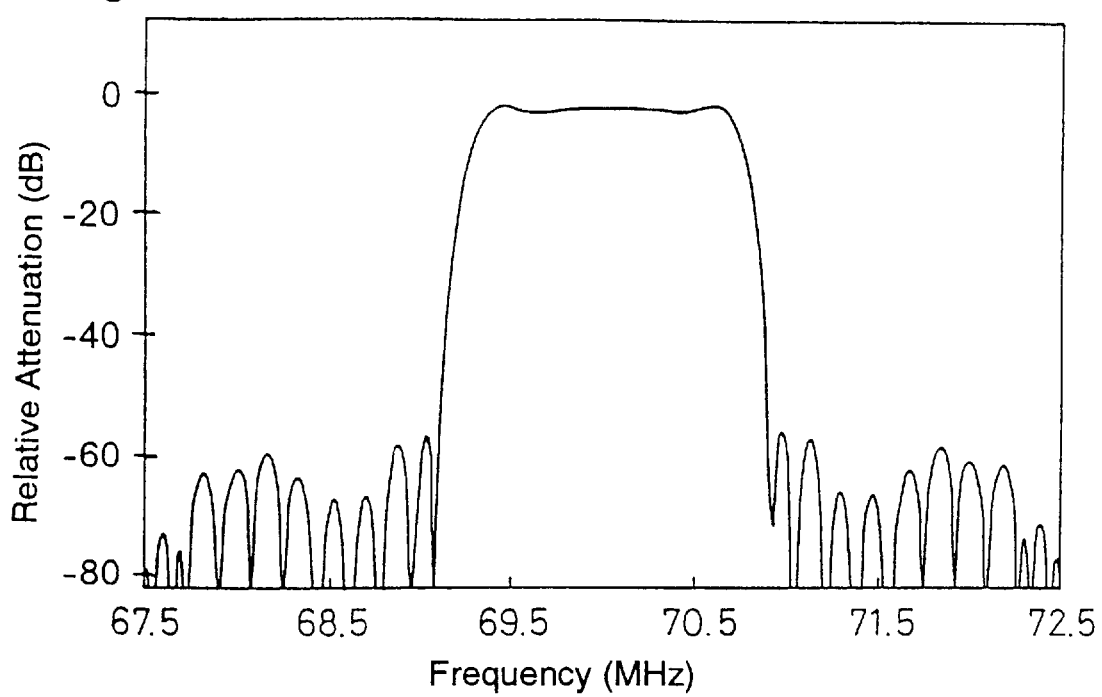
FIG. 30 is a graphical representation of the frequency characteristic of a conventional transversal surface acoustic wave filter.

For comparison, FIG. 30 shows the frequency characteristic of a simple transversal surface acoustic wave filter constructed with use of an input IDT 1 weighted by apodization and an output IDT 2 weighted by withdrawal as in FIG. 28.

As regards this transversal surface acoustic wave filter, its length in the SAW propagation direction is 36 mm (=45 μm×799 pairs), and therefore, it is larger than the surface acoustic wave filter (about 30 mm) of the present invention shown in FIG. 28.

Further the comparison of FIG. 29 with FIG. 30 shows that the filter characteristics of the present invention shown in FIG. 29 are superior in the shape factor.

That is, even if IDTs weighted in the same manner are used as the input IDT and the output IDT, the present invention can provide a surface acoustic wave filter which is smaller in size and has a frequency characteristic more excellent in the shape factor than the conventional one.

Next, explanation is given of an example of a surface acoustic wave filter according to the present invention in which isolation between the input IDT and output IDT can be improved and the degree of suppression out of the passband can be increased.

In the surface acoustic wave filters shown in FIG. 3 and the like, since the input and output IDTs are relatively close to each other, great is electrostatic coupling between the input and output IDTs via the piezoelectric substrate.

For improving the isolation between the input and output IDTs, this electrostatic coupling needs to be suppressed.

In order to suppress the electrostatic coupling between the input and output IDTs, for example, the input IDT may be positioned physically as apart from the output IDT as possible, or the input IDT and the output IDT may be out of alignment with each other in a direction parallel to the SAW propagation direction.

Figure 33:
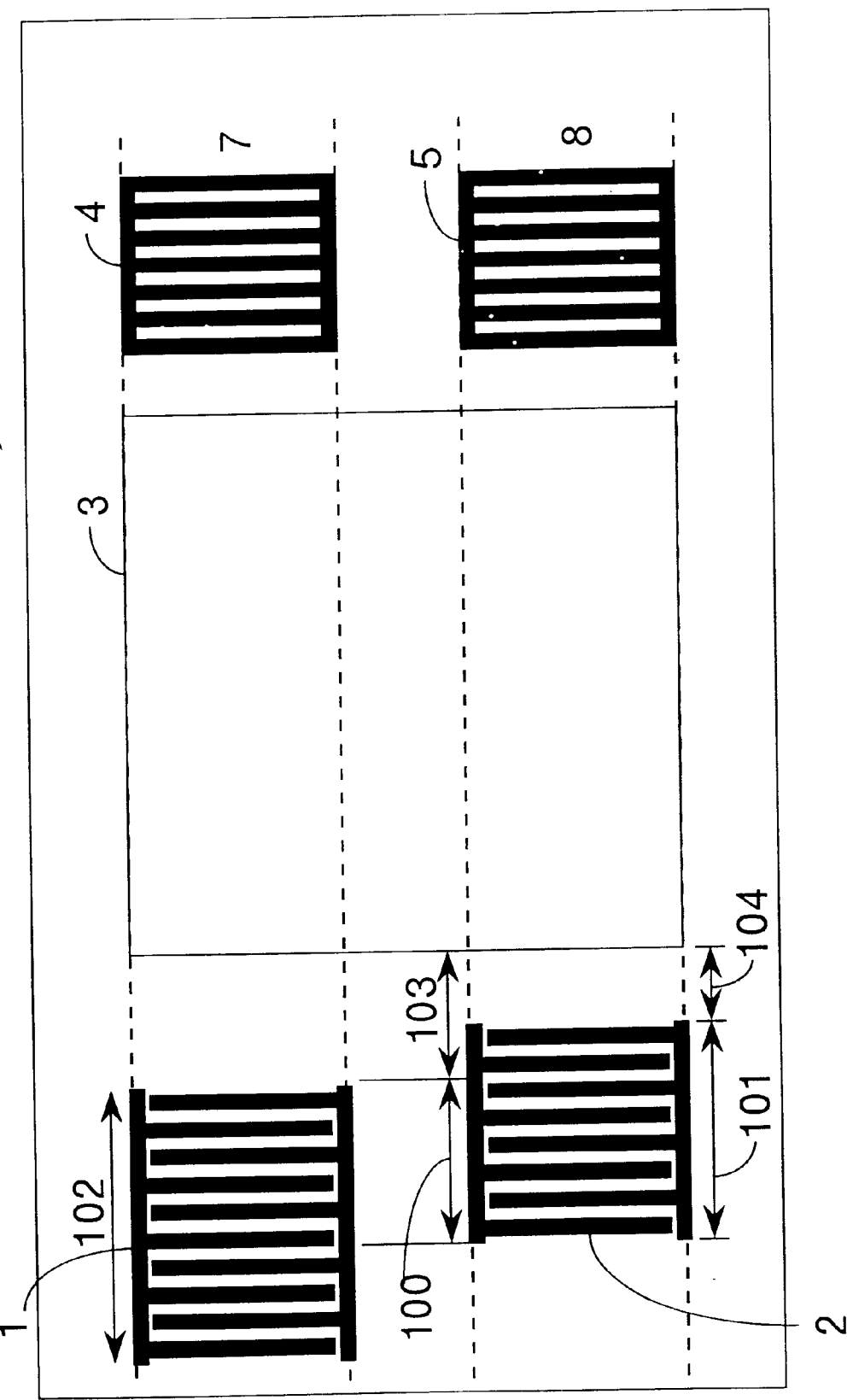
FIG. 33 is a diagram illustrating the construction of an example of a surface acoustic wave filter according to the present invention in which the positions of an input IDT and an output IDT are shifted.

FIG. 33 shows a diagram illustrating the construction of an example of a surface acoustic wave filter according to the present invention in which the positional relationship of the input and output IDTs is shifted in the SAW propagation direction. In FIG. 33, the input IDT 1 has more electrode finger pairs than the output IDT 2, and the distance from the input IDT 1 to the coupler is longer than the distance from the output IDT 2 to the coupler.

In the construction shown in FIG. 3, the input IDT 1 and the output IDT 2 are so arranged that their widths are substantially in agreement in the direction perpendicular to the SAW propagation direction. However, in the construction shown in FIG. 33, the input IDT 1 and the output IDT 2 are out of alignment in the SAW propagation direction, and the length in the SAW propagation direction of a portion where the input IDT 1 overlaps the output IDT 2 in the direction perpendicular to the SAW propagation direction (reference numeral 100 in FIG. 33) is shorter than the length of output IDT 2 in the SAW propagation direction (reference numeral 101) which is relatively small.

By thus reducing the overlap portion (reference numeral 100 in FIG. 33) of the input IDT 1 and the output IDT 2, the electrostatic coupling of the input IDT 1 and the output IDT 2 can be weakened.

That is, if the electrostatic coupling can be weakened, an electrical direct feed-through wave between the input and output IDTs can be reduced and the isolation between input and output can be improved.

For example, in FIG. 33, the following may be set: the length of the reference numeral 100=633 μm; the length of the reference numeral 101=800 μm; the length of the reference numeral 102=1431 μm; the length of the reference numeral 103=267 μm; and the length of the reference numeral 104=100 μm.

Figure 34:
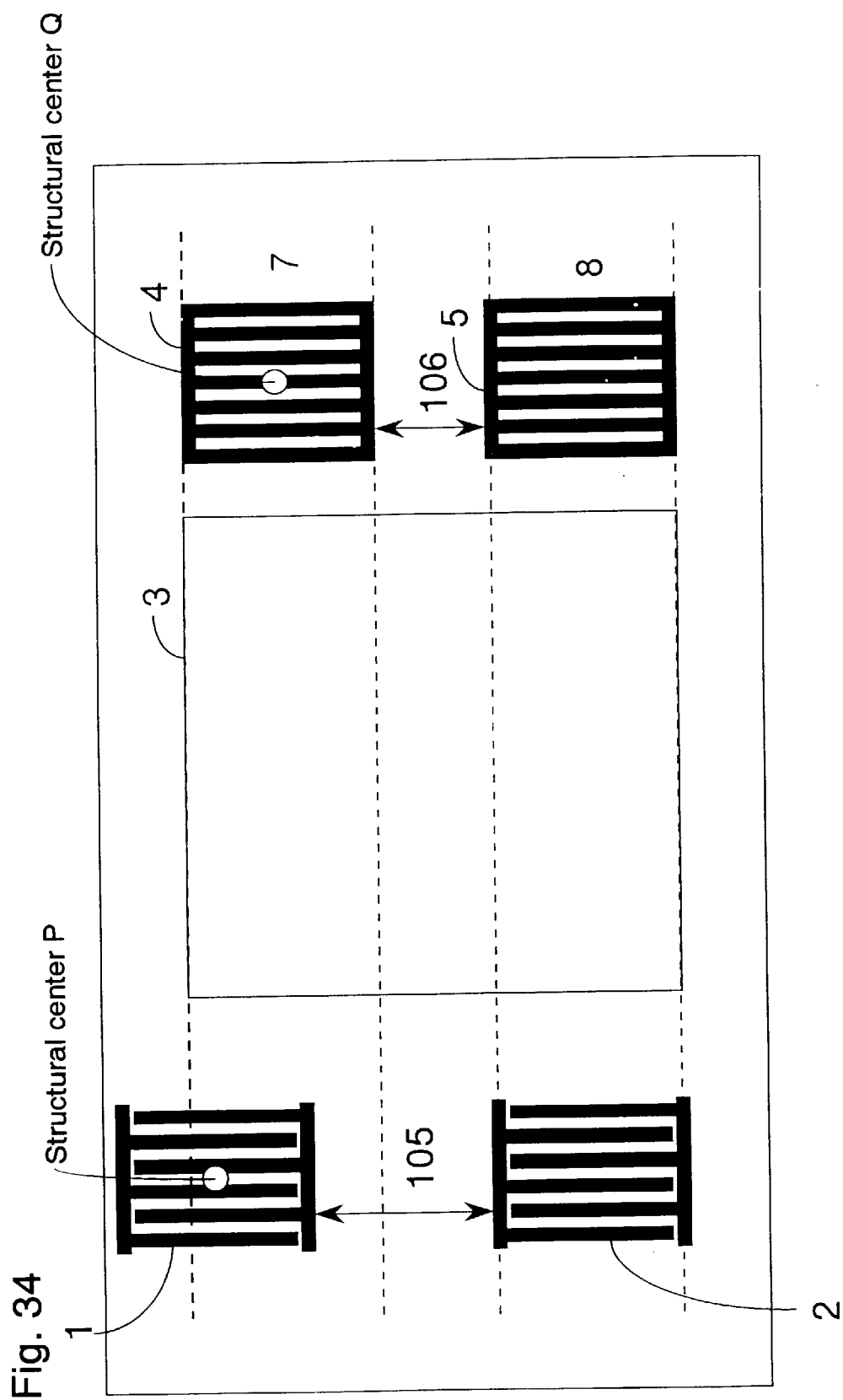
FIG. 34 is a diagram illustrating the construction of an example of a surface acoustic wave filter according to the present invention in which the structural centers of an input IDT and a reflector are shifted.

Alternatively, in order to suppress the electrostatic coupling between the input and output IDTs, at least one of the input IDT and the output IDT may be moved in the direction perpendicular to the SAW propagation direction, as shown in FIG. 34, so that the physical distance (reference numeral 105) between the input and output IDTs in the direction perpendicular to the SAW propagation direction is longer than the distance between the reflectors (reference numeral 106).

Also in this case, since the direct feed-through wave between the input and output IDTs can be decreased, the isolation between input and output can be improved.

In FIG. 34, the output IDT 2 and the reflector 5 are disposed on one SAW propagation path 8, while the input IDT 1 is upwardly off a SAW propagation path 7 defined by the reflector 4 and the coupler 3.

That is, a structural center P of an electrode finger crossing portion of the input IDT 1 is not aligned with the structure center Q of the reflector 4 in the direction perpendicular to the SAW propagation direction so that the distance between the input and output IDTs (reference numeral 105) increases.

Here, the structural center means the center of gravity of an electrode finger crossing portion where the electrode fingers of the IDT overlap each other as seen in the SAW propagation direction. Usually the electrode finger crossing portion is in the form of a rectangle, and in this case, the structural center is a point of intersection of diagonal lines of the rectangle. The structural center of the reflector is also the center of gravity of its electrode finger crossing portion.

Hereinafter, an IDT whose structural center P is not in alignment with the structure center Q of a reflector as shown in FIG. 34 is referred to as an offset interdigital transducer (offset IDT).

Now explanation is given of experimental results showing that an increased distance between the input IDT 1 and the output IDT 2 improves the isolation between input and output.

Figure 35:
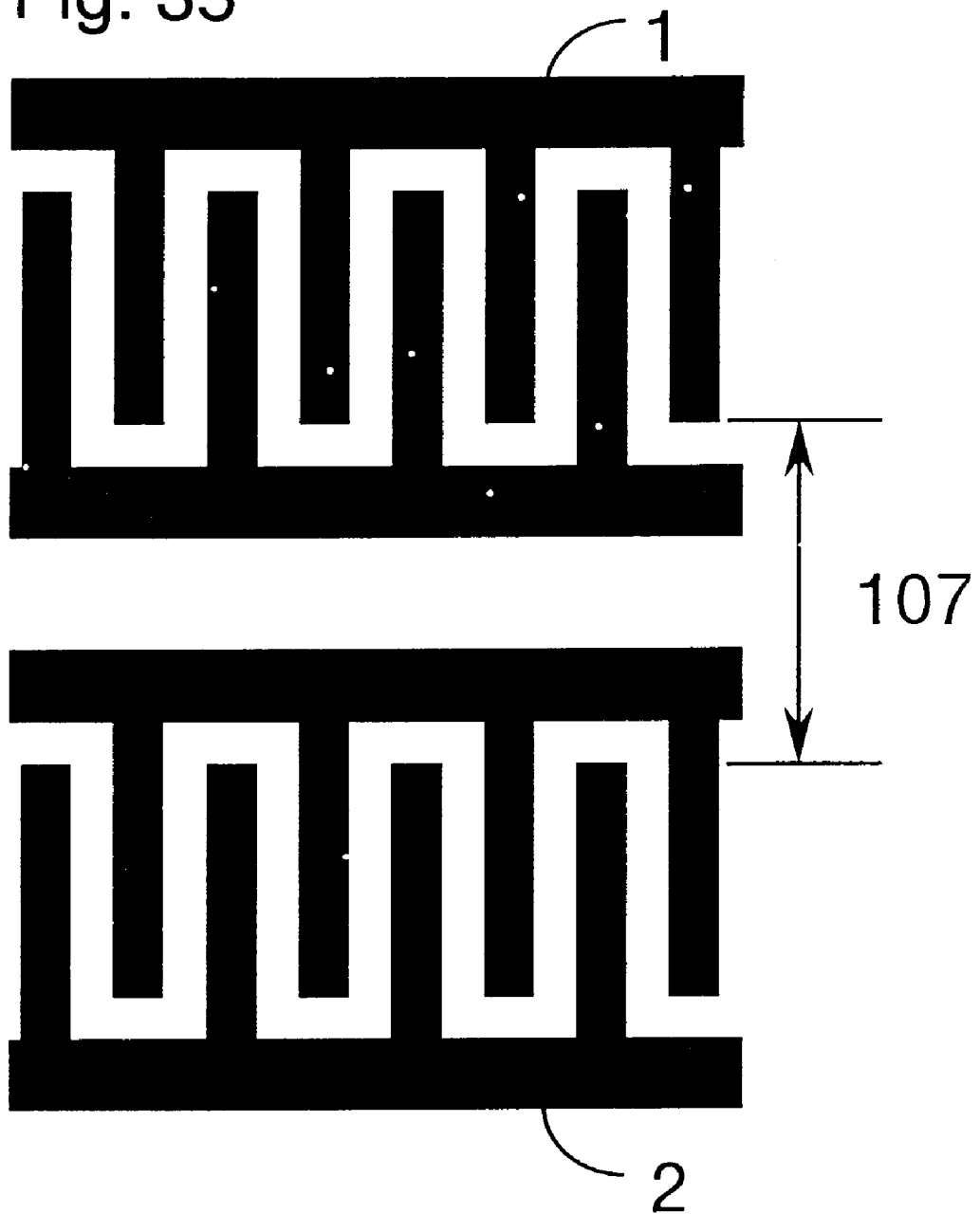
FIG. 35 is a diagram illustrating a positional relationship between an input IDT and an output IDT according to the present invention.
Figure 36:
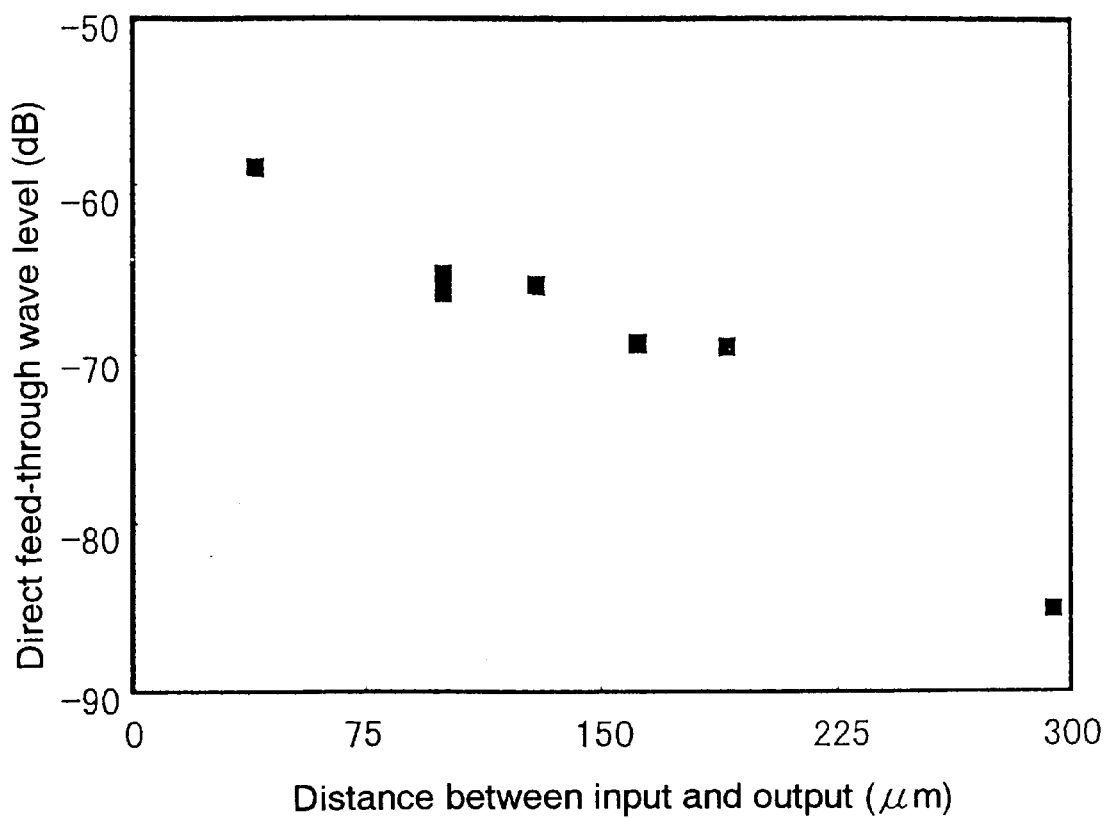
FIG. 36 is a graphical representation showing a relationship of the level of direct feed-through wave to the distance between input and output IDTs in the present invention.

The input IDT 1 and the output IDT 2 were arranged as shown in FIG. 35. The level of direct feed-through wave between input and output was measured with changing the distance between the input and output IDTs. The results are shown in FIG. 36. A 36° Y-X:quartz was used as the piezoelectric substrate, the electrode period of both the IDTs was 15 $\mu$m, the electrode films were formed of aluminum of 0.21 $\mu$m thickness and the number of electrode finger pairs of each of the IDTs was 95. According to FIG. 36, the level of direct feed-through wave is lower as the distance between the input and output IDTs (reference numeral 107 in FIG. 35) is longer. That is, it is confirmed that the longer the distance 107 between the input and output IDTs is, the lower the level of direct feed-through wave is and the more the isolation between input and output is improved.

For example, in FIG. 3, the distance between the input and output IDTs (reference numeral 107 in FIG. 35) is about 10.5 $\mu$m. As this distance (reference numeral 107) is lengthened, it is found that, until the distance reaches 300 $\mu$m, the direct feed-through wave between input and output decreases and the isolation between input and output is improved.

Incidentally, in consideration of the construction shown in FIG. 34, since the input IDT 1 is shifted off as shown in the figure, part of the SAW sent out from the input IDT 1 does not enter the coupler 3. Thus the insertion loss may increase.

Figure 37:
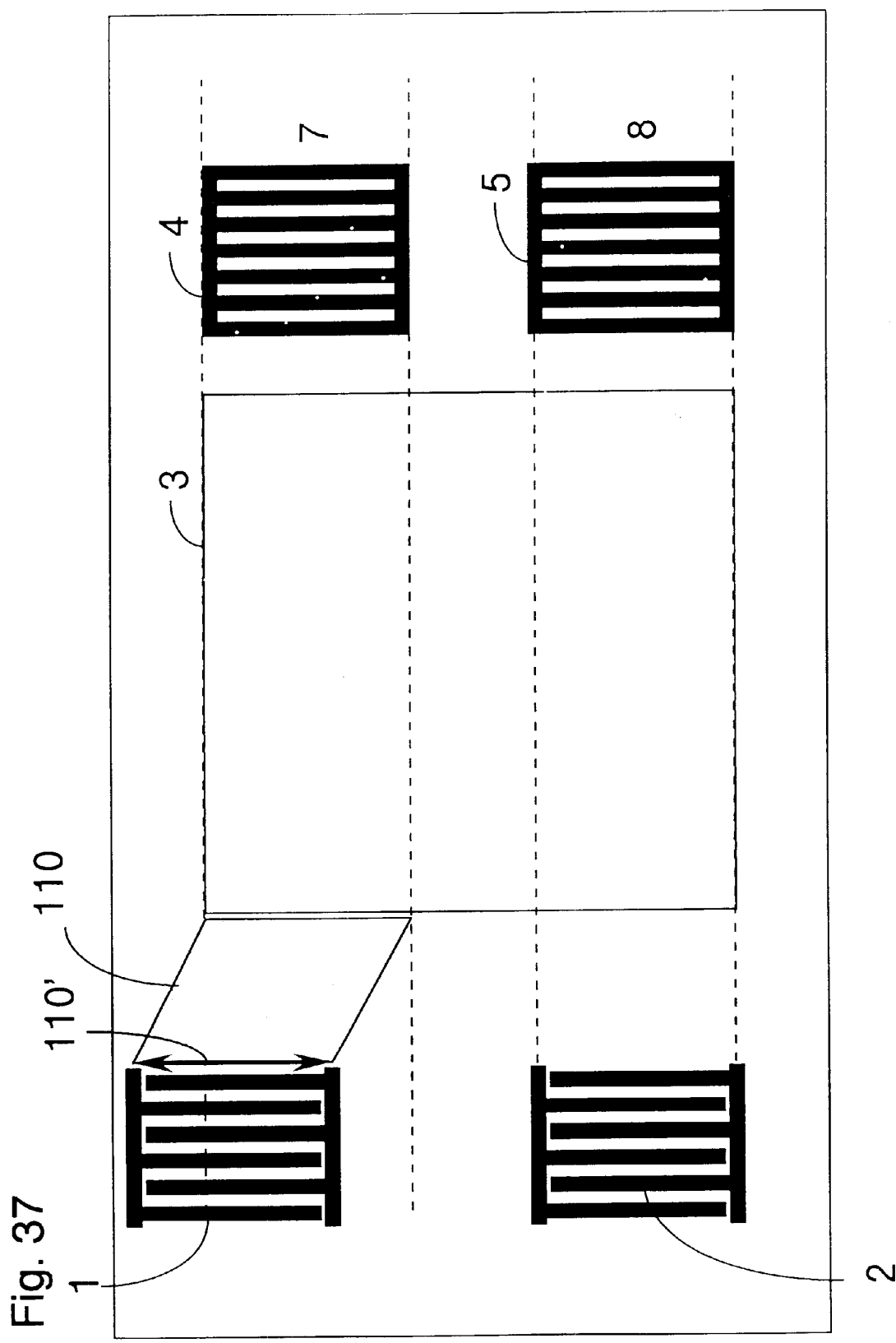
FIG. 37 is a diagram illustrating the construction of an example according to the present invention in which a SAW waveguide is provided between an input IDT and a coupler.

In order to lead all the SAW sent out from the input IDT to the coupler 3 so as to prevent increase in the insertion loss, it is preferable to form the surface acoustic wave waveguide (SAW waveguide 110) as shown in FIG. 37.

As shown in FIG. 37, the SAW waveguide 110 may be formed between the input IDT 1 and the coupler 3 within a space on the piezoelectric substrate from the vicinity of a right edge of the input IDT 1 to the vicinity of a left edge of the coupler 3.

The shape of the SAW waveguide 110 is preferably such that the SAW sent out from the input IDT 1 is all led to the coupler. For example, its shape may be a parallelogram as shown in FIG. 37. The length 110' of a side of this parallelogram is, for example, equal to the length of the input IDT 1 in a longitudinal direction.

Further, the SAW waveguide 110 is not required to be limited to this parallelogram but may be in an optional shape. For example, the SAW waveguide 110 may be in a shape having a bending point in a part thereof as described later. Furthermore, upper and lower peripheral sides defining the waveguide are not necessarily linear but may be curved.

The SAW waveguide 110 is provided by forming a metal film or an insulating film in a certain configuration on the piezoelectric substrate.

Figure 38:
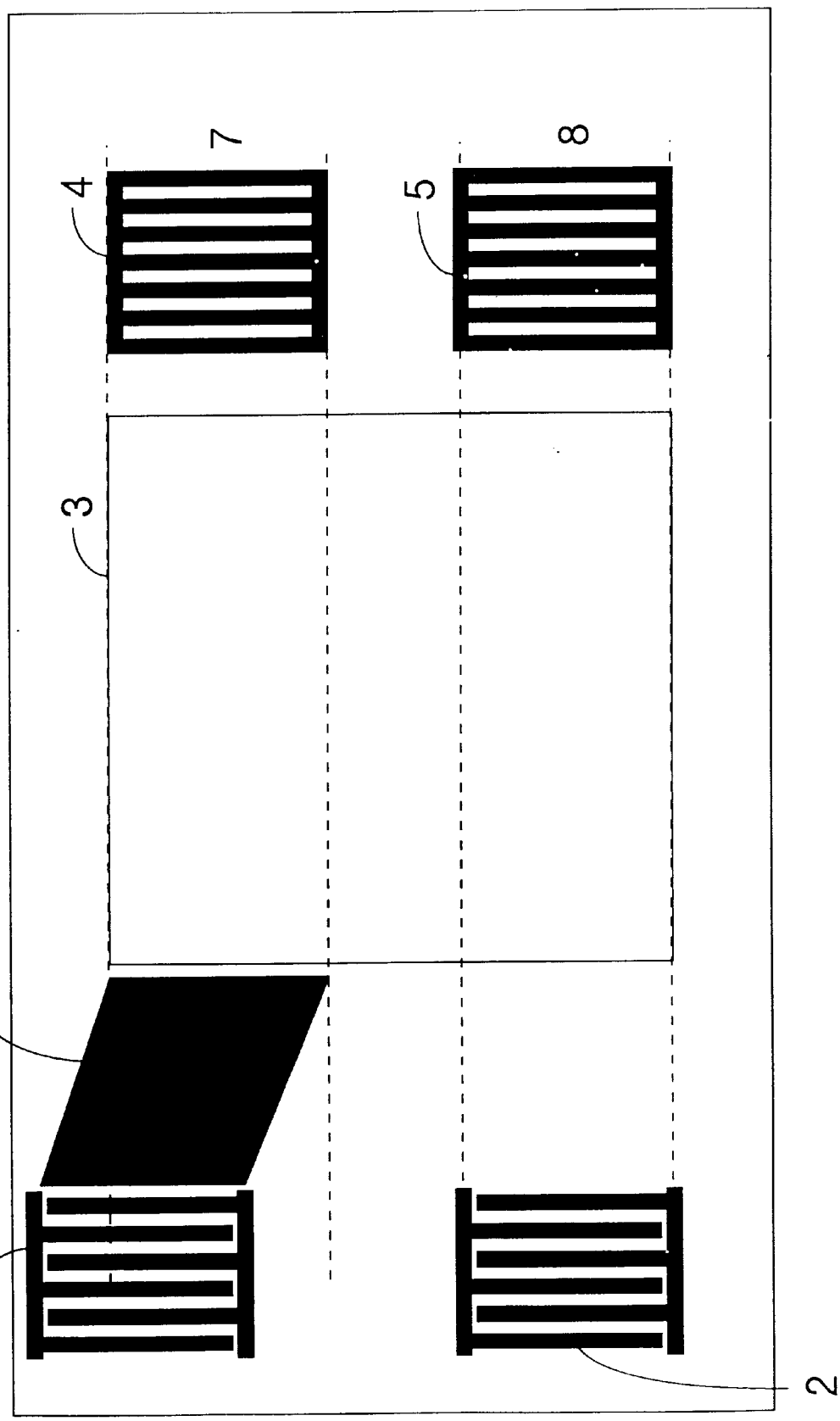
FIG. 38 is a diagram illustrating the construction of an example according to the present invention in which a SAW waveguide is formed of a metal film or an insulating film.
Figure 39:
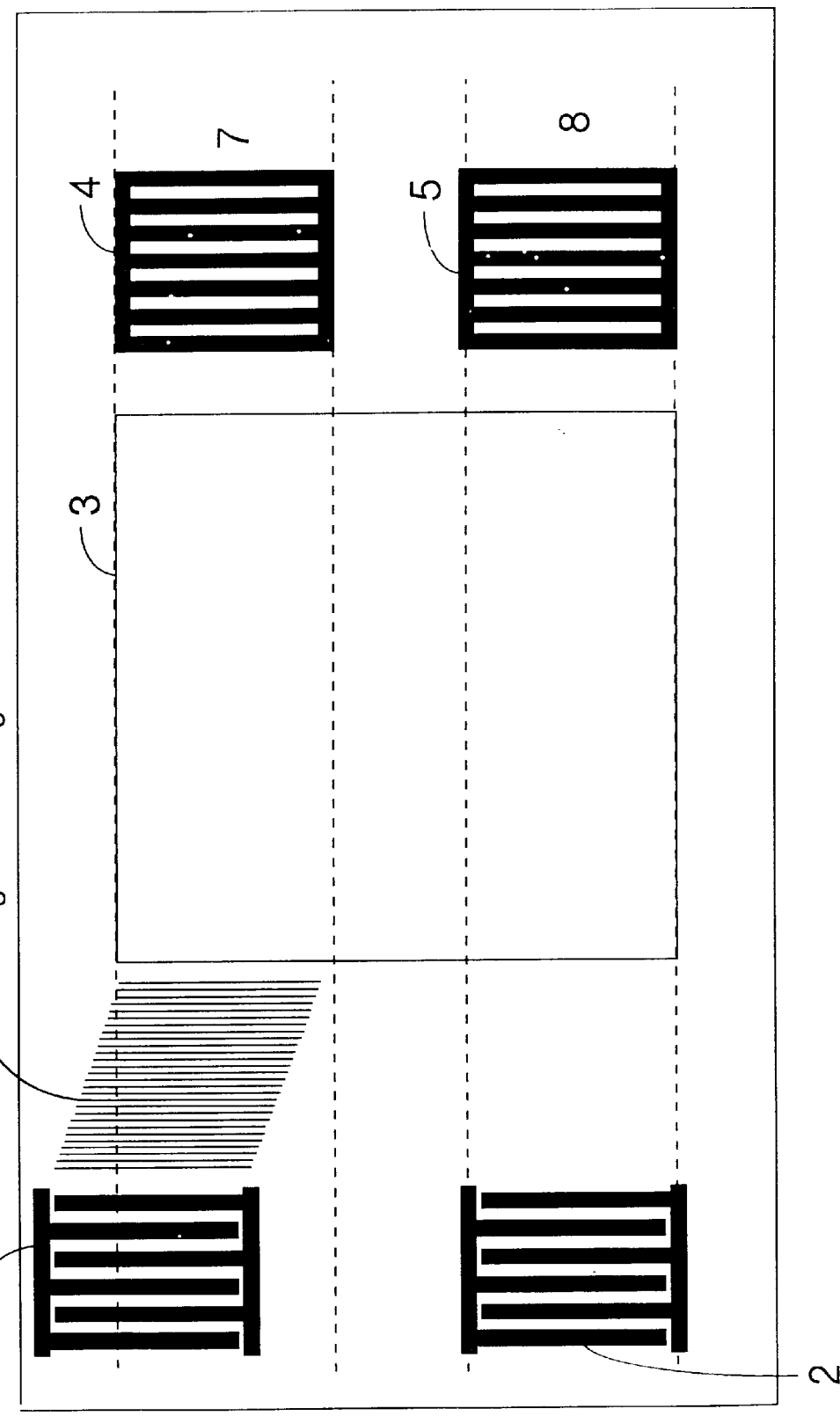
FIG. 39 is a diagram illustrating the construction of an example according to the present invention in which a SAW waveguide is formed of a grating of a metal film or an insulating film.

It is noted that, for the SAW waveguide 110, since it should be such that the velocity of the SAW is lower therein than in surroundings, may be used not only a metal film having a uniform surface structure but also an insulating film having a uniform surface structure, a metal film having a grating surface structure or an insulating film having a grating surface structure (see FIG. 38 and FIG. 39).

As the metal film, may be used Al, Au, Ag, an Al—Au alloy and the like.

As the insulating film, $SiO_2$ may be used. Of course, the kinds of the metal film and insulating film are not limited to those mentioned here.

In FIG. 37 and others, shown are examples in which the position of the input IDT is shifted off and the SAW waveguide is formed between the input IDT and the coupler, but alternatively, the position of the output IDT may be shifted off and the SAW waveguide may be formed between the output IDT and the coupler. In other word, the SAW waveguide may be formed between the aforementioned offset IDT and the coupler.

Figure 40:
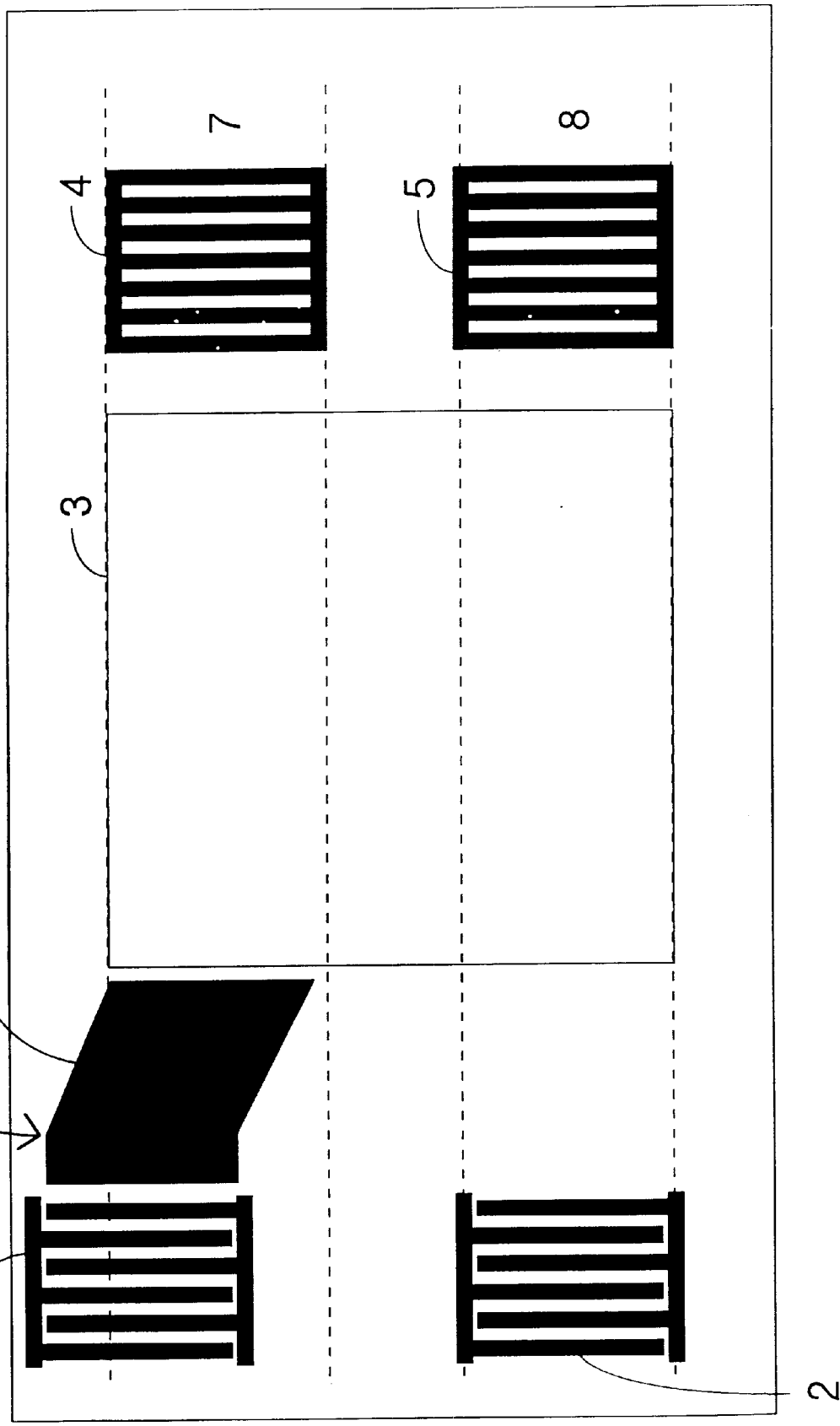
FIG. 40 is a diagram illustrating the construction of an example according to the present invention in which a SAW waveguide having a bending point is provided between an input IDT and a coupler.

FIG. 40 is a diagram illustrating the construction of an example of a surface acoustic filter provided with a SAW waveguide 110 having a bending point in part of its shape.

In FIG. 40, a part of the SAW waveguide 110 near the right edge of the input IDT is formed in a direction parallel to the SAW propagation direction (the right and left direction in the figure). A part of the SAW waveguide 110 extending from the bending point toward the coupler 3 is formed as a waveguide in a parallelogramical shape toward the coupler 3.

In the case where the SAW waveguide 110 has the bending point and is in a so-called bent shape as in the example of FIG. 40, the insertion loss of the SAW filter can be further reduced as compared with a case not having the bending point.

Figure 41:
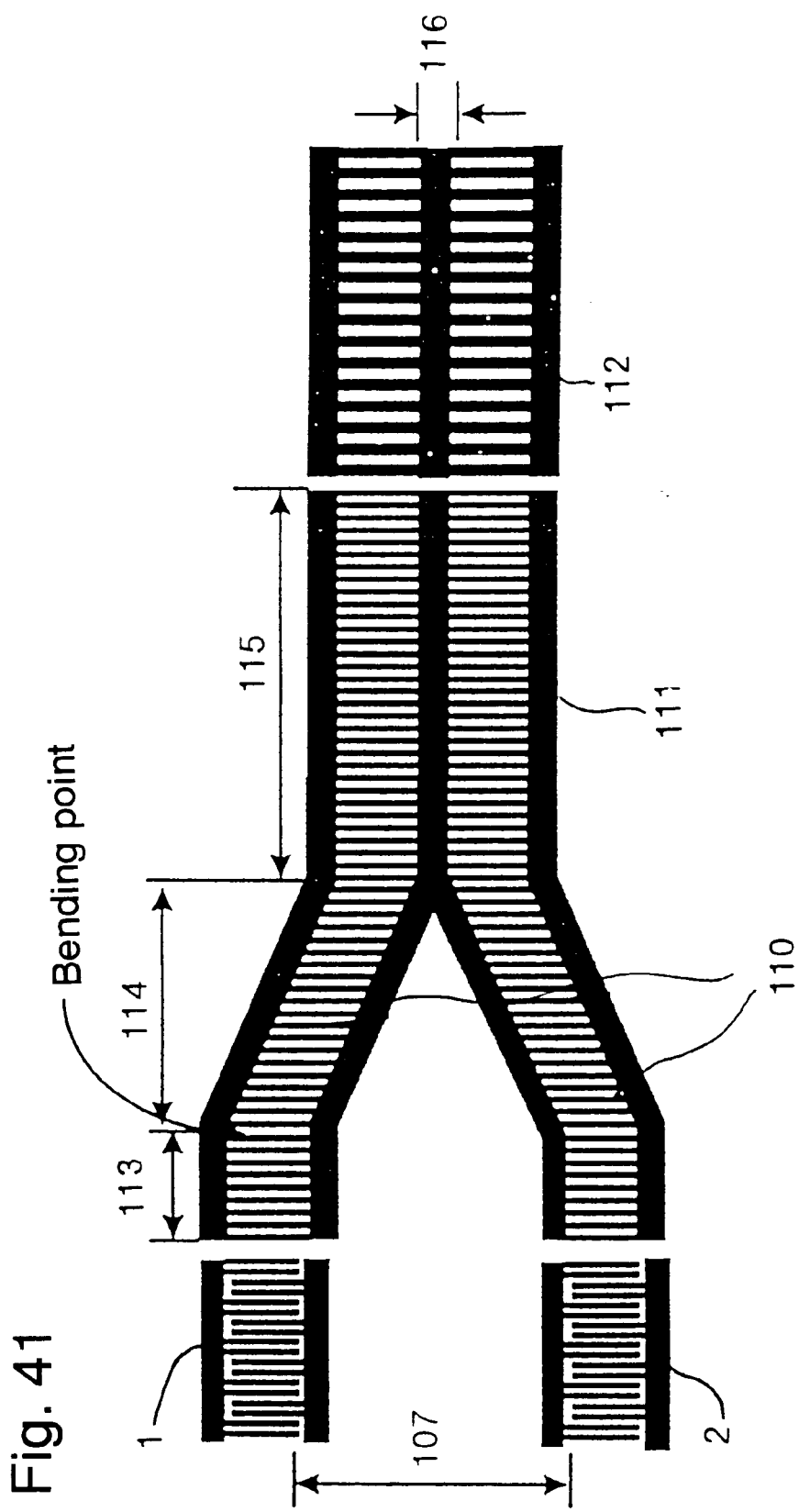
FIG. 41 is a diagram illustrating the construction of an example according to the present invention in which SAW waveguides having a bending point are provided between input and output IDTs and a coupler.

FIG. 41 is a diagram illustrating the detailed construction of an example of a surface acoustic wave filter using SAW waveguides having bending points.

Here, SAW waveguides 110 are formed between an input IDT 1 and a coupler 111 and between an output IDT 2 and the coupler 111.

In FIG. 41, the coupler 111 and the SAW waveguides 110 are joined, but small gaps may be provided between them. In the case where they are joined as in FIG. 41, a portion indicated by reference numeral 115 in FIG. 41 which is parallel to the SAW propagation direction may be regarded as the coupler 111, the bending points may be provided between reference numerals 113 and 114, and portions indicated by the reference numerals 113 and 114 may be regarded as forming a SAW waveguide 110.

In FIG. 41, for example, the distance (reference numeral 107) between the input and output IDTs is 93 $\mu$m, the length of the portion of the reference numeral 113 is 200 μm, the length of the portion of the reference numeral 114 is 500 μm, the length of the portion of the reference numeral 115 is 3.1 mm, and the width reference numeral 116) of a coupling portion of the reflectors 112 is 3 μm.

A 36° Y-X:quartz is used as the piezoelectric substrate, the number of electrode pairs in each of the input and output IDTs is 100, the electrode period is 15 μm, the film thickness of Al electrodes is 0.21 μm, and the width of IDT electrode finger crossing is 135 μm. The SAW waveguide 110 is formed of a grating of an Al film. The grating period is 11.4 μm and the width of the waveguide is 142.5 μm. Further, a waveguide-directional coupler is used as a coupler 111. The waveguide of the waveguide-directional coupler 111 is also formed of a grating of an Al film. The grating period is 11.4 μm, the width of the waveguide is 142.5 μm and the coupling length is 3.1 mm.

Figure 42:
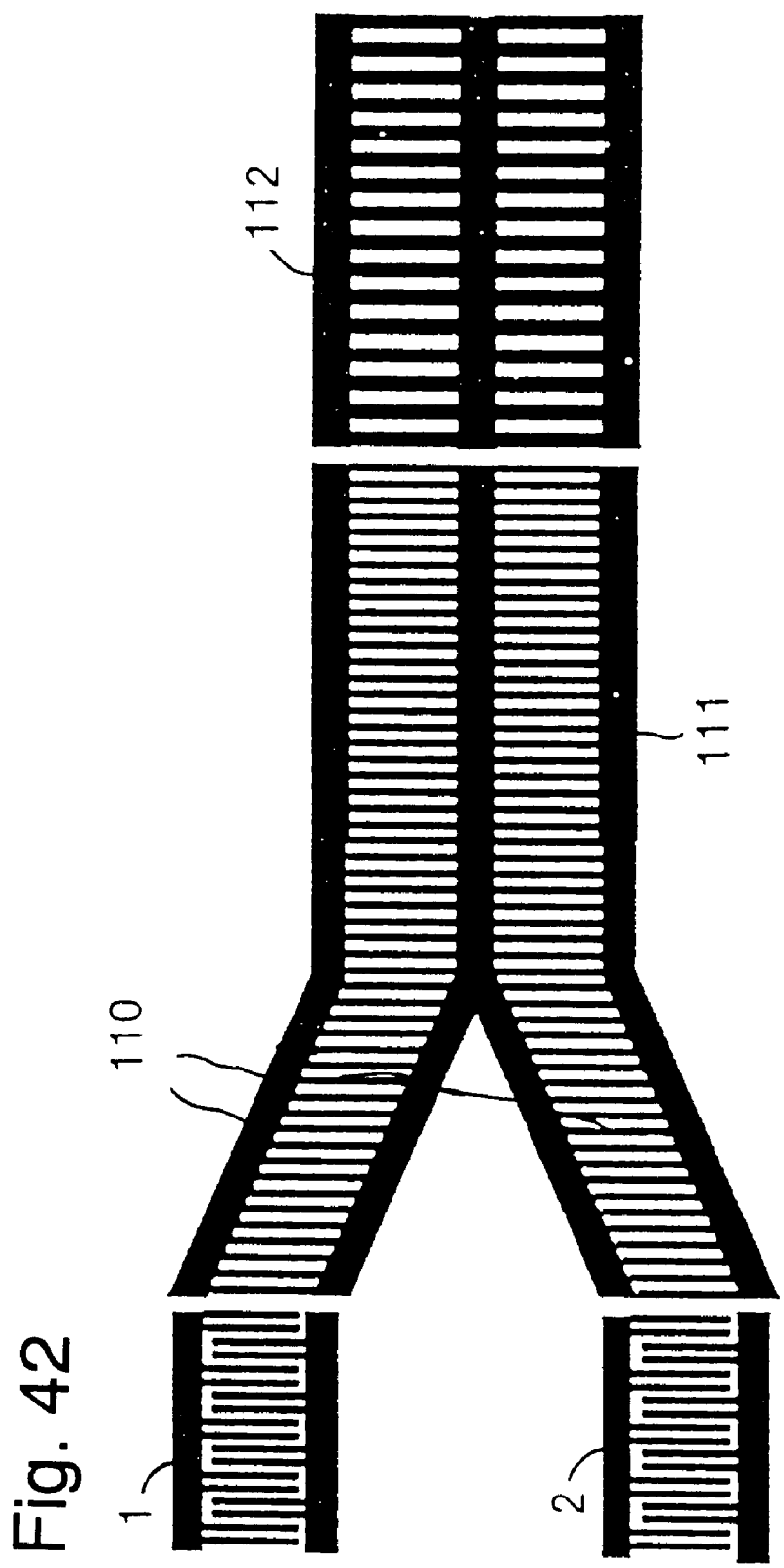
FIG. 42 is a diagram illustrating the construction of an example according to the present invention in which SAW waveguides are provided between input and output IDTs and a coupler.

For comparison with FIG. 41, FIG. 42 shows a surface acoustic wave filter provided with SAW waveguides 110 without bending points between the input and output IDTs and the coupler 111.

In FIG. 42, the setting conditions such as the electrode period, the width of the waveguides and the like are the same as in FIG. 41. At this time, the insertion loss of the surface acoustic wave filter of FIG. 41 having the bending points is 39.51 dB and the insertion loss of the surface acoustic wave filter of FIG. 42 not having the bending points is 39.78 dB. Therefore, it is possible to reduce the insertion loss by proving the bending point within the SAW waveguide.

In addition to the construction of the surface acoustic wave filter of FIG. 41, the input and output IDTs are put out of alignment so that their overlap in the direction perpendicular to the SAW propagation direction is shortened. That further enlarges the distance between the input and output IDTs and suppresses the electrostatic coupling. Thus the isolation between input and output is improved.

Next, shown is an example of a surface acoustic wave filter intended to improve the isolation between input and output and to reduce loss.

Figure 43:
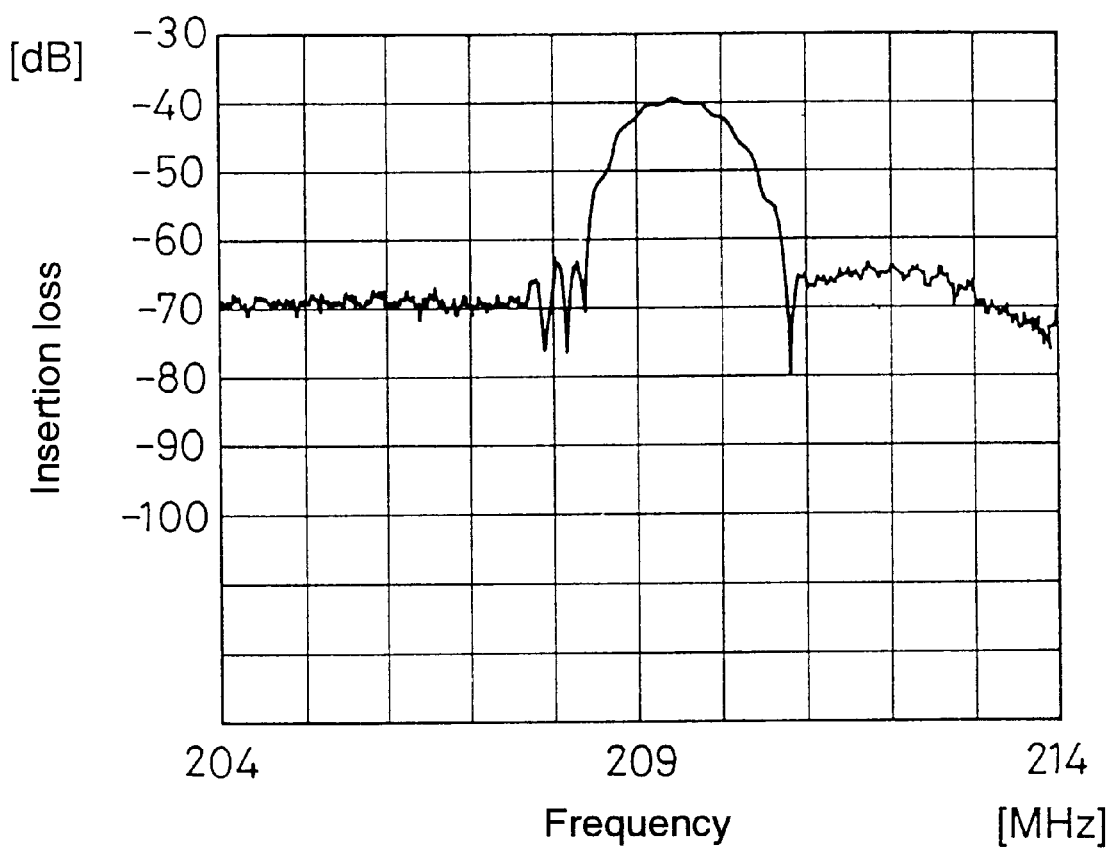
FIG. 43 is a graphical representation of the frequency characteristic of the surface acoustic wave filter of the present invention illustrated in FIG. 41.

First, explanation is given of the characteristics of the surface acoustic wave filter as described above and shown in FIG. 41 according to the present invention. FIG. 43 shows a graphical representation of the insertion loss-frequency characteristic of the surface acoustic wave filter of FIG. 41. In this figure, the degree of suppression out of the passband, i.e., the insertion loss, is about 70 dB.

Figure 44:
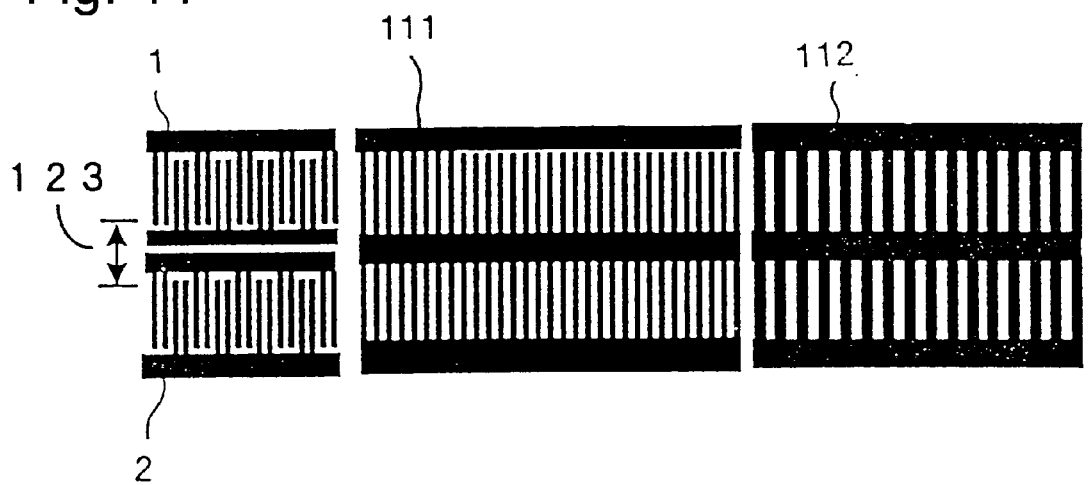
FIG. 44 is a diagram illustrating the construction of an surface acoustic wave filter which is not provided with a SAW waveguide.

For comparison with this, produced is a surface acoustic wave filter in which the structural centers of the input and output IDTs and the structural center of the reflector are in alignment in the direction perpendicular to the SAW propagation direction, as shown in FIG. 44. Here the distance (reference numeral 123) between the input and output IDTs in the direction perpendicular to the SAW propagation direction is 10.5 μm.

Figure 45:
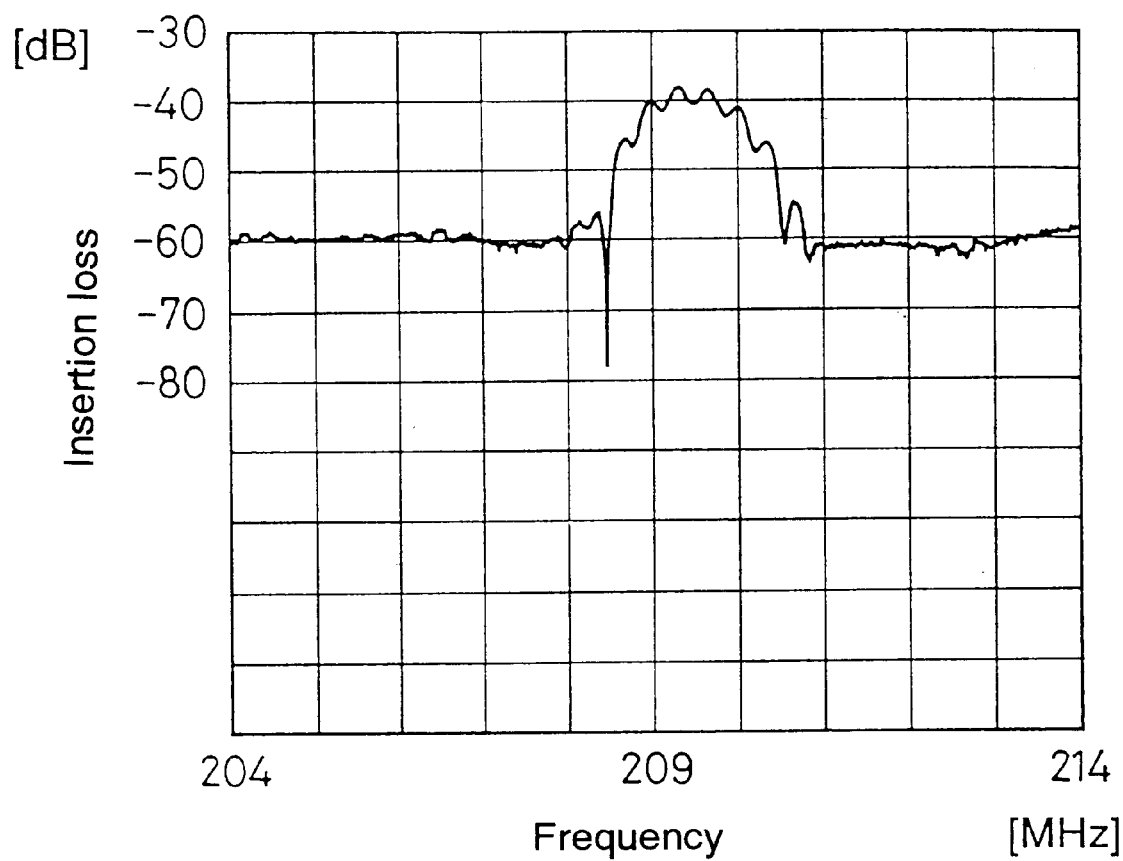
FIG. 45 is a graphical representation of the frequency characteristic of the surface acoustic wave filter illustrated in FIG. 44.

FIG. 45 shows a graphical representation of the insertion loss—frequency characteristic of the surface acoustic wave filter of FIG. 44.

The surface acoustic wave filters illustrated in FIG. 42 and FIG. 44 are different only in the presence or absence of the SAW waveguide and are the same in settings such as the electrode period of the IDTs and the like.

The comparison of FIG. 43 with FIG. 45 shows that the degree of suppression out of the passband is improved by about 10 dB with the filter as shown in FIG. 43 which has the SAW waveguide and in which the distance between the input and output IDTs is enlarged.

That is, it is confirmed that the degree of suppression out of the passband (insertion loss) can be improved by length-ening the distance 107 between the input and output IDTs in the direction perpendicular to the SAW propagation direction as shown in FIG. 41.

Next, it is shown that the formation of the SAW waveguides between the input and output IDTs and the coupler can suppress increase in the loss when the structural center of the electrode finger crossing portion of the IDT and the structural center of the electrode finger portion of the reflector are not aligned as shown in FIG. 41.

For accurate comparison of the insertion loss of the surface acoustic wave filter of FIG. 41 and that of the surface acoustic wave filter of FIG. 44, it is necessary to obtain their frequency characteristics from which a direct feed-through wave component between the input and output IDTs has been removed by a gating process and execute comparison about them.

Figure 46:
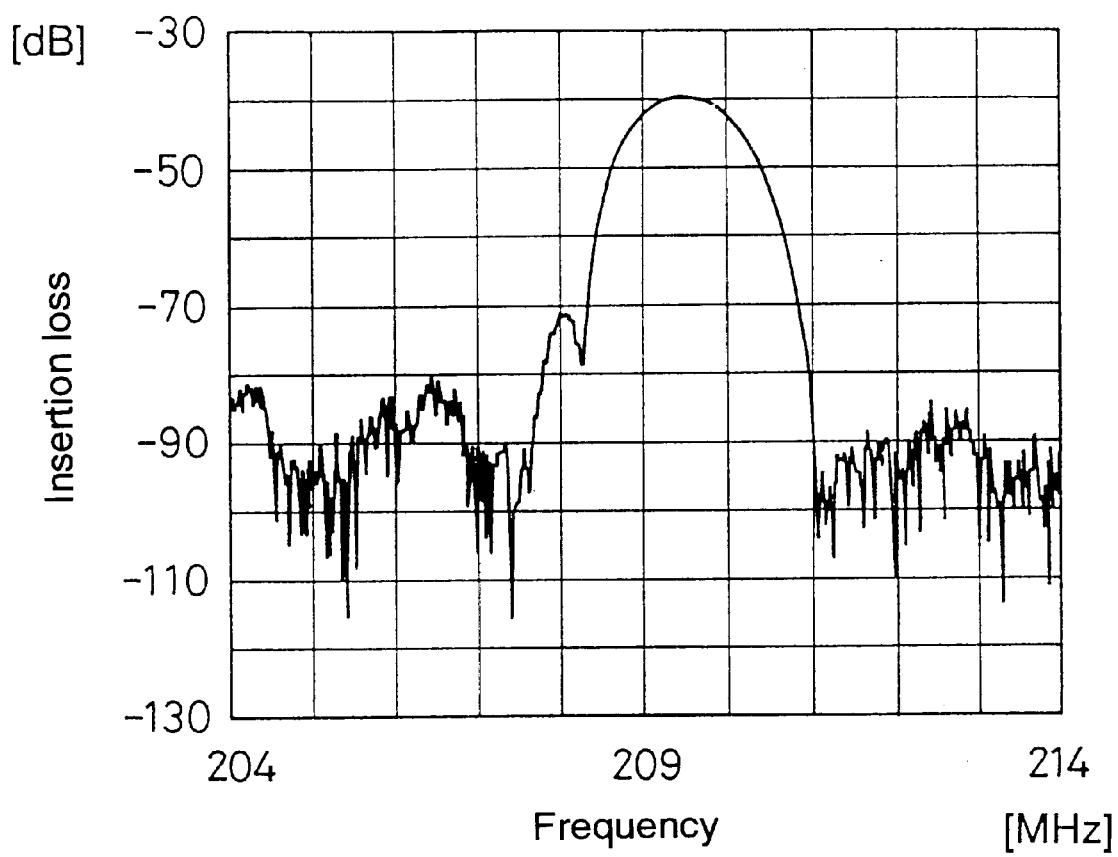
FIG. 46 is a graphical representation of the frequency characteristic of a surface acoustic wave filter according to the present invention as obtained by removing a direct feed-through wave component from FIG. 43.
Figure 47:
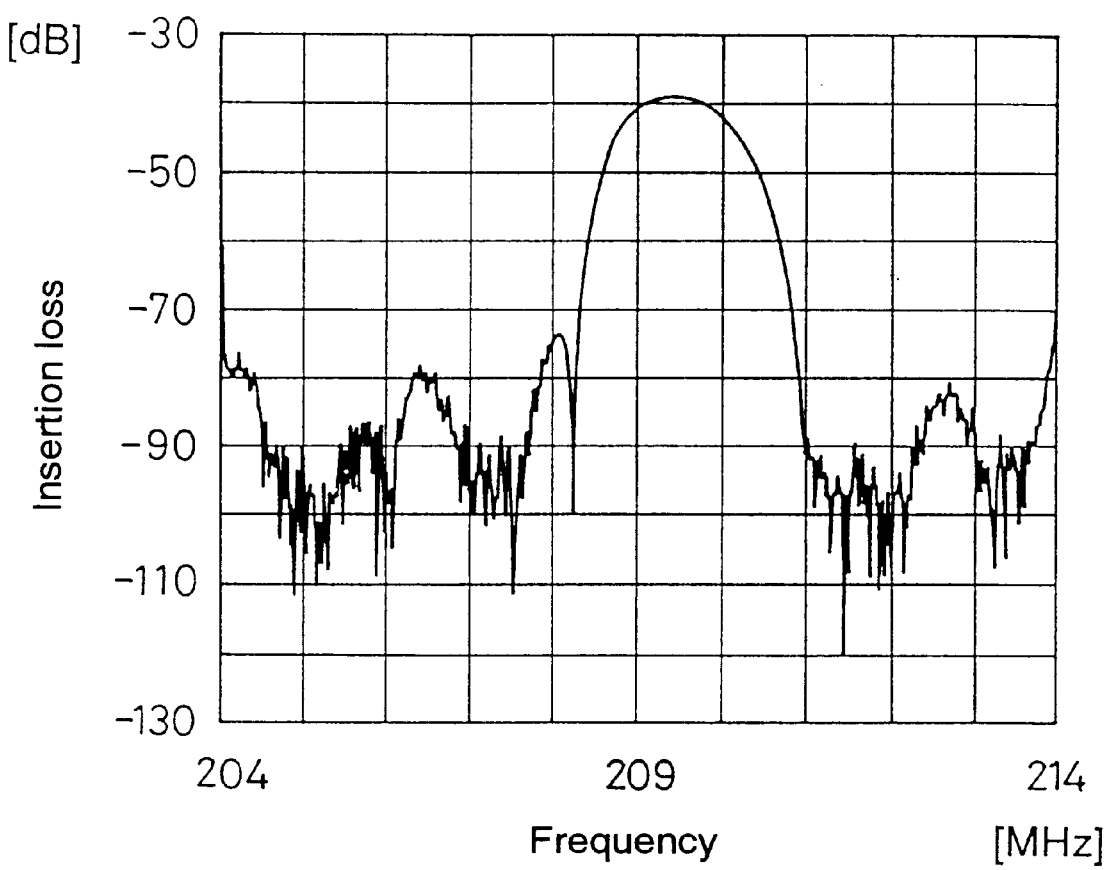
FIG. 47 is a graphical representation of the frequency characteristic of a surface acoustic wave filter according to the present invention as obtained by removing the direct feed-through wave component from FIG. 45.

FIG. 46 shows a graphical representation of a frequency characteristic obtained by removing the direct feed-through wave component from the characteristic of FIG. 43 by gating, and FIG. 47 shows a graphical representation of a frequency characteristic obtained by removing the direct feed-through wave component from the characteristic of FIG. 45 by gating. The insertion loss within the passband is −39.51 dB in FIG. 46 and −39.29 dB in FIG. 47. The difference is only 0.21 dB.

This shows that the provision of the waveguides between the input and output IDTs and the coupler can render the loss equal to that of the surface acoustic wave filter of FIG. 44 and suppress increase in the loss.

Figure 48:
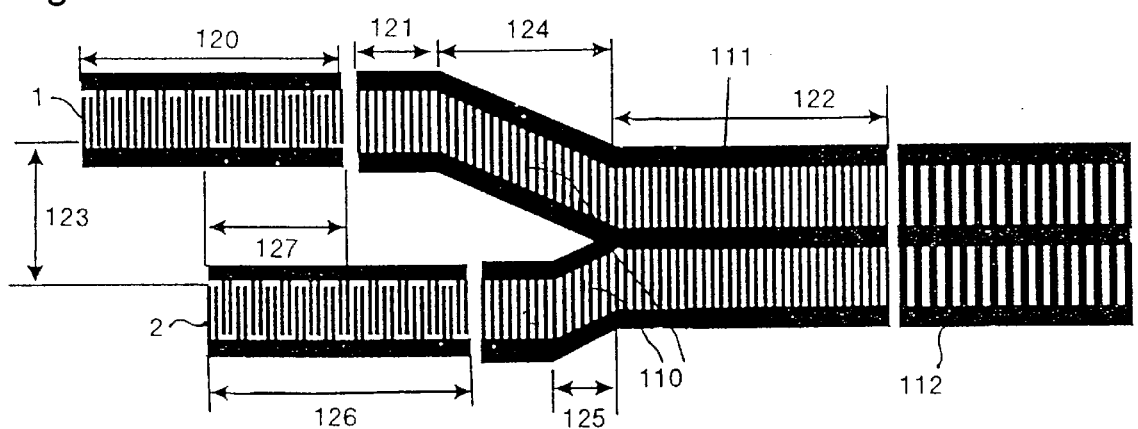
FIG. 48 is a diagram illustrating the construction of an example according to the present invention in which SAW waveguides having a bending point are provided between input and output IDTs and a coupler and the positions of the input and output IDTs are shifted.

FIG. 48 shows a diagram illustrating the construction of an example of an surface acoustic wave filter according to the present invention in which the positional relation of the SAW propagation directions in the input and output IDTs is shifted.

In FIG. 48, the electrode period of the input and output IDTs 1 and 2 is 15 μm, the number of electrode pairs are 95 for each, and the film thickness of Al electrodes is 0.21 μm. A waveguide-directional coupler 111 is used as the coupler, and the waveguide section is formed of a grating of an Al film. The grating period is 11.4 μm and the coupling length (reference numeral 122) is 3.1 mm.

A grating of an Al film is also used for the waveguides 110 between the input and output IDTs and the coupler. The length of the waveguide between the input IDT 1 and the coupler 111 is different from that of the waveguide between the output IDT 2 and the coupler 111 as shown in the figure. The distance between the input and output IDTs in the direction perpendicular to the SAW propagation direction (reference numeral 123) is 78 μm.

In FIG. 48, the length of the input IDT (reference numeral 120) is 1431 μm; the length of the output IDT (reference numeral 126) is 1431 μm; the length of the crossing portion of the input and output IDTs (reference numeral 127) is 633 μm; the length of a portion of the SAW waveguide indicated by reference numeral 121 is 200 μm; the length of a portion indicated by reference numeral 124 is 998 μm; and the length of a portion of the SAW waveguide indicated by reference numeral 125 is 200 μm. That means the overlap of the input IDT and the output IDT is 633 μm in length, which is shorter than the IDT length, 1431 μm.

Figure 49:
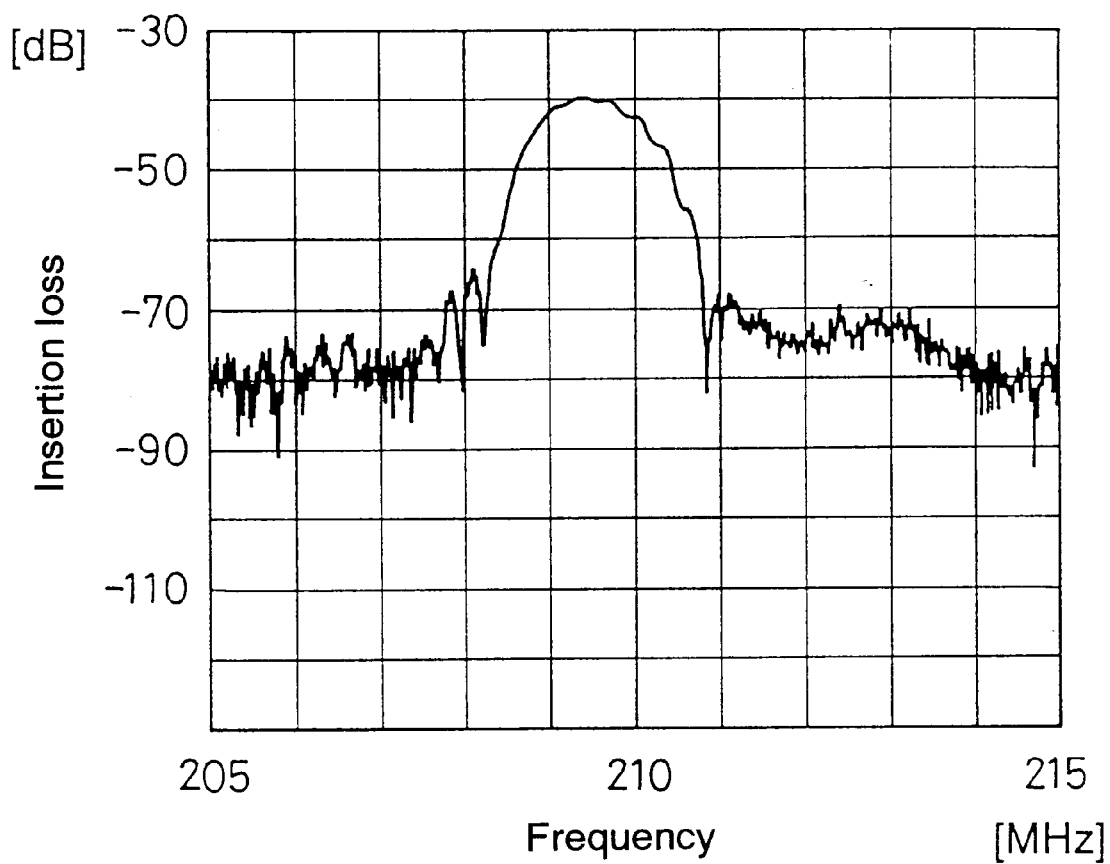
FIG. 49 is a graphical representation of the frequency characteristic of the surface acoustic wave filter according to the present invention illustrated in FIG. 48.

FIG. 49 shows the filter characteristics of the surface acoustic wave filter of FIG. 48. This filter of FIG. 48 is compared with a surface acoustic wave filter having the construction of FIG. 41 with regard to their characteristics. Here, in FIG. 41, the distance between the input and output IDTs (reference numeral 107) is supposed to be 153 μm, the total waveguide length (i.e., the sum of the lengths indicated by reference numerals 113 and 114) between the input and output IDTs and the coupler 115 is supposed to be 1.2 mm.

Figure 50:
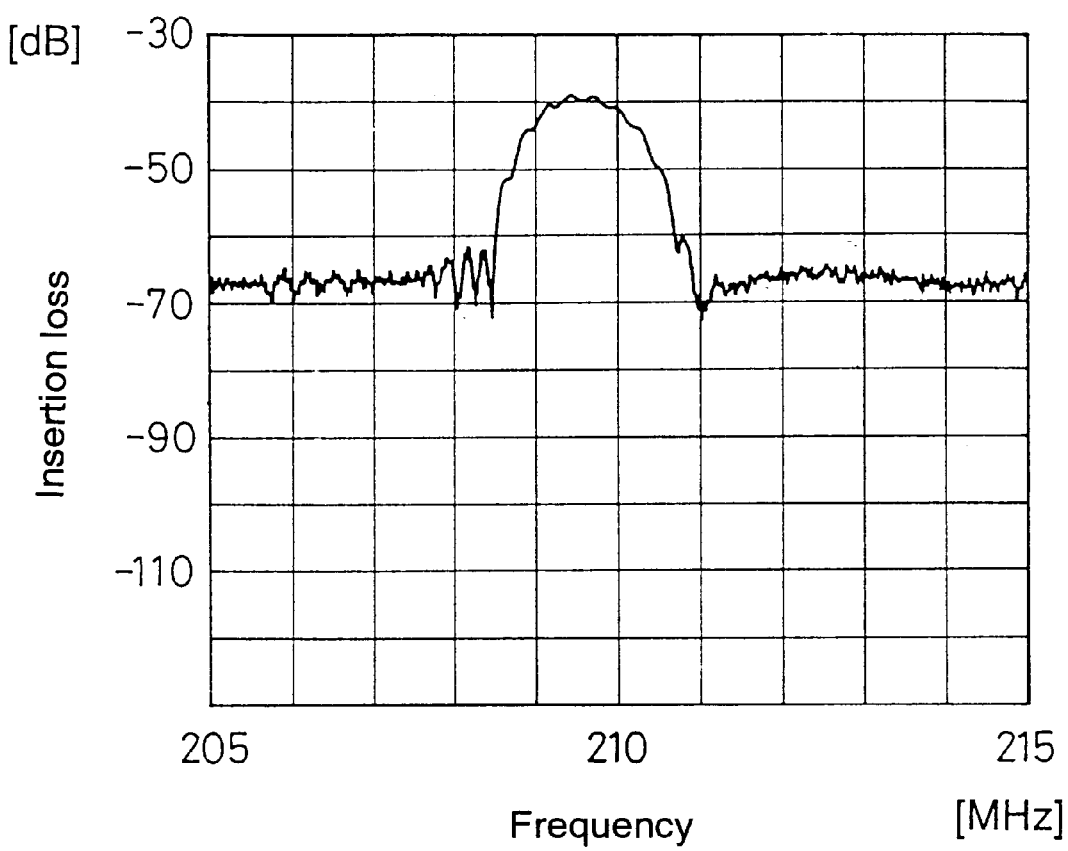
FIG. 50 is a graphical representation of the frequency characteristic of a surface acoustic wave filter according to the present invention in which SAW waveguides having a bending point are provided between input and output IDTs and a coupler and the positions of the input and output IDTs are not shifted.

In FIG. 41, the input IDT 1 and the output IDT 2 overlap each other in the SAW propagation direction. Design conditions for the IDTs, waveguide-directional coupler 111 and reflector 112 are the same as those for the filter illustrated in FIG. 48. FIG. 50 shows the characteristics of this filter of FIG. 41. That is, FIG. 50 is a chart showing the filter characteristics of a surface acoustic wave filter according to the present invention in which SAW waveguides having a bending point are provided between the input and output IDTs and the coupler and the positions of the input and output IDTs are not shifted.

Comparing the characteristics of FIG. 49 and FIG. 50, the degree of suppression out of the passband is larger in FIG. 49. As a result, it is confirmed that the isolation between input and output can be improved by shifting the input and output IDTs in the SAW propagation direction.

Figure 51:
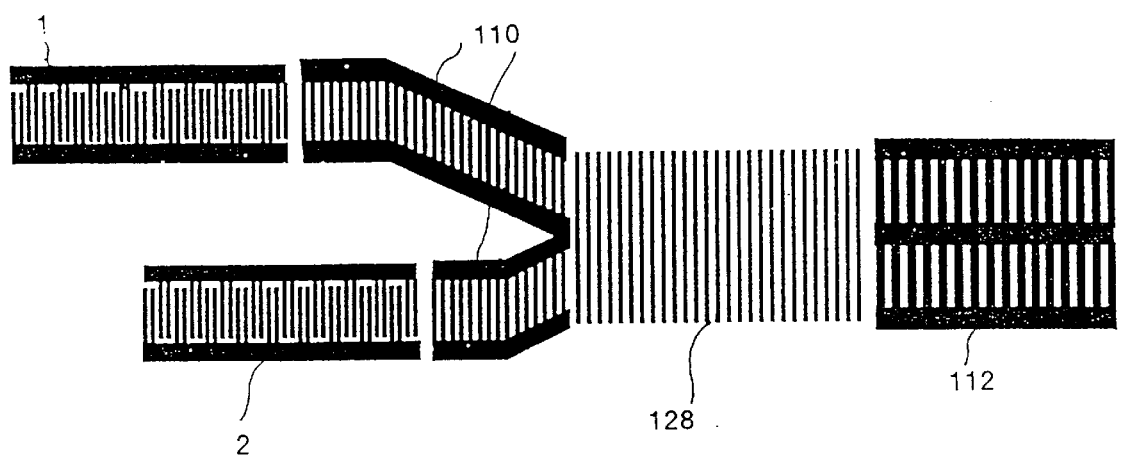
FIG. 51 is a diagram illustrating the construction of a surface acoustic wave filter as illustrated in FIG. 48 of the present invention in which the coupler is a multi-strip coupler.

Further, although the waveguide-directional coupler 111 is used as the coupler in FIG. 48, a multi-strip coupler 128 may also be used as shown in FIG. 51. Furthermore, as regards the waveguide-directional coupler 111, the waveguide section is not necessarily required to be formed of a grating of a metal film but may be formed of a uniform metal film or insulating film.

Next, explanation is given of an example of a surface acoustic wave filter according to the present invention which allows further improvement of the isolation between the input IDT and the output IDT.

Here, the isolation between input and output is improved mainly by providing an earth electrode at a certain position on the piezoelectric substrate or by changing conditions for grounding electrodes of the IDTs.

The electrostatic coupling between the input and output IDTs via the piezoelectric substrate or via the coupler is a major cause of poor isolation between input and output. For improving this, it is effective to increase the distance between the input and output IDTs, to dispose an earth electrode as a shield between the input and output IDTs, to dispose an earth electrode between the input and output IDTs and the coupler, or the like.

Figure 52:
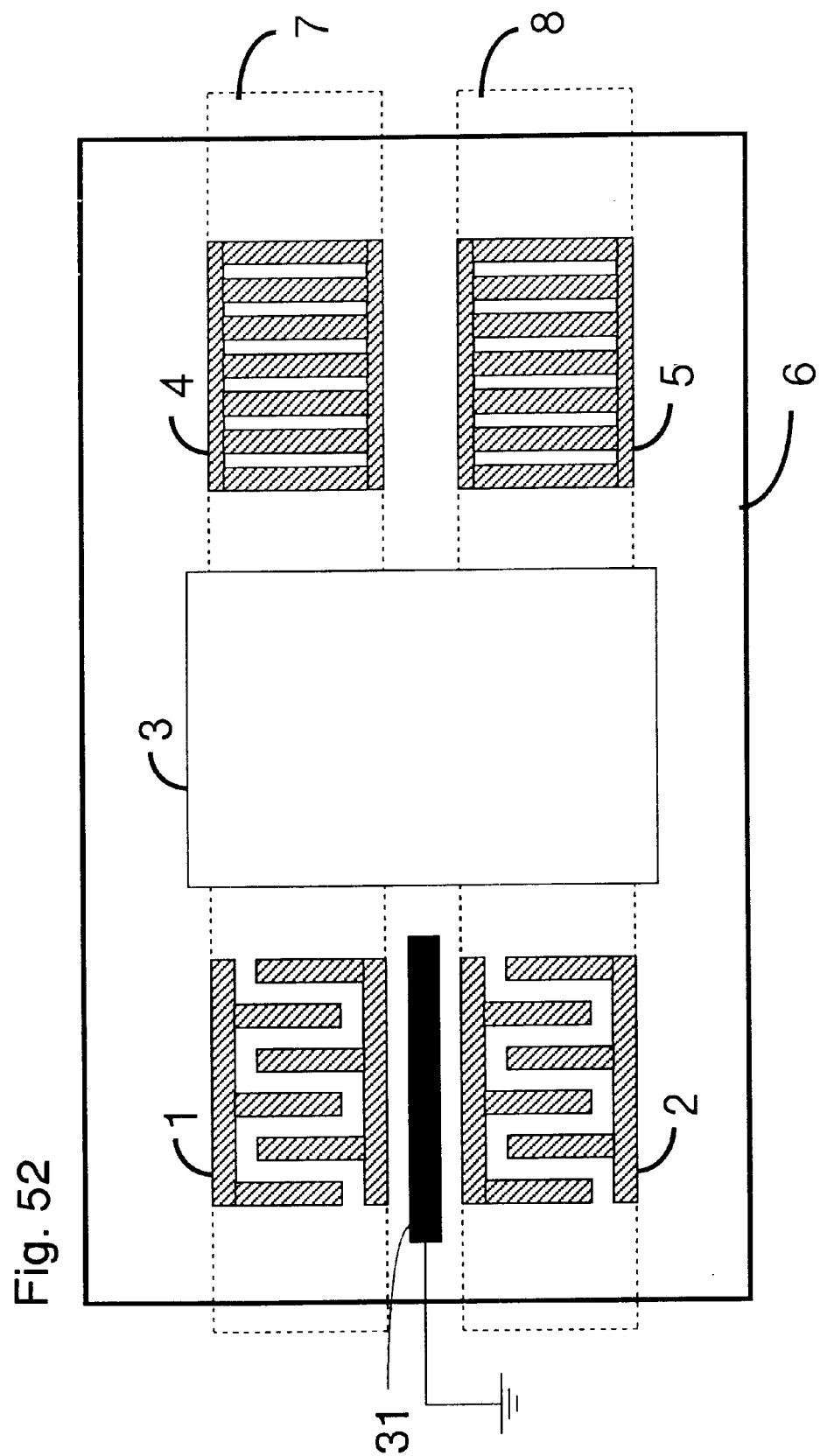
FIG. 52 is a diagram illustrating a general construction of a surface acoustic wave filter according to Example 1 of the present invention.

FIG. 52 shows a diagram illustrating the construction of a surface acoustic wave filter according to the present invention in which an earth electrode is provided. Here, the filter is constructed to have an earth electrode 31 for shielding between the input IDT 1 and the output IDT 2.

Figure 53:
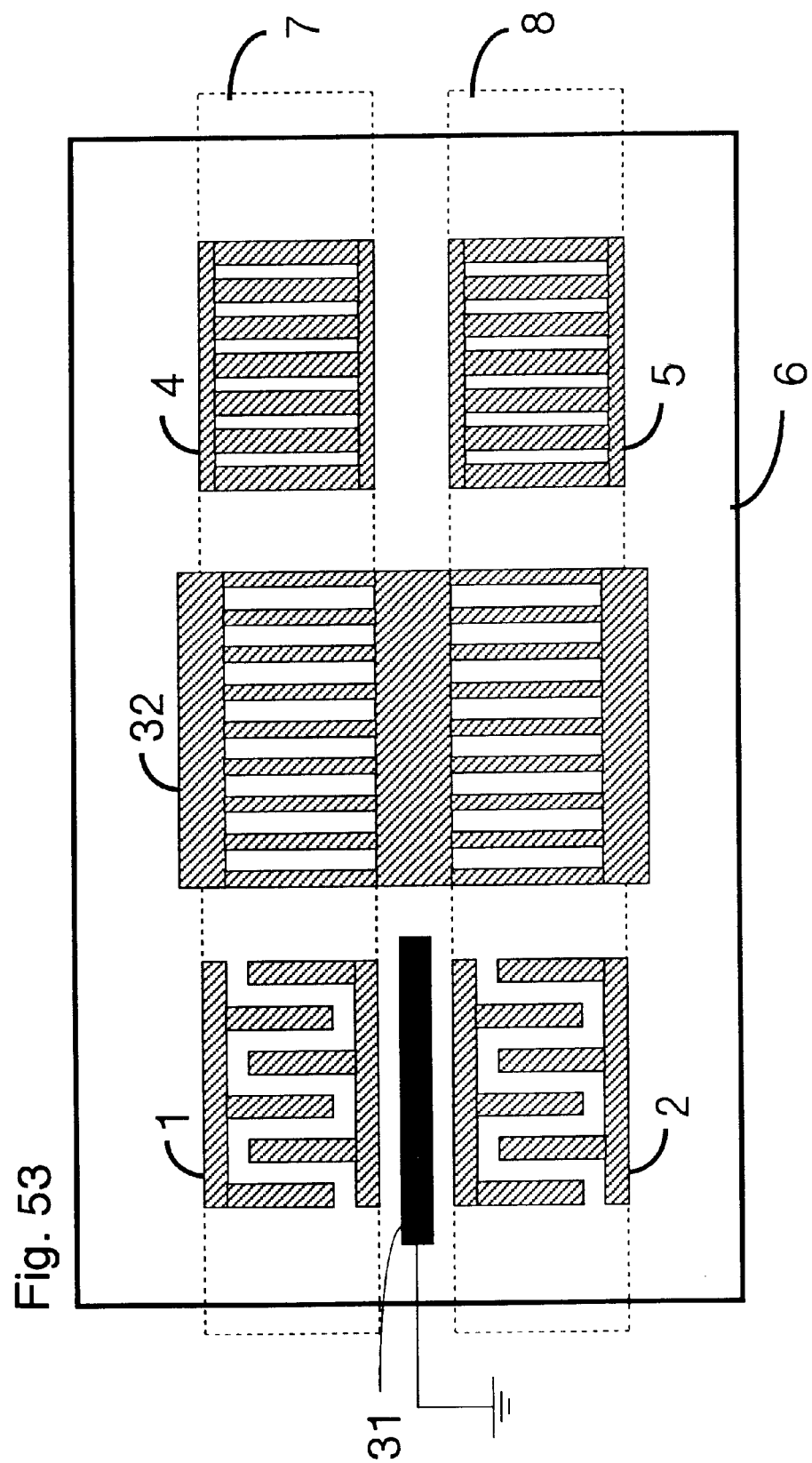
FIG. 53 is a diagram illustrating a general construction of a surface acoustic wave filter according to Example 1 of the present invention.
Figure 54:
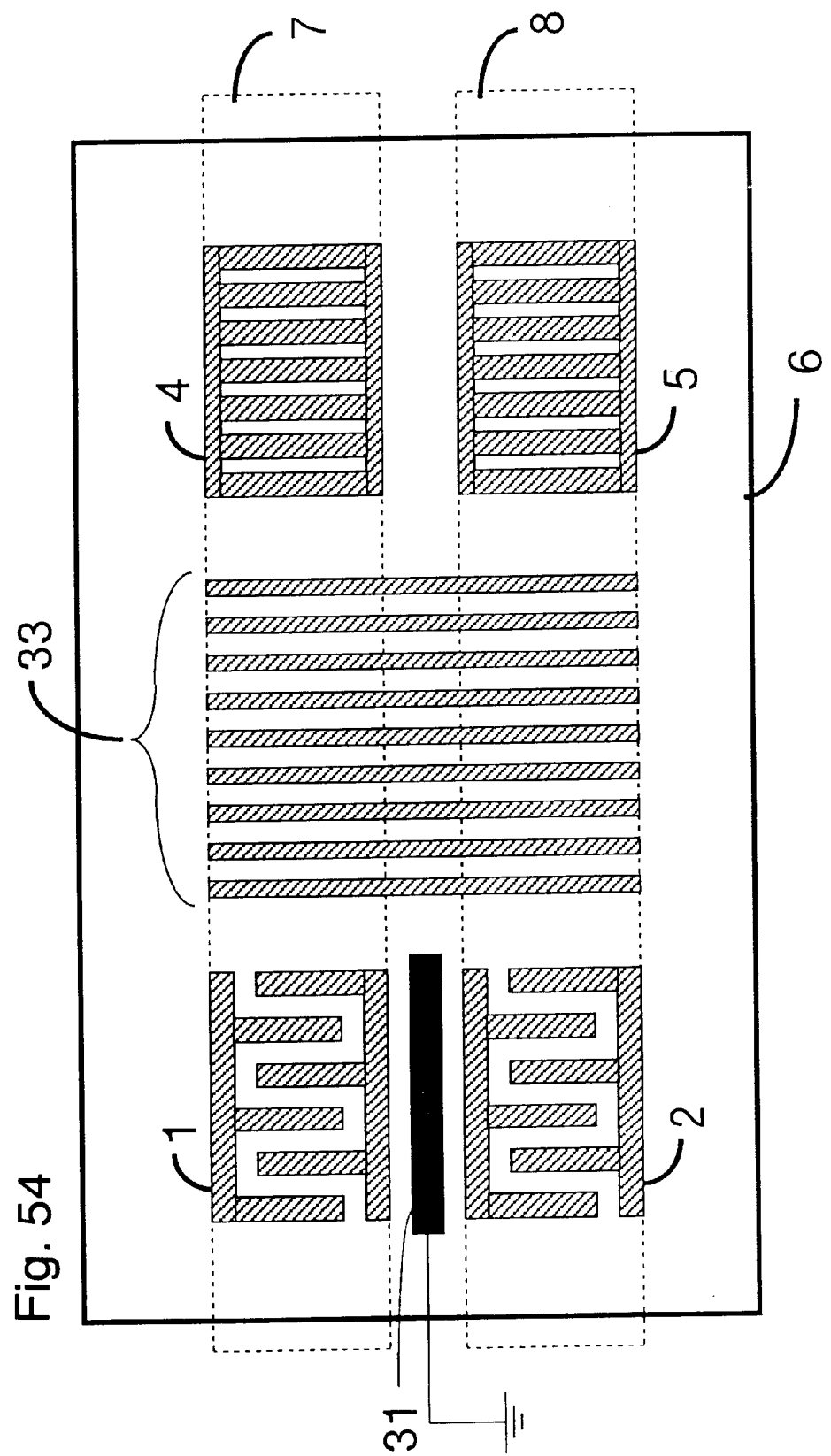
FIG. 54 is a diagram illustrating a general construction of a surface acoustic wave filter according to Example 1 of the present invention.

FIG. 53 and FIG. 54 are diagrams illustrating specific constructions in which the coupler 3 is formed of a waveguide-directional coupler 32 and of a multi-strip coupler 33, respectively. Here, in FIG. 52 and others, the earth electrode 31 is depicted as a rectangle. However, the earth electrode 31 is not required to be rectangular but may be in another shape. Further, the earth electrode 31 does not need to be singular but a plurality of earth electrodes may be disposed between the input and output IDTs.

The disposition of the earth electrode(s) between the input and output IDTs suppress electrostatic coupling between input and output and consequently improve the isolation between input and output.

Figure 55:
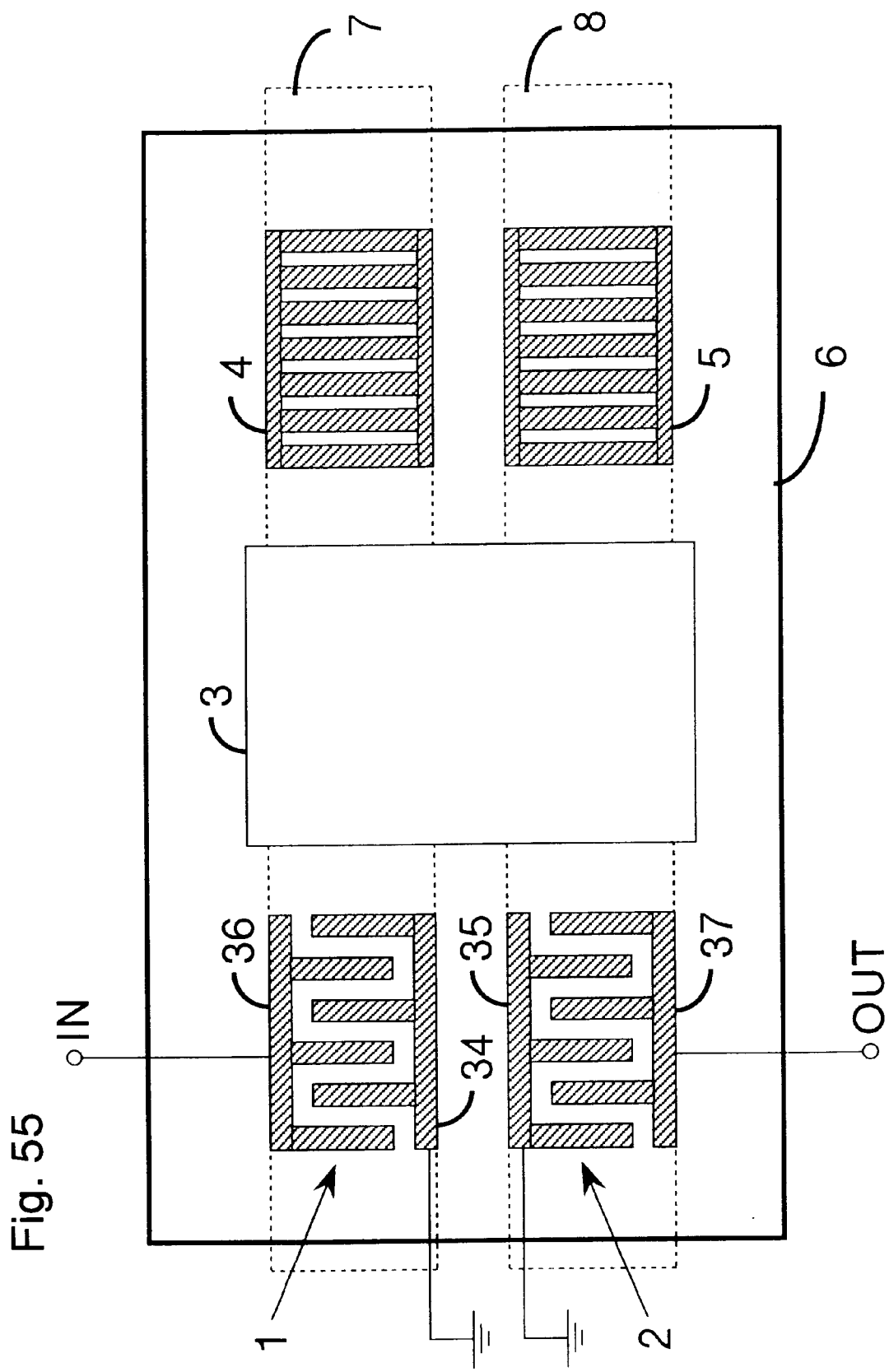
FIG. 55 is a diagram illustrating a general construction of a surface acoustic wave filter according to Example 2 of the present invention.

FIG. 55 shows a diagram illustrating the construction of a surface acoustic wave filter according to the present invention in which bus bars of the IDTs 1 and 2 are grounded. Here, the filter is constructed such that adjacent bus bars 34 and 35 of the input and output IDTs, respectively, are connected to earth. Here the bus bar is a portion of electrodes of an IDT which portion serves as an input terminal or an output terminal for electric signals or a grounding terminal. A portion of comb-shaped electrode fingers at the center of the IDT is referred to as an excitation portion which excites surface acoustic waves. In FIG. 55, the bus bar 36 is an input terminal (IN) and the bus bar 37 is an output terminal (OUT).

By grounding the adjacent bus bars 34 and 35 and using other bus bars 36 and 37 as bus bars for signals, a large distance is provided between input and output signals input and output to the input and output IDTs. Consequently, the electrostatic coupling between input and output is suppressed and the isolation between input and output can be improved.

Figure 56:
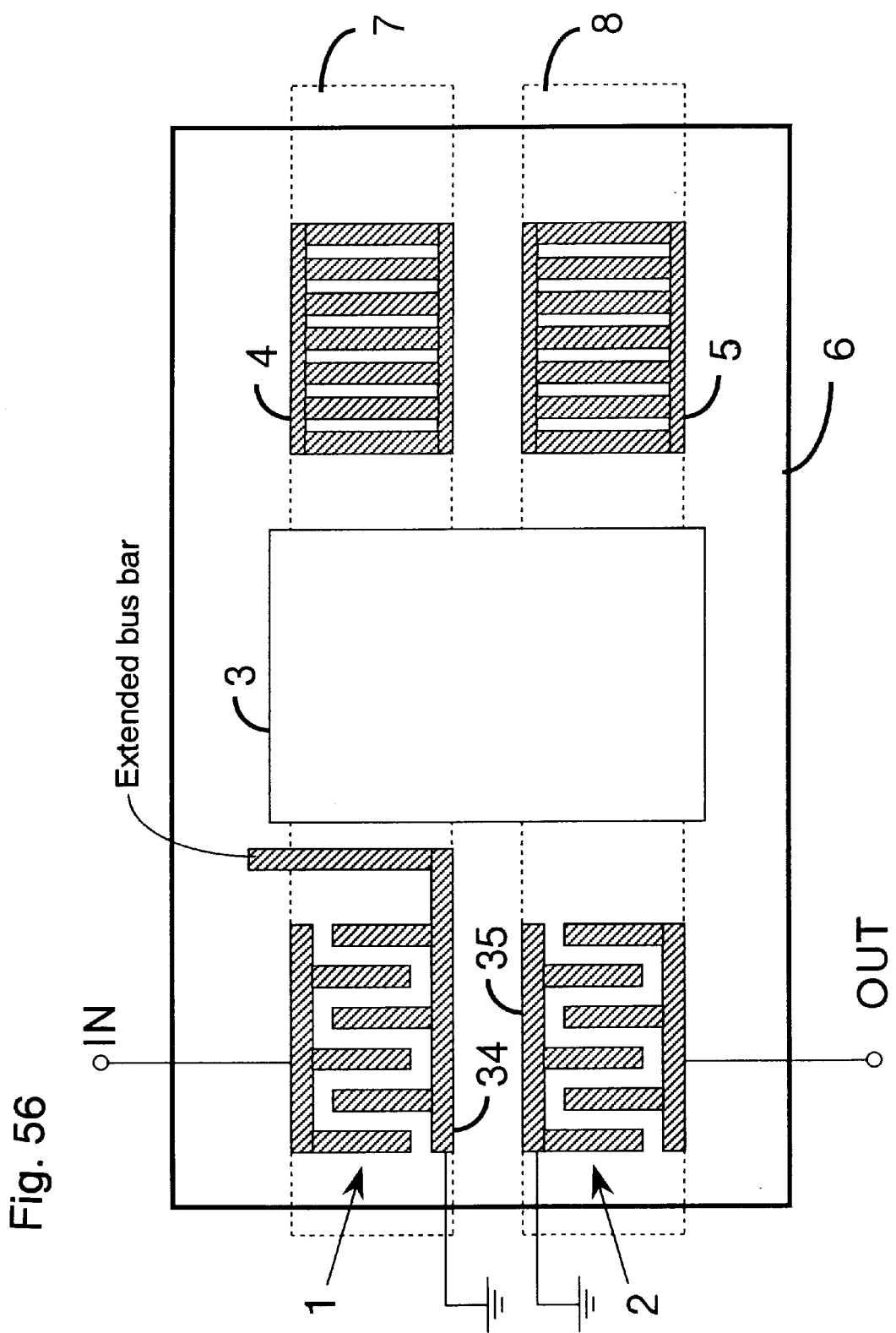
FIG. 56 is a diagram illustrating a general construction of a surface acoustic wave filter according to Example 3 of the present invention.

FIG. 56 shows a diagram illustrating the construction of a surface acoustic wave filter according to the present invention in which a bus bar is extended. Here, the filter is constructed such that at least one of the grounded bus bars of the input and output IDTs is extended to pass between the IDT and the coupler 3. In FIG. 56, the bus bar 34 is extended.

Figure 57:
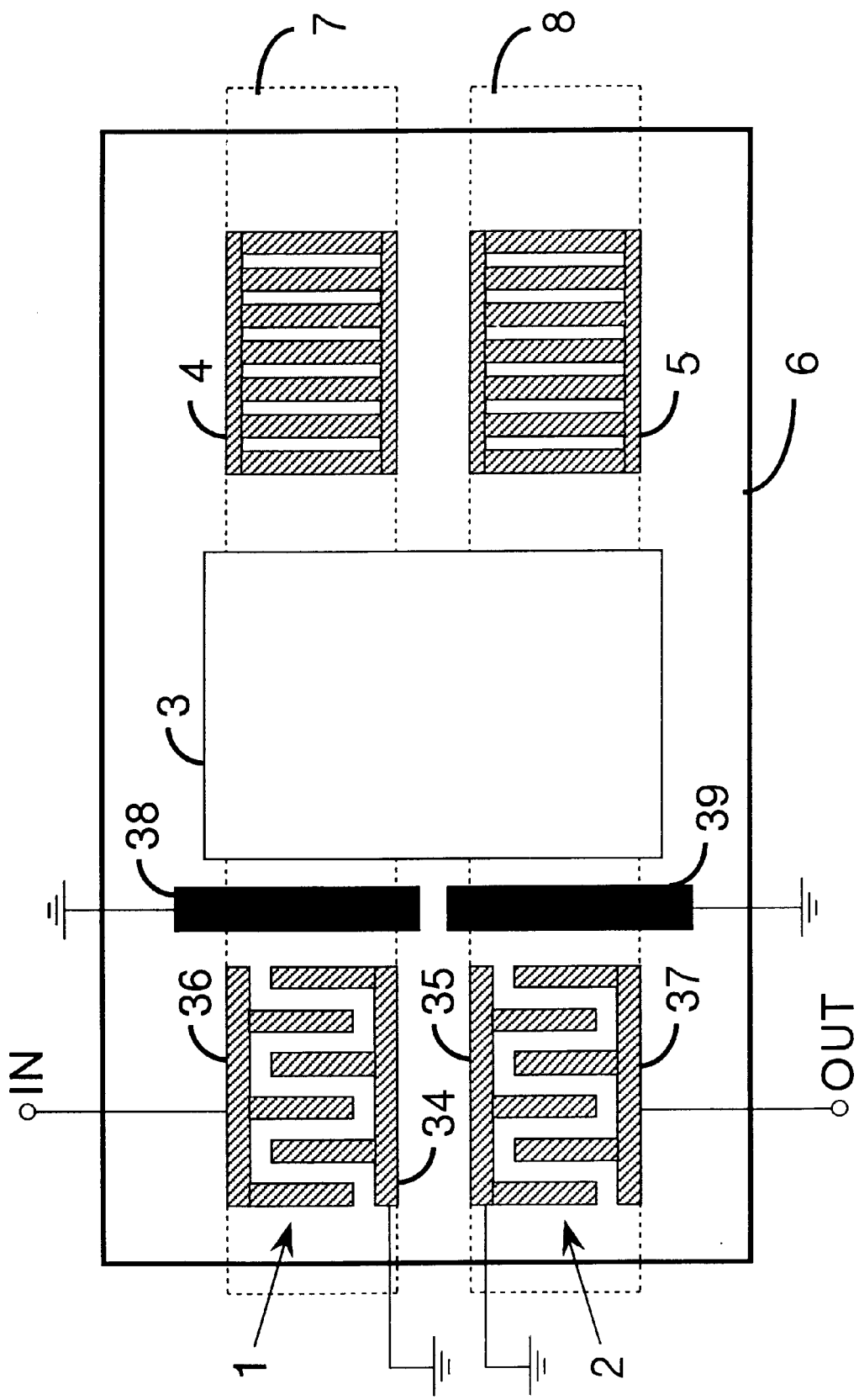
FIG. 57 is a diagram illustrating a general construction of a surface acoustic wave filter according to Example 4 of the present invention.

The grounded bus bar 34 of the input IDT 1, passing between the input IDT 1 and the coupler 3, functions as a shield electrode between the input IDT 1 and the coupler 3. Here, the grounded bus bar 35 of the output IDT may be extended between the output IDT 2 and the coupler 3. Consequently, the electrostatic coupling between the input and output IDTs via the coupler 3 is suppressed and the isolation between input and output can be improved. FIG. 57 shows a diagram illustrating the construction of a surface acoustic wave filter according to the present invention in which an earth electrode is provided. Here, the filter is constructed such that earth electrodes 38 and 39 for shielding are disposed between the input and output IDTs and the coupler 3. In FIG. 57, the earth electrode 38 and 39 are disposed separately between the input IDT 1 and the coupler 3 and between the output IDT 2 and the coupler 3, respectively. However, these earth electrodes may be constructed to be a unity.

The disposition of the earth electrodes 38 and 39 for shielding between the IDTs 1, 2 and the coupler 3 suppresses the electrostatic coupling between the input and output IDTs via the coupler and the isolation between input and output can be improved.

Figure 58:
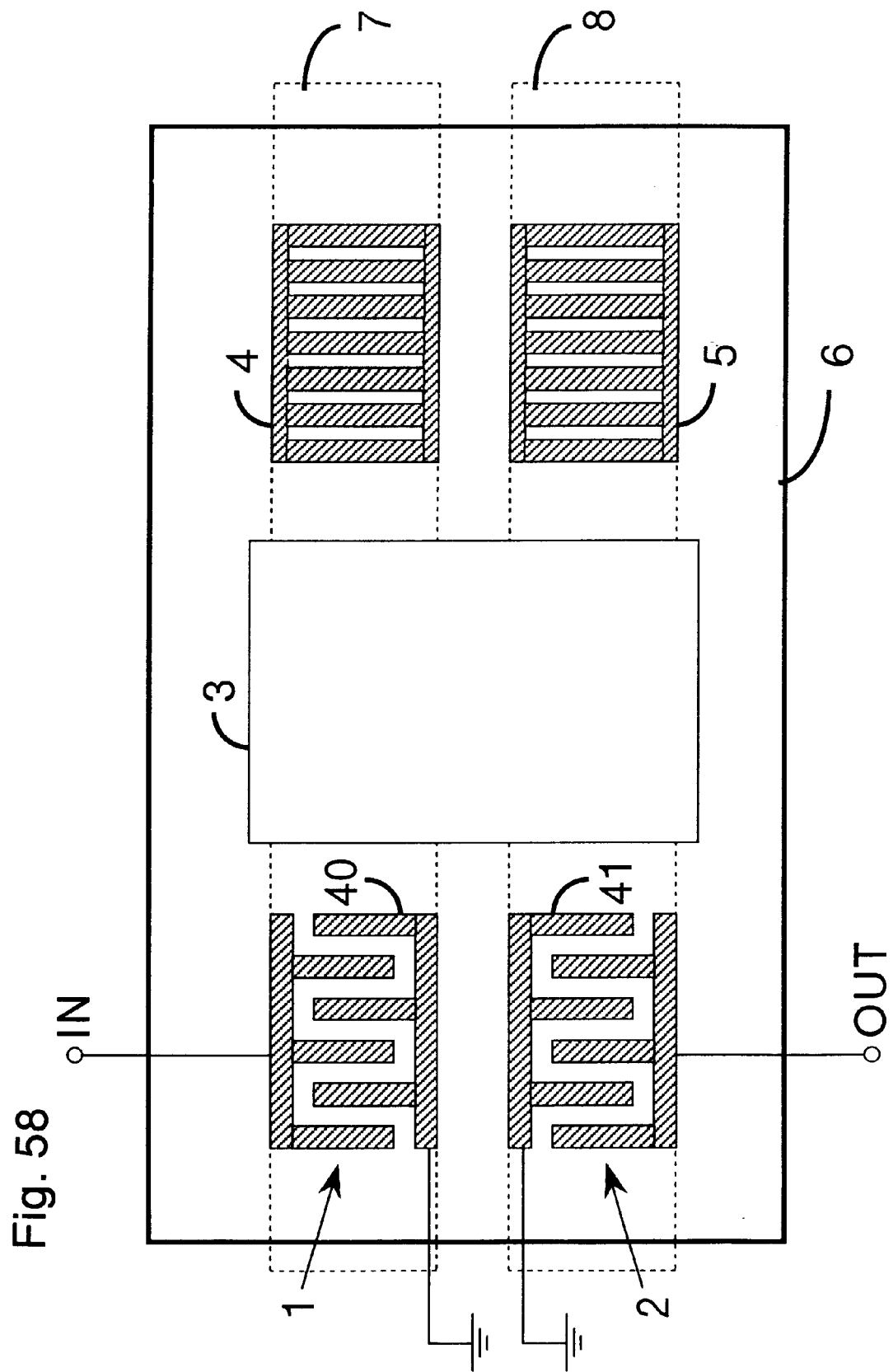
FIG. 58 is a diagram illustrating a general construction of a surface acoustic wave filter according to Example 5 of the present invention.

FIG. 58 shows a diagram illustrating the construction of a surface acoustic wave filter according to the present invention in which, out of electrode fingers of the input and output IDTs, the electrode finger that is the closest to the coupler is grounded.

In FIG. 58, by grounding an electrode finger 40 or 41 that is the closest to the coupler in at least one IDT of the input and output IDTs, the electrode finger 40 or 41 itself is made to function as a shield electrode between the IDT and the coupler 3. Consequently, the electrostatic coupling between the input and output IDTs via the coupler is suppressed and the isolation between input and output can be improved.

Figure 59:
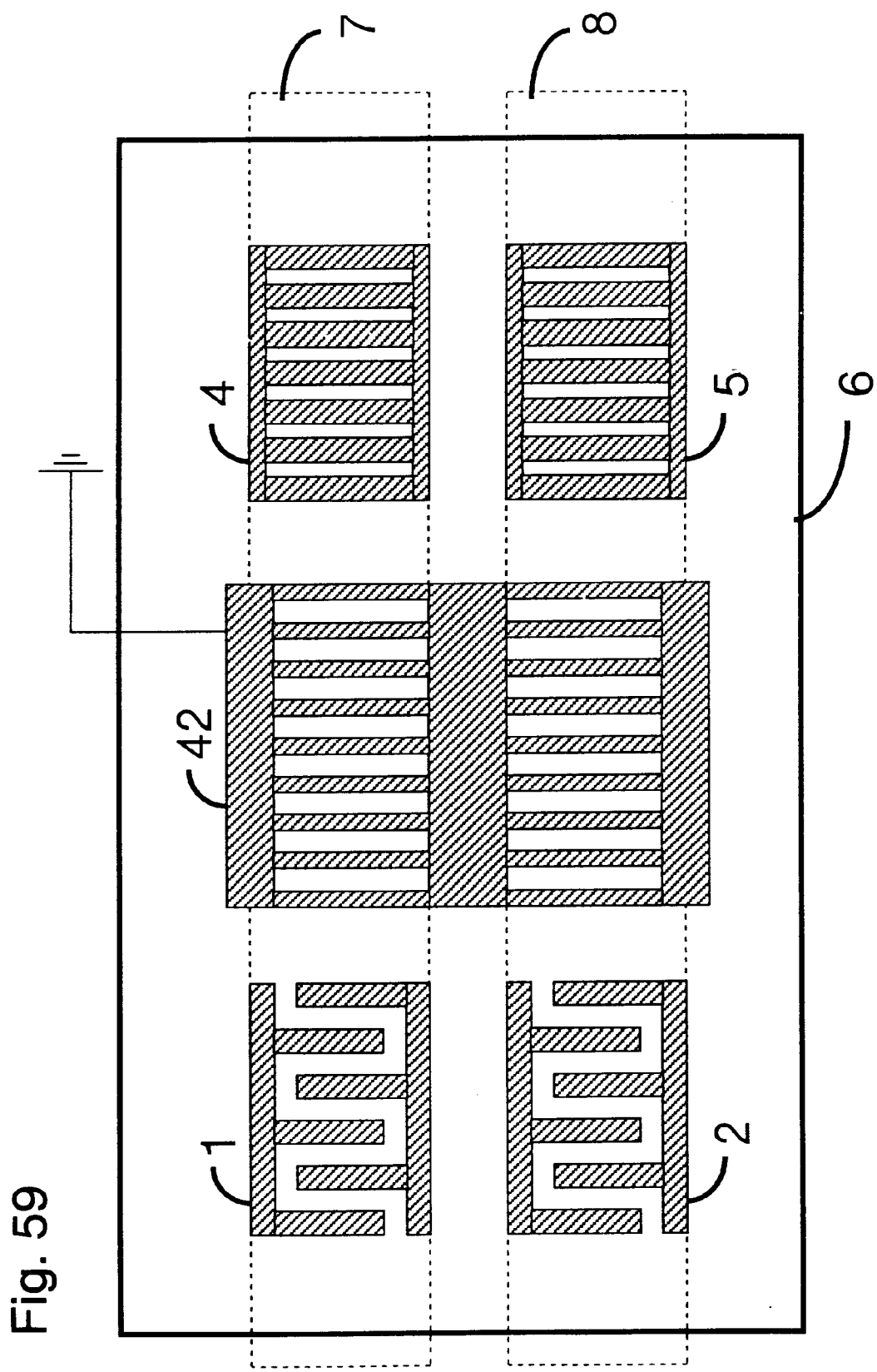
FIG. 59 is a diagram illustrating a general construction of a surface acoustic wave filter according to Example 6 of the present invention.
Figure 60:
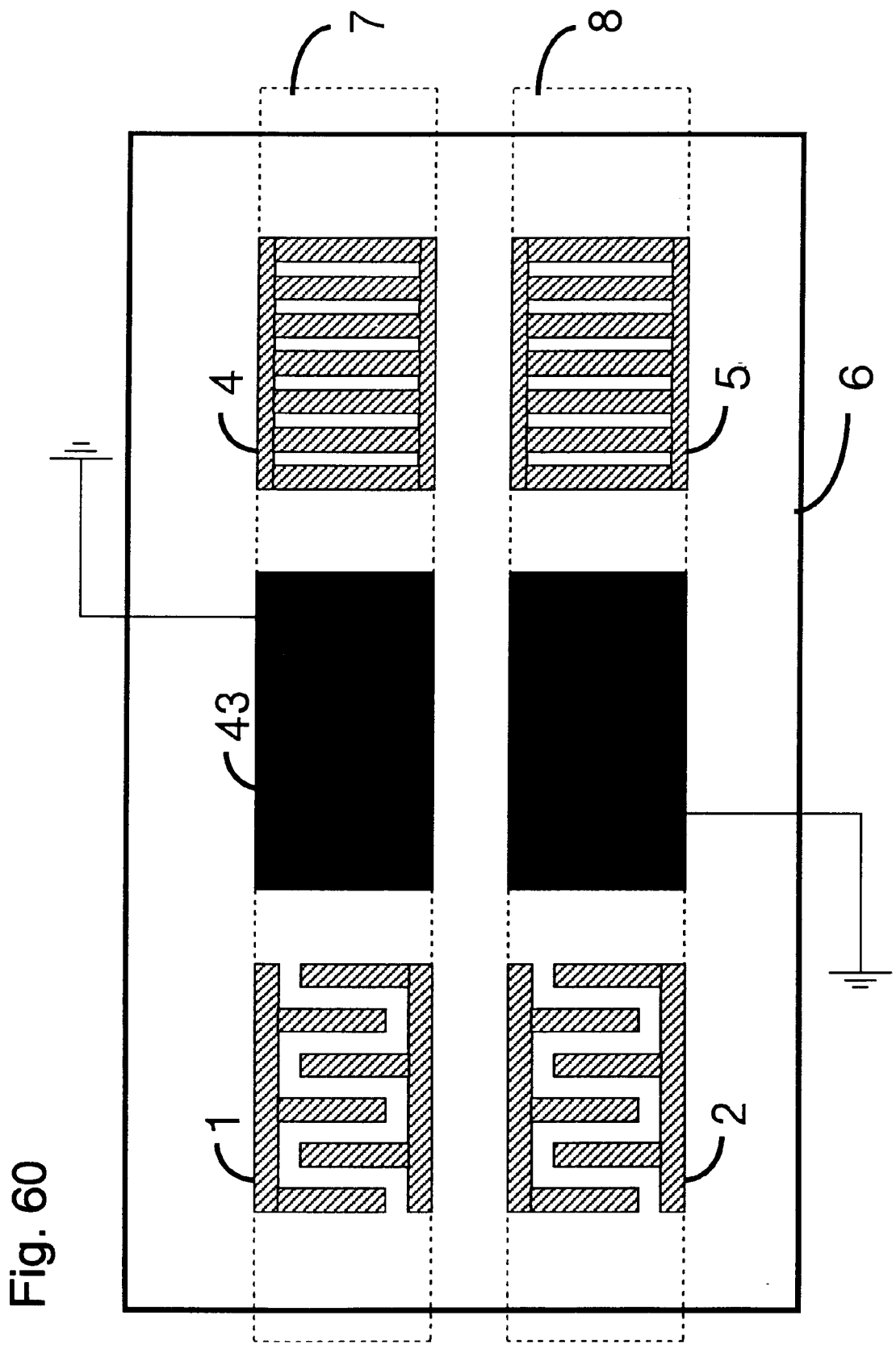
FIG. 60 is a diagram illustrating a general construction of a surface acoustic wave filter according to Example 6 of the present invention.

FIG. 59 shows a diagram illustrating the construction of a surface acoustic wave filter according to the present invention in which the coupler is grounded. In FIG. 59, the filter is constructed such that the coupler is a waveguide-directional coupler 42 formed with use of a metal grating and the waveguide-directional coupler 42 is grounded. FIG. 60 is also a diagram illustrating a construction in which the coupler is grounded but a waveguide-directional coupler 43 is formed of a uniform metal film.

The grounding of the waveguide-directional coupler 43 suppresses the electrostatic coupling between the input and output IDTs via the coupler. Consequently, the isolation between input and output can be improved.

Figure 61:
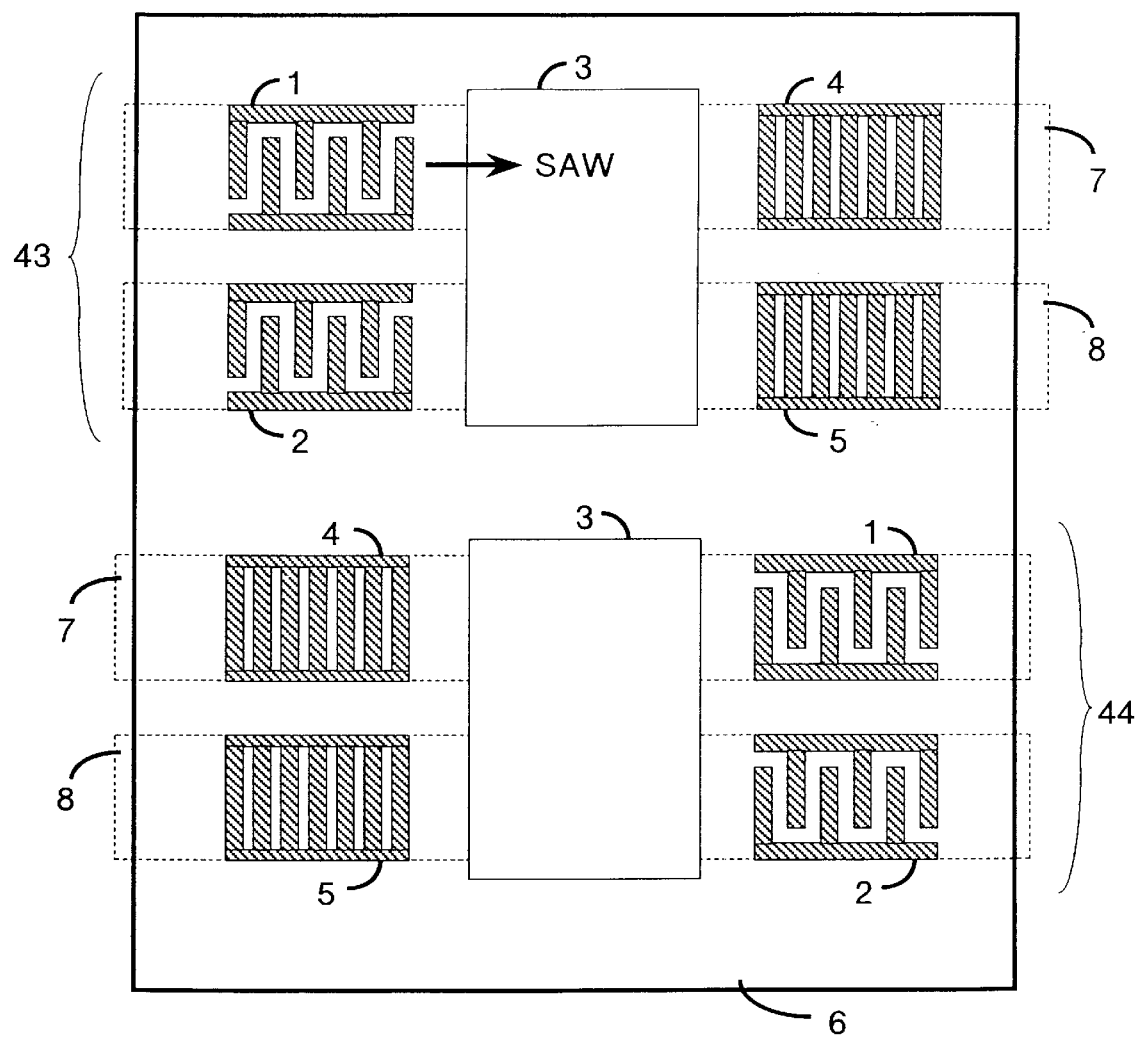
FIG. 61 is a diagram illustrating a general construction of a surface acoustic wave filter according to Example 7 of the present invention.

FIG. 61 shows a diagram illustrating a construction provided with a plurality of surface acoustic wave filters of the present invention, in which a plurality of surface acoustic wave filters 43 and 44 are disposed on a single piezoelectric substrate 6 and the surface acoustic wave filters 43 and 44 adjacent to each other are arranged in reverse direction along the SAW propagation direction.

Where a plurality of surface acoustic wave filters are formed on a single piezoelectric substrate, by putting adjacent filters 43 and 44 in reverse directions along the SAW propagation direction, the distance between signals of the respective filters can be increased and the electrostatic coupling between the filters can be suppressed. Consequently, the isolation between input and output can be improved.

Figure 62:
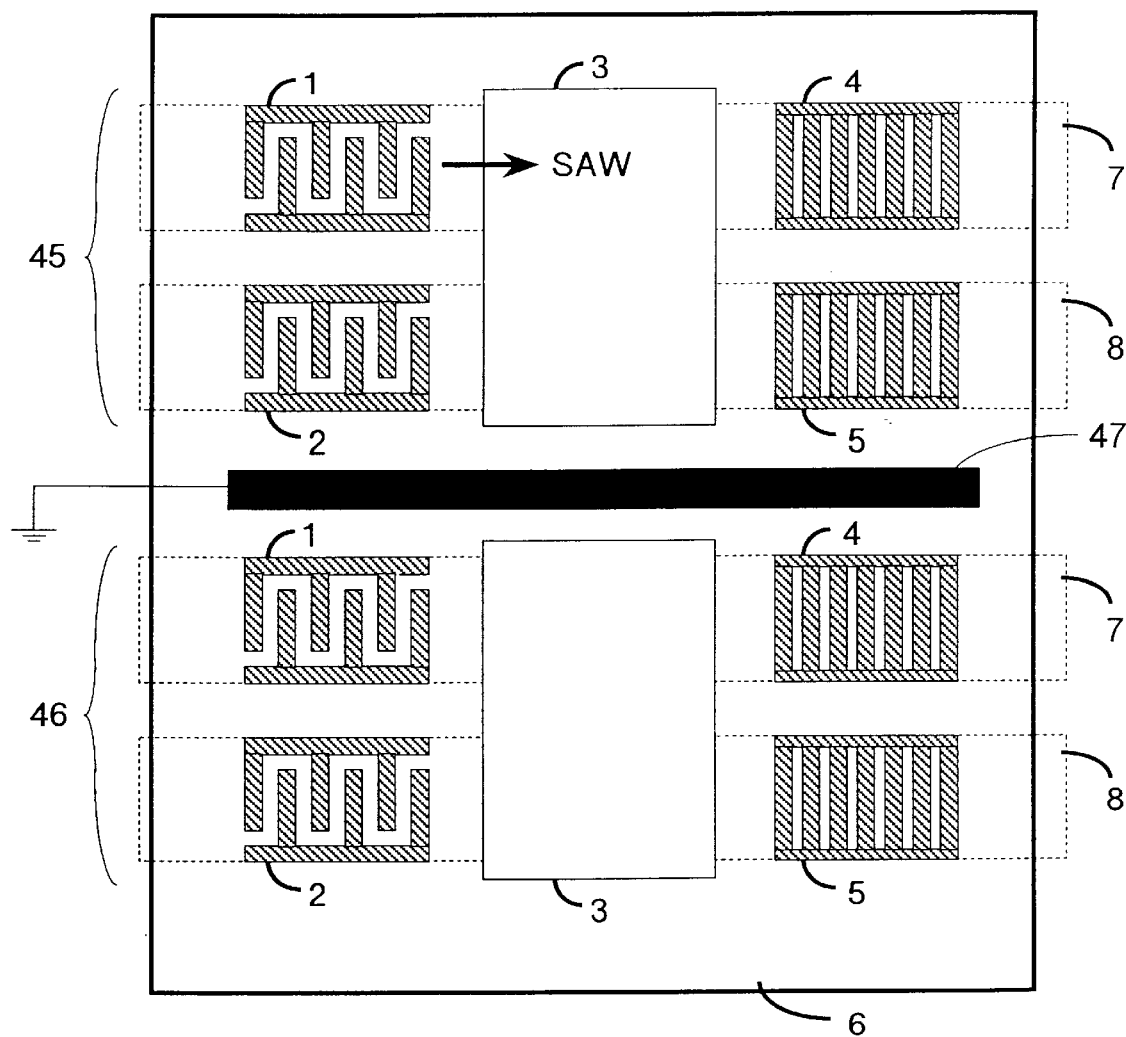
FIG. 62 is a diagram illustrating a general construction of a surface acoustic wave filter according to Example 8 of the present invention.

FIG. 62 shows a diagram illustrating a construction provided with a plurality of surface acoustic wave filters of the present invention and further an earth electrode. In FIG. 62, two surface acoustic wave filters 45 and 46 are disposed on a single piezoelectric substrate 6 and an earth electrode 47 for shielding is disposed between the filters. Here, the earth electrode 47 is in the shape of a rectangle. However its shape is not required to be a rectangle. Further, the earth electrode 47 does not need to be singular, but a plurality of earth electrodes may be disposed. Where a plurality of surface acoustic wave filters are formed on a single piezoelectric substrate, the disposition of the earth electrode 47 for shielding between adjacent filters 45 and 46 suppresses the electrostatic coupling between the filters. Consequently, the isolation between input and output can be improved.

Examples which can improve the isolation between input and output are described in the following examples 1 to 8.

EXAMPLE 1

Figure 63:
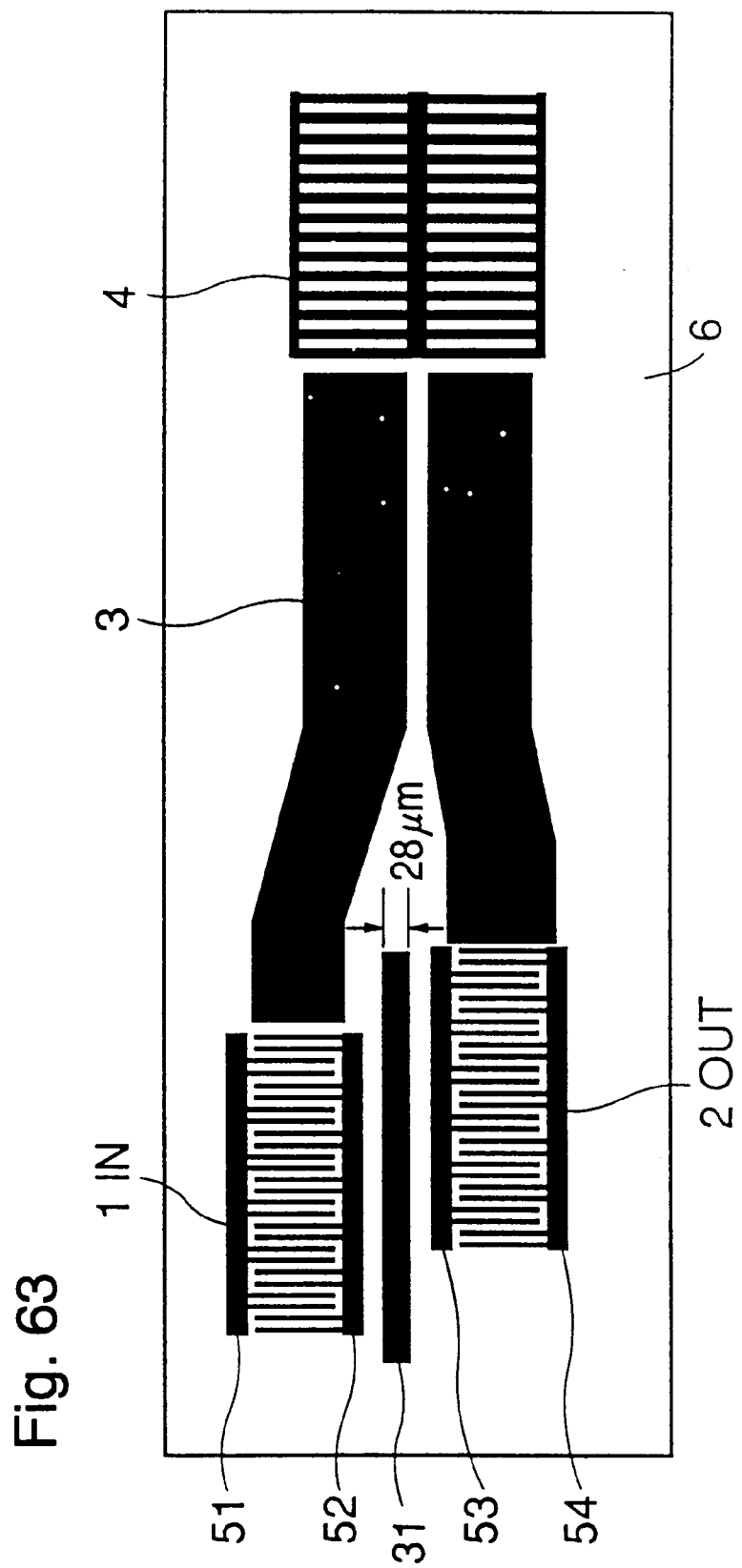
FIG. 63 is a diagram illustrating the construction of Example 1 of the present invention.

Explanation is given of an embodiment of the surface acoustic wave filter illustrated in FIG. 52. FIG. 63 shows the construction of a produced surface acoustic wave filter.

A 36° Y-X:quartz is used for a piezoelectric substrate 6, and double electrodes having a 36 µm period and 65 electrode pairs are used for input and output IDTs 1 and 2. A coupler 3 is a waveguide-directional coupler using a uniform metal film. The film thickness of electrodes is 1.5 µm. The period of a reflector 4 is 18.01 µm and the number of electrodes is 155 pairs.

Figure 64:
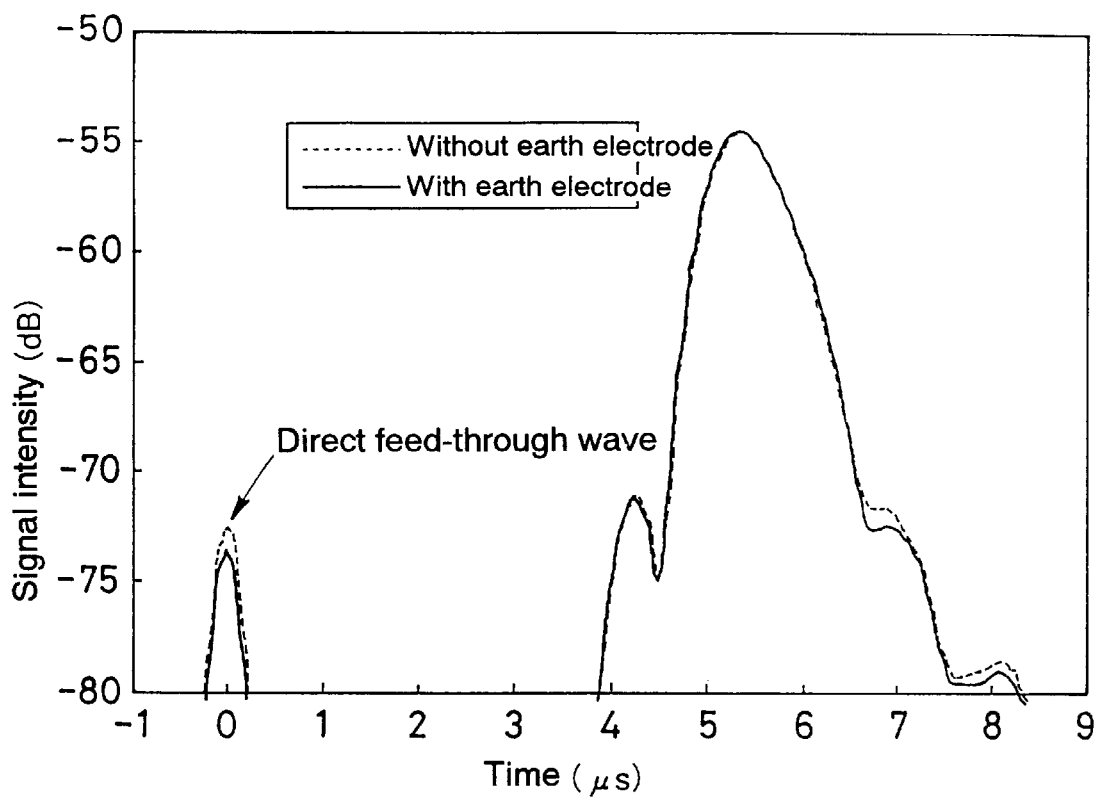
FIG. 64 is a graphical representation of a time-response characteristic of Example 1 of the present invention.

An rectangular earth electrode 31 of 28 µm width is disposed between the input and output IDTs of this surface acoustic wave filter, as shown in FIG. 52. FIG. 64 shows a time-response characteristic of this filter. For comparison, the characteristic without the earth electrode is shown by a dotted line in FIG. 64. It is confirmed that the disposition of the earth electrode 31 reduces the level of a signal at a time 0 representing the degree of isolation between input and output, i.e., the level of direct feed-through wave, from −72.6 dB to −73.6 dB.

EXAMPLE 2

Figure 65:
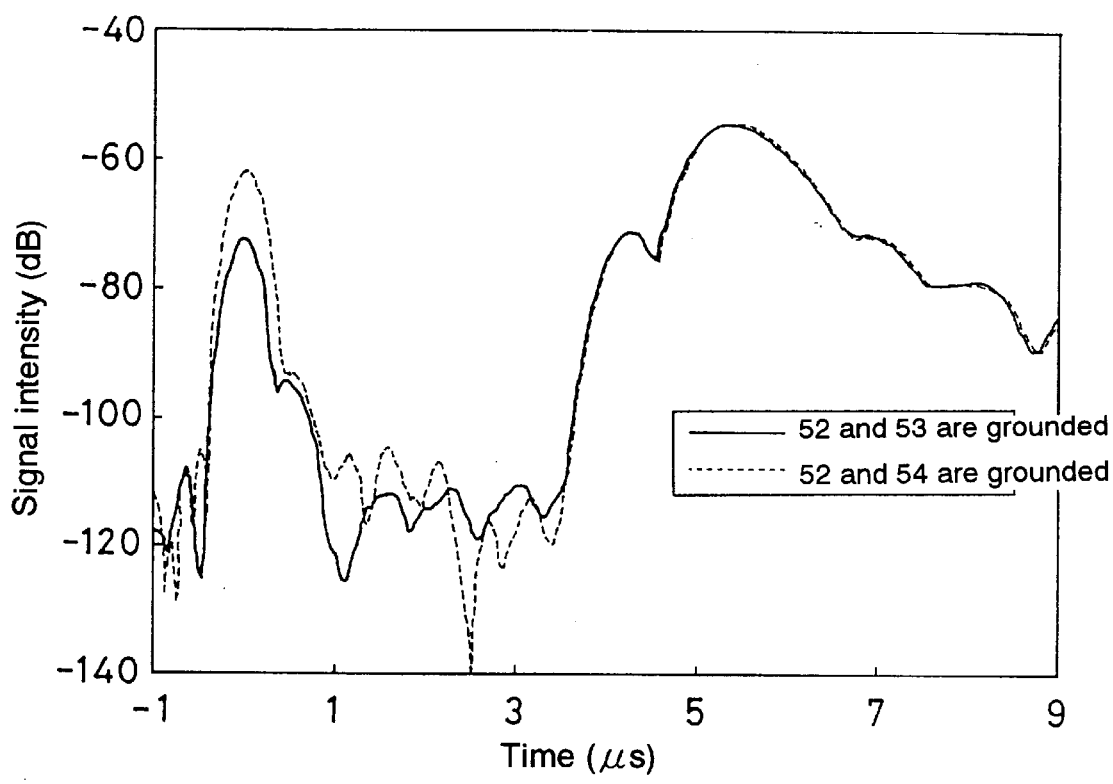
FIG. 65 is a graphical representation of the time-response characteristic of Example 2 of the present invention.

An embodiment of the surface acoustic wave filter shown in FIG. 55 is explained using a surface acoustic wave filter shown in FIG. 63. FIG. 65 shows the time-response characteristic of a filter in which bus bars indicated by reference numerals 52 and 53 disposed adjacently to each other are grounded in FIG. 63. An earth electrode for shielding is not disposed.

By thus disposing the bus bars, the level of the direct feed-through wave at the time 0 is −72.6 dB. For comparison, a dotted line in FIG. 65 shows the characteristic of a filter in which the bus bars indicated by reference numerals 52 and 54 are grounded and bus bars indicated by reference numerals 51 and 53 are connected to input and output. The level of the direct feed-through wave in this case is −62 dB. It is confirmed that the level of the direct feed-through wave is more reduced by 9.4 dB in the case where the bus bars 52 and 53 disposed adjacently to each other are grounded.

EXAMPLE 3

Figure 66:
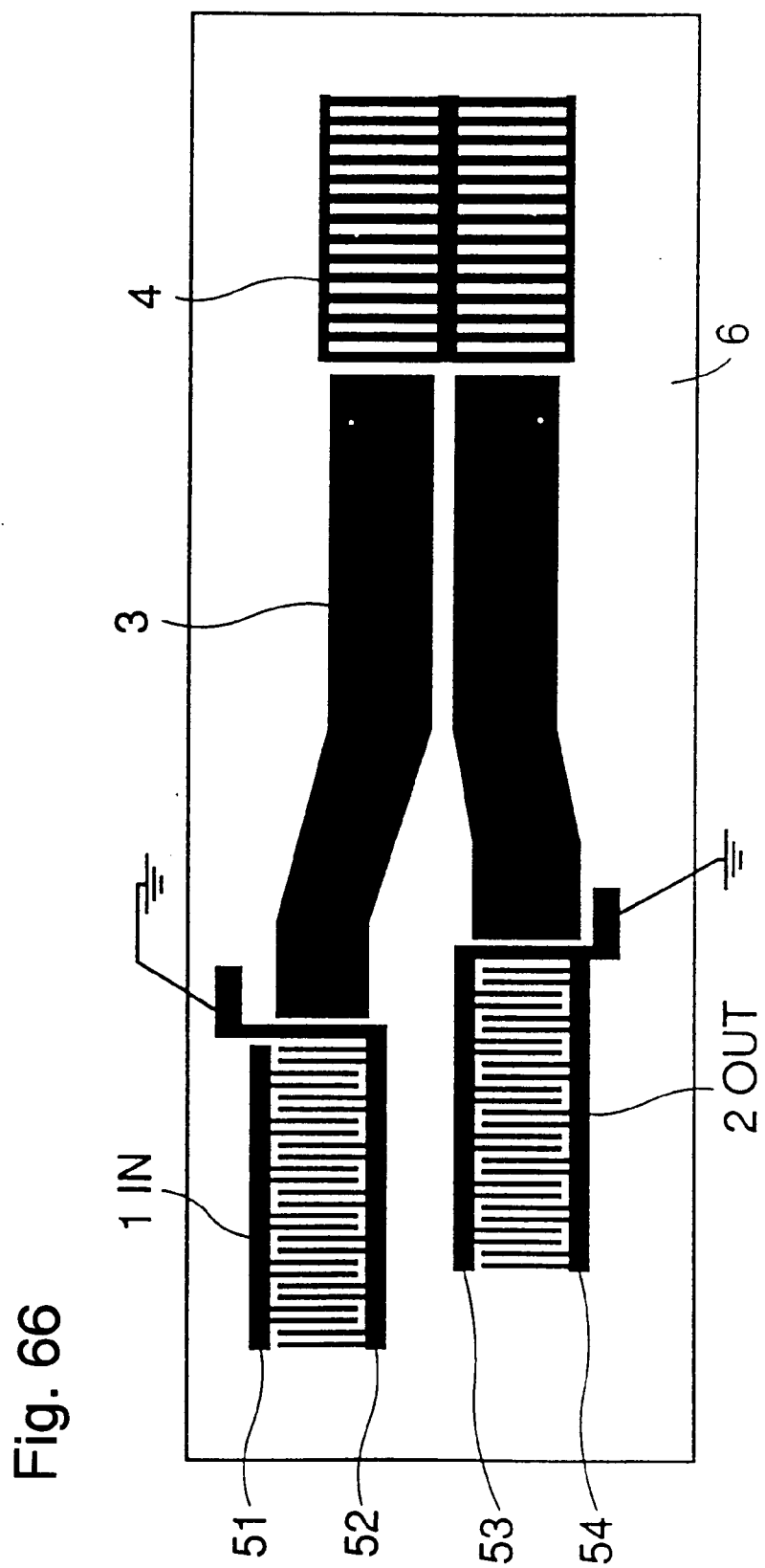
FIG. 66 is a diagram illustrating the construction of Example 3 of the present invention.
Figure 67:
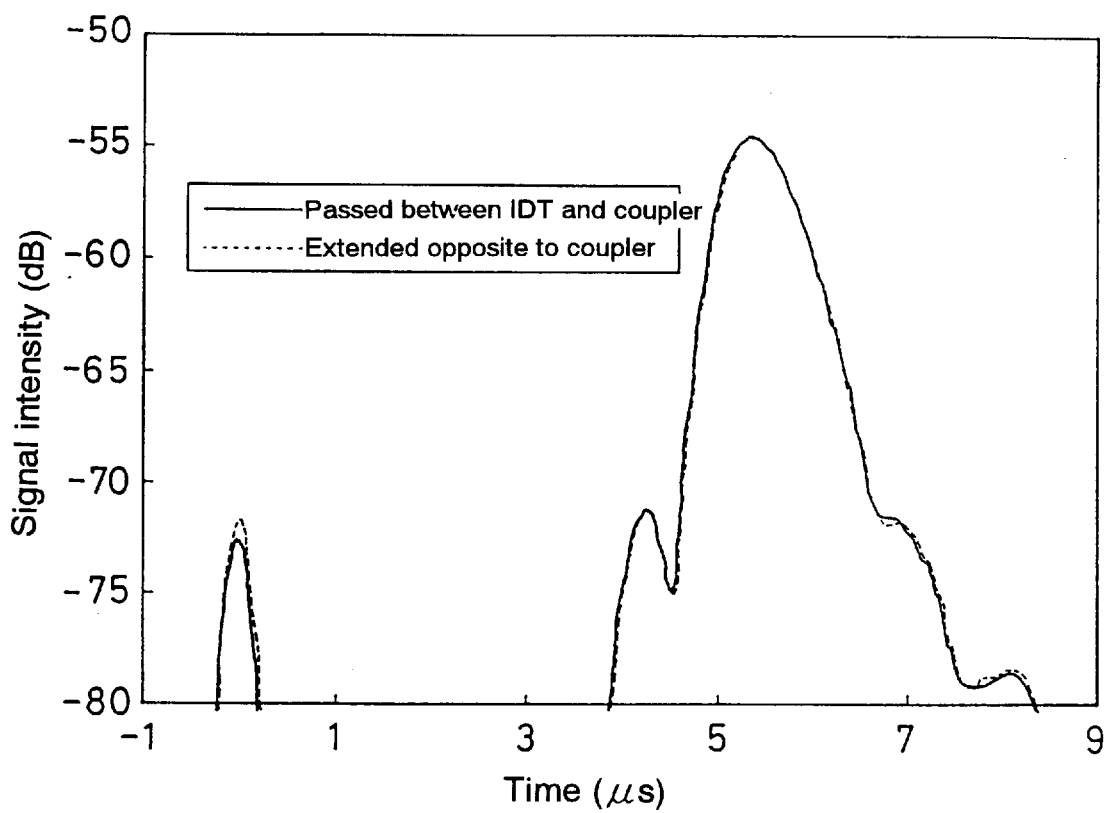
FIG. 67 is a graphical representation of the time-response characteristic of Example 3 of the present invention.
Figure 68:
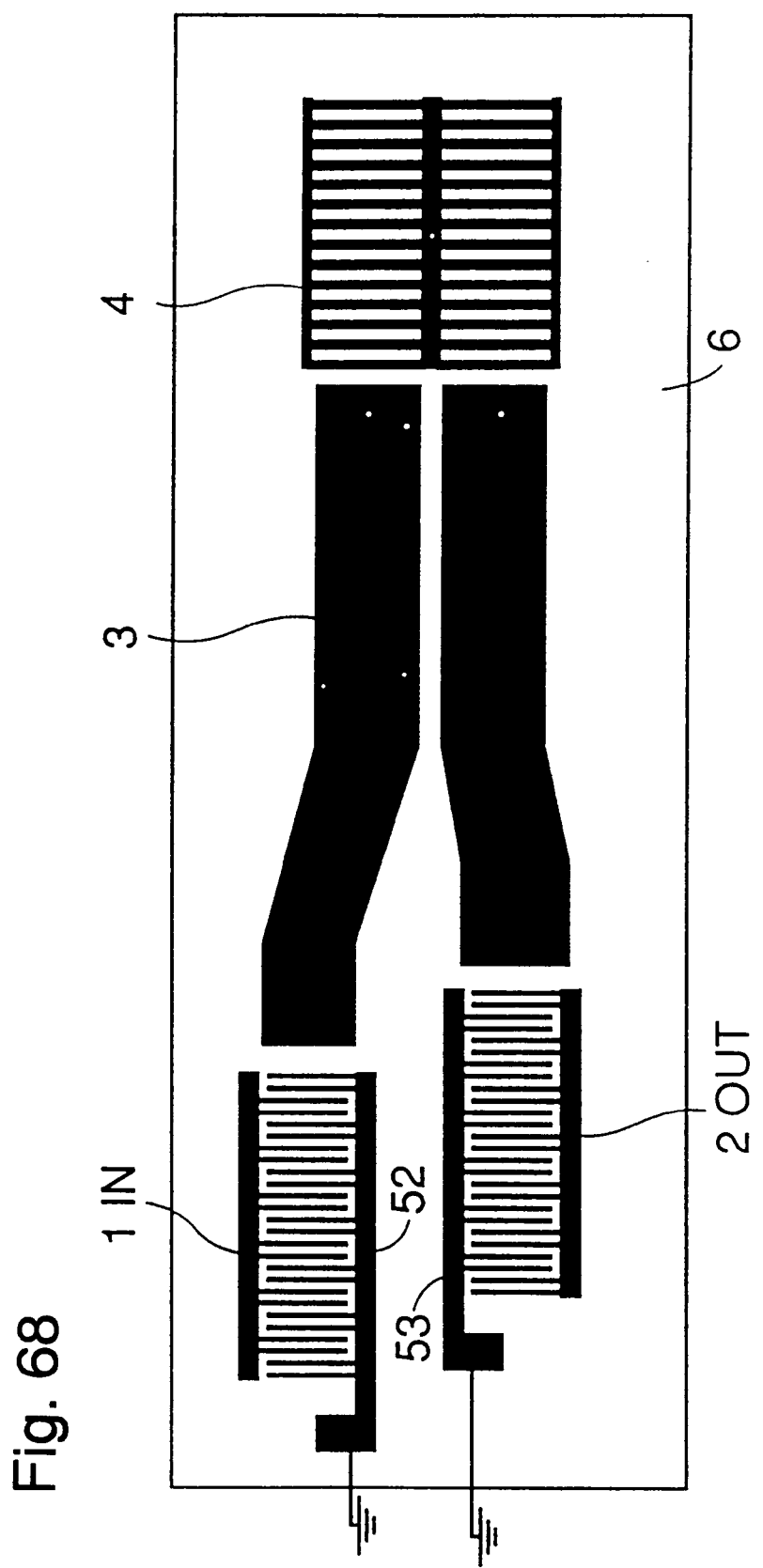
FIG. 68 is a diagram illustrating the construction of a comparative example to Example 3 of the present invention.

An embodiment of the surface acoustic wave filter shown in FIG. 56 is explained. FIG. 66 shows the construction of a produced surface acoustic wave filter. In FIG. 66, bus bars indicated by reference numerals 52 and 53 are so extended to pass between the coupler 3 and the input and output IDTs 1 and 2 as shown in the figure. The design conditions of the IDTs 1 and 2, the coupler 3 and the reflector 4 are the same as those in FIG. 63. FIG. 67 shows the time-response characteristic of this filter. For comparison, a dotted line in FIG. 67 shows the characteristic of a filter in which the grounded bus bars 52 and 53 are extended at an end opposite to the coupler 3 as shown in FIG. 68. It is confirmed that the level of direct feed-through wave is reduced by 0.8 dB.

EXAMPLE 4

Figure 69:
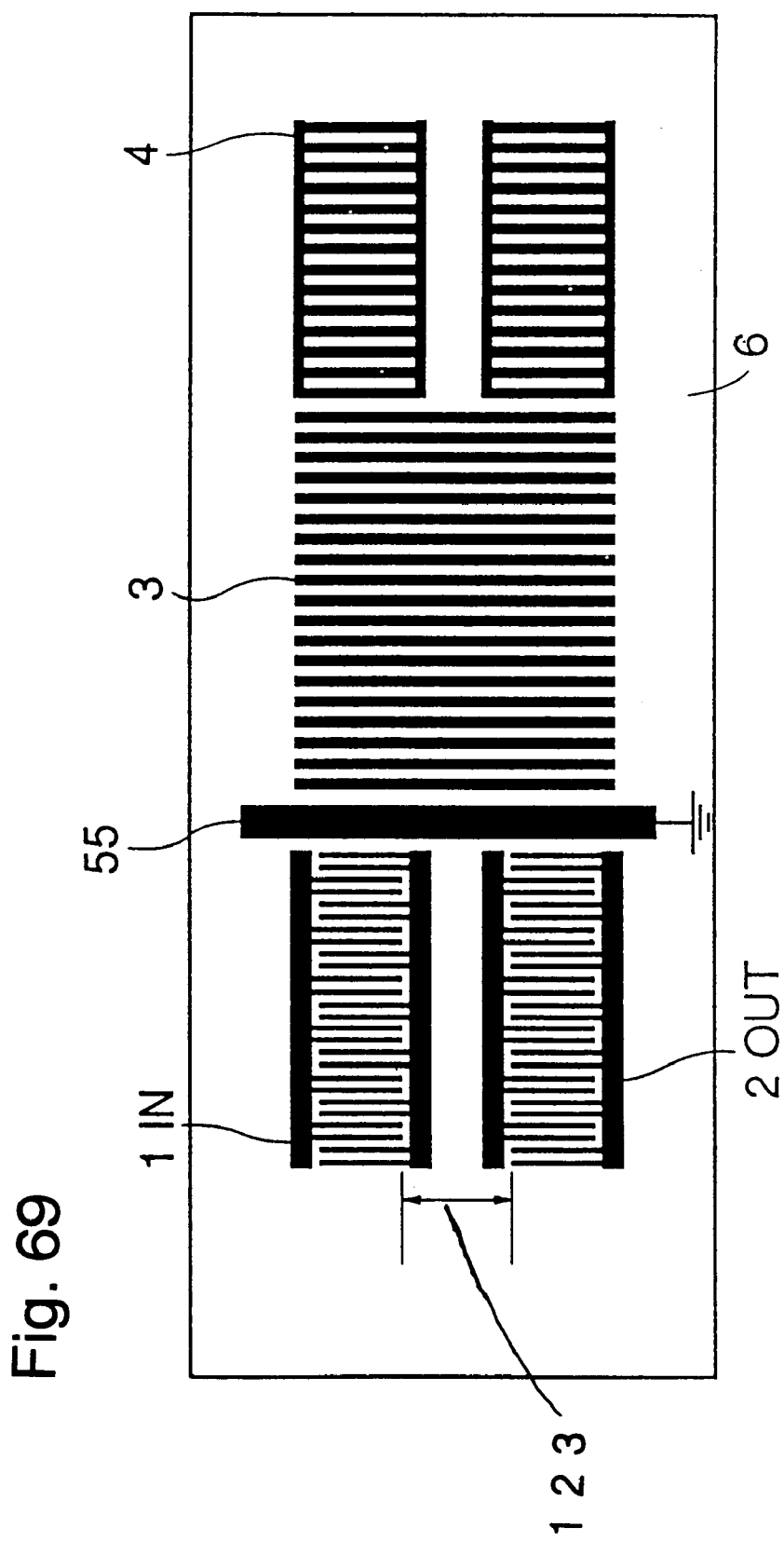
FIG. 69 is a diagram illustrating the construction of Example 4 of the present invention.

An embodiment of the surface acoustic wave filter shown in FIG. 57 is explained. FIG. 69 shows the construction of a produced surface acoustic wave filter. A 128° Y-X:LiNbO$_3$ is used for a piezoelectric substrate 6 and a coupler is a multi-strip coupler 3. The period of IDTs 1 and 2 is 20 µm and the number of pairs is 10 in both the input and output IDTs. The distance between the input and output IDTs (reference numeral 123) is 70 µm. In this filter construction, an earth electrode 55 for shielding is disposed between the IDTs 1 and 2 and the coupler 3. The level of the direct feed-through wave of this filter is −49.5 dB and it is confirmed that the level is reduce by 9.5 dB In comparison with the level of the direct feed-through wave of −40 dB in the case where the earth electrode is not disposed.

EXAMPLE 5

Figure 70:
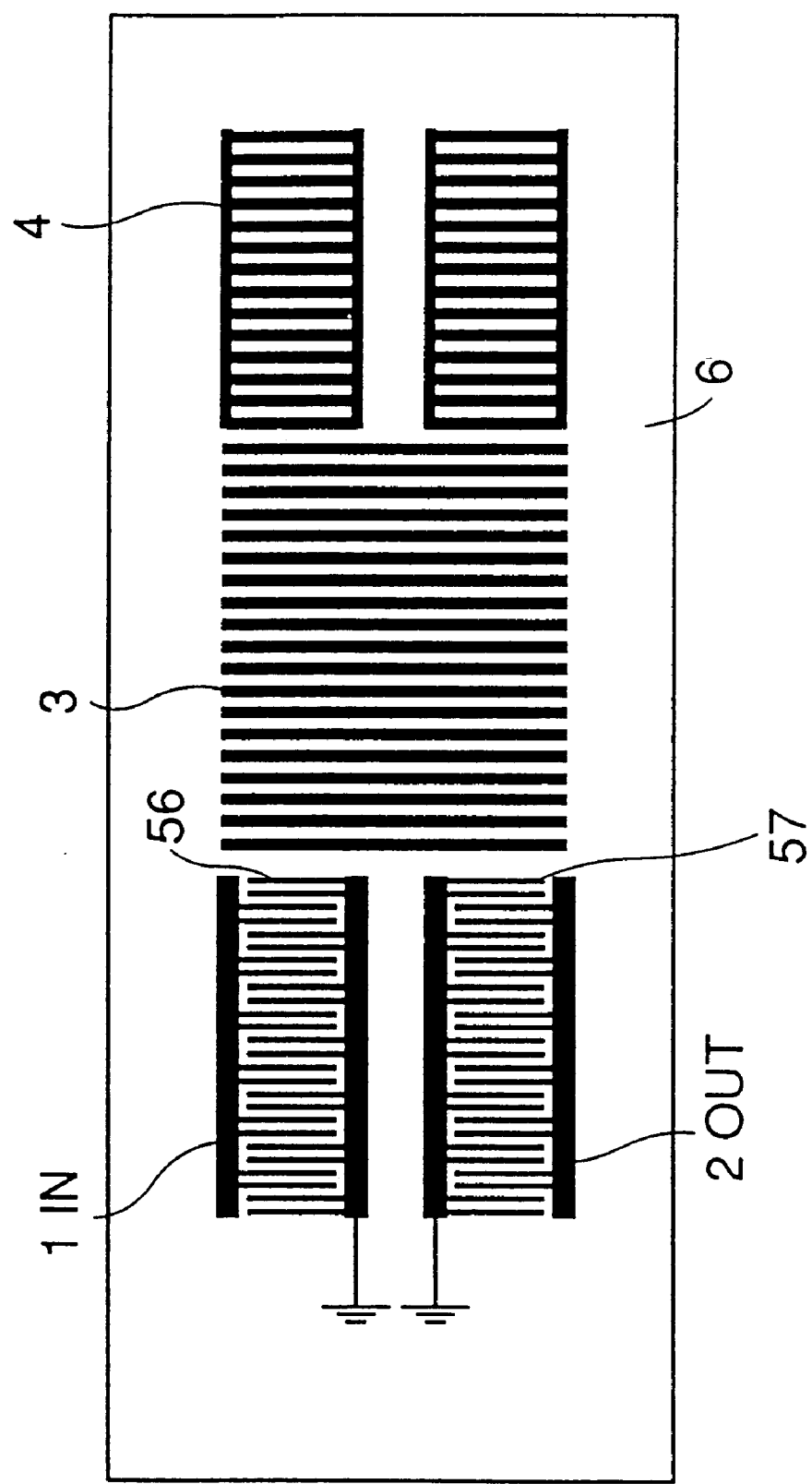
FIG. 70 is a diagram illustrating the construction of Example 5 of the present invention.
Figure 71:
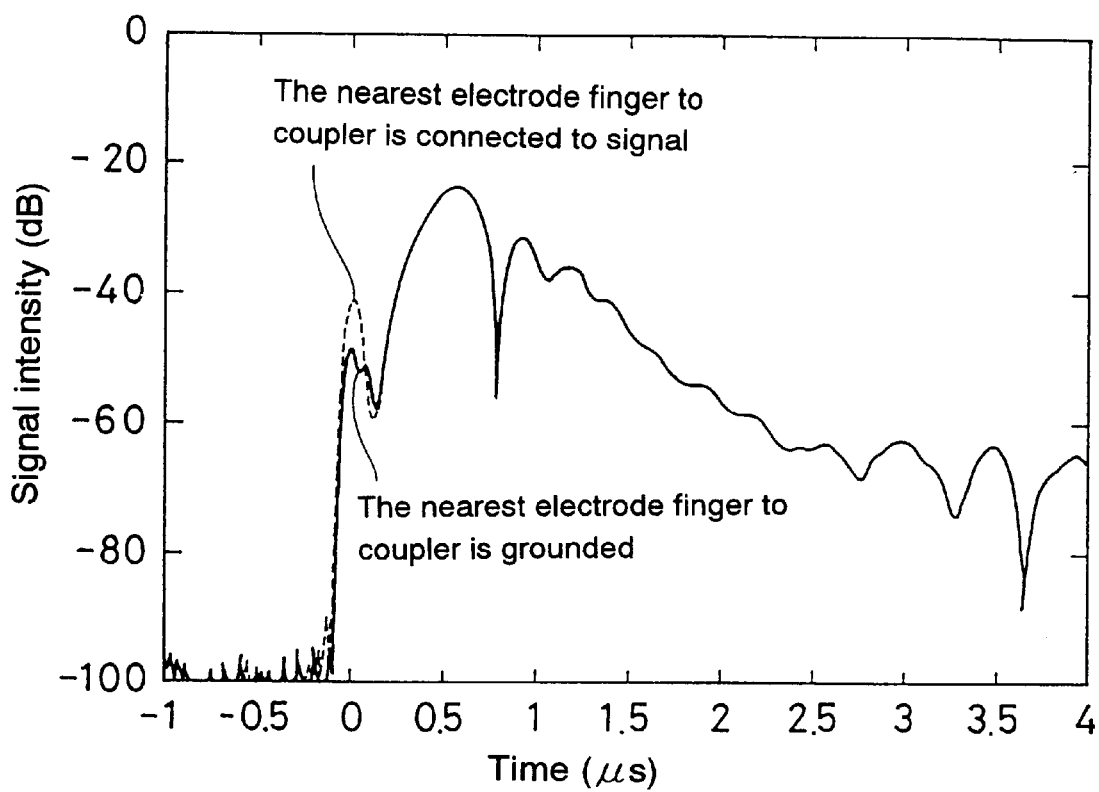
FIG. 71 is a graphical representation of the time-response characteristic of Example 5 of the present invention.

An embodiment of the surface acoustic wave filter shown in FIG. 58 is explained. FIG. 70 shows the construction of a produced surface acoustic wave filter. Grounded are electrode fingers 56 and 57 that are the closest to the coupler 3. FIG. 71 shows the time-response characteristic of this filter. For comparison, a dotted line in FIG. 71 shows the characteristic of a filter in which the electrode fingers 56 and 57 that are the closest to the coupler are connected to a signal side. The grounding of the electrode fingers 56 and 57 that are closest to the coupler reduces the direct feed-through wave by 9 dB.

EXAMPLE 6

Figure 72:
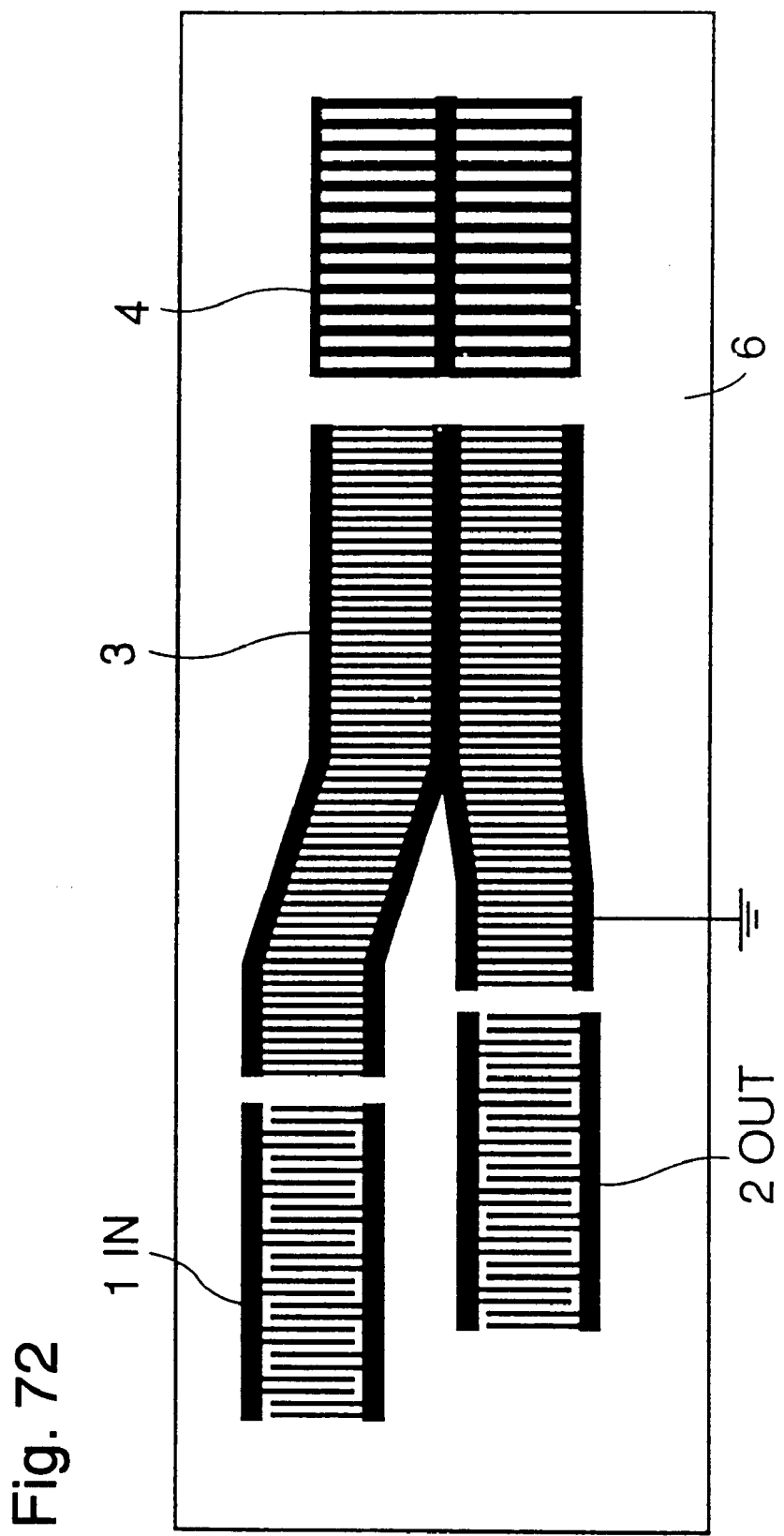
FIG. 72 is a diagram illustrating the construction of Example 6 of the present invention.

An embodiment of the surface acoustic wave filter shown in FIG. 59 is explained. FIG. 72 shows the construction of a produced surface acoustic wave filter. A 36° Y-X:quartz is used for a piezoelectric substrate 6, double electrodes having a period of 15 µm and 95 pairs are used for the input and output IDT 1 and 2, and a coupler is a waveguide-directional coupler 3 using a metal grating. The film thickness of the electrodes is 0.2 µm, the number of fingers of a reflector is 179 and the distance between the input and output IDTs is 88.5 µm.

Figure 73:
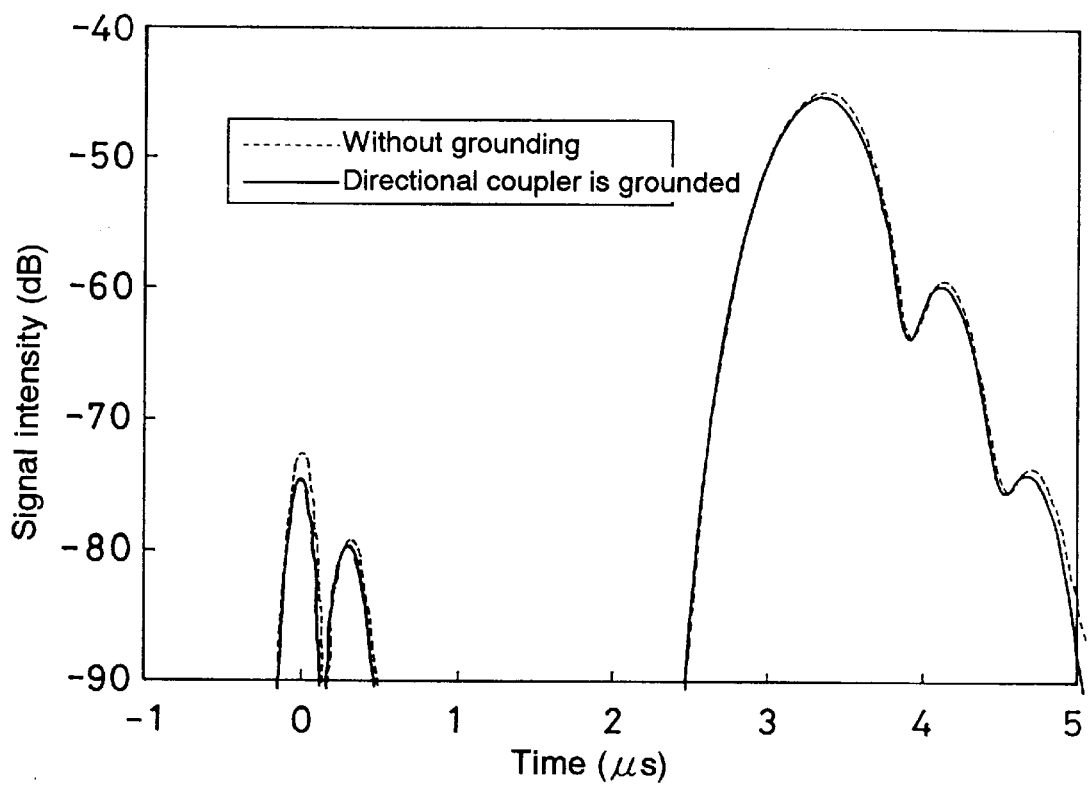
FIG. 73 is a graphical representation of the time-response characteristic of Example 6 of the present invention.

In this filter, a uniform film part of the waveguide-directional coupler 3 is provided with an earth wire through which the waveguide-directional coupler 3 is grounded. FIG. 73 shows the time-response characteristic of this filter. For comparison, a dotted line in FIG. 73 shows the characteristic of a filter in which the waveguide-directional coupler 3 is not grounded. It is confirmed that the grounding of the waveguide-directional coupler 3 reduces the direct feed-through wave by 2 dB.

EXAMPLE 7

Figure 74:
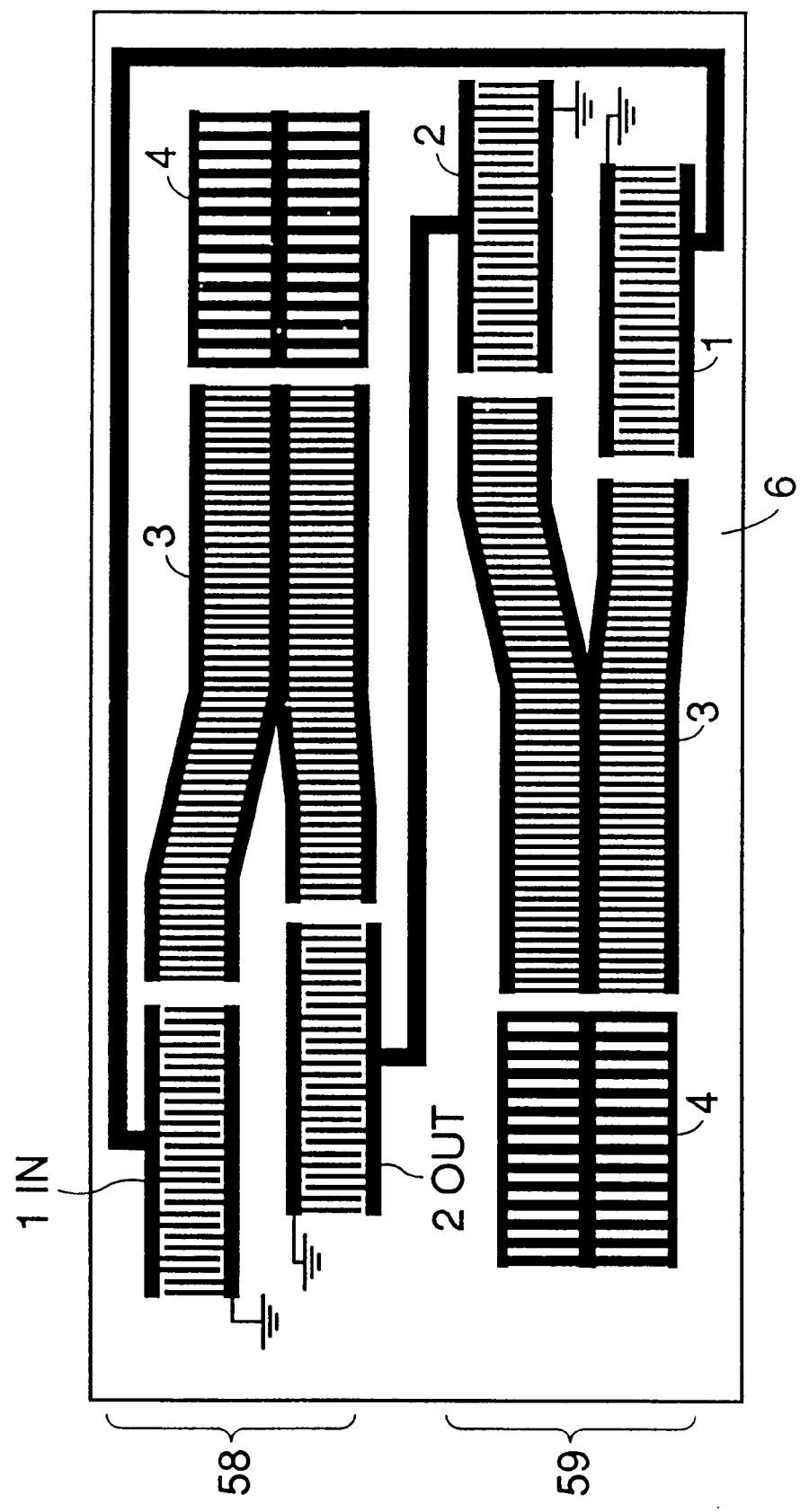
FIG. 74 is a diagram illustrating the construction of Example 7 of the present invention.
Figure 75:
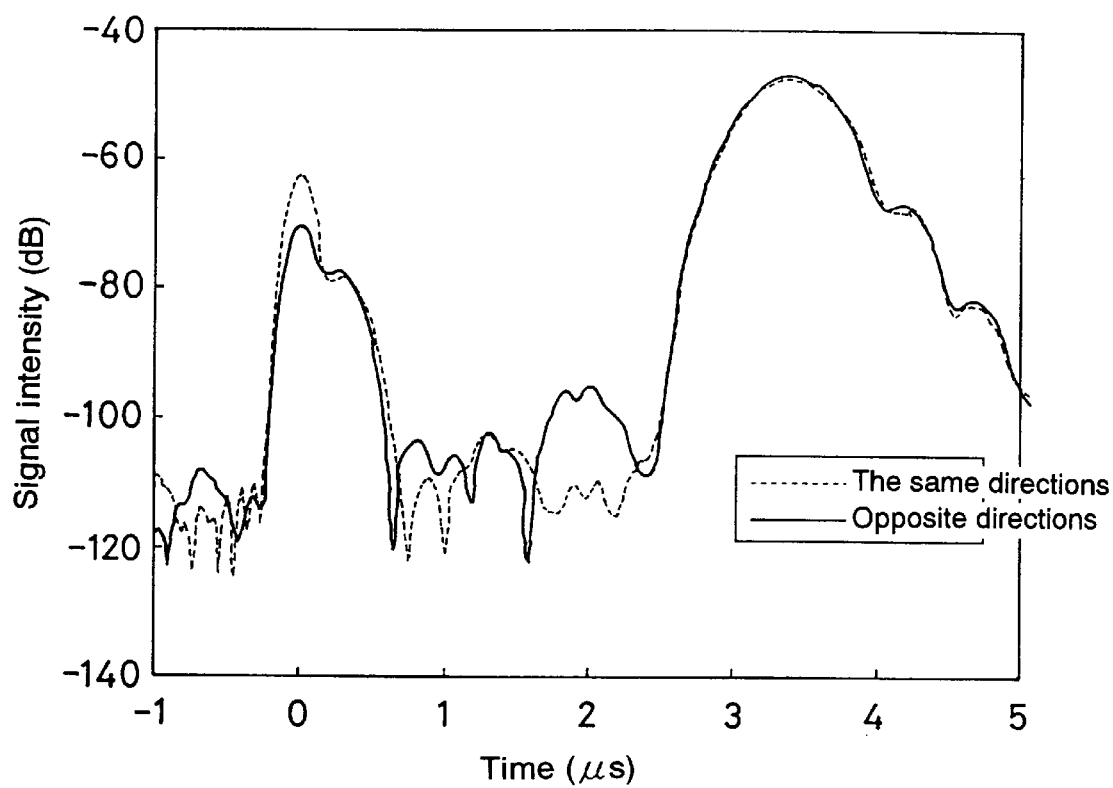
FIG. 75 is a graphical representation of the time-response characteristic of Example 7 of the present invention.

An embodiment of the surface acoustic wave filter device shown in FIG. 61 is explained. FIG. 74 shows the construction of a produced surface acoustic wave filter device. Here, two surface acoustic wave filters 58 and 59 are disposed in directions reverse to each other along the SAW propagation direction on a 36° Y-X:quartz substrate. These surface acoustic wave filters 58 and 59 are connected in parallel. The construction of IDTs 1 and 2, couplers 3 and reflectors 4 is the same as that shown in Example 6. FIG. 75 shows the time-response characteristic of this filter device. For comparison, a dotted line in FIG. 75 shows the characteristic of a filter device in which the two surface acoustic wave filters are disposed in the same direction. It is confirmed that the reverse disposition reduces the direct feed-through wave by 7.9 dB.

EXAMPLE 8

Figure 76:
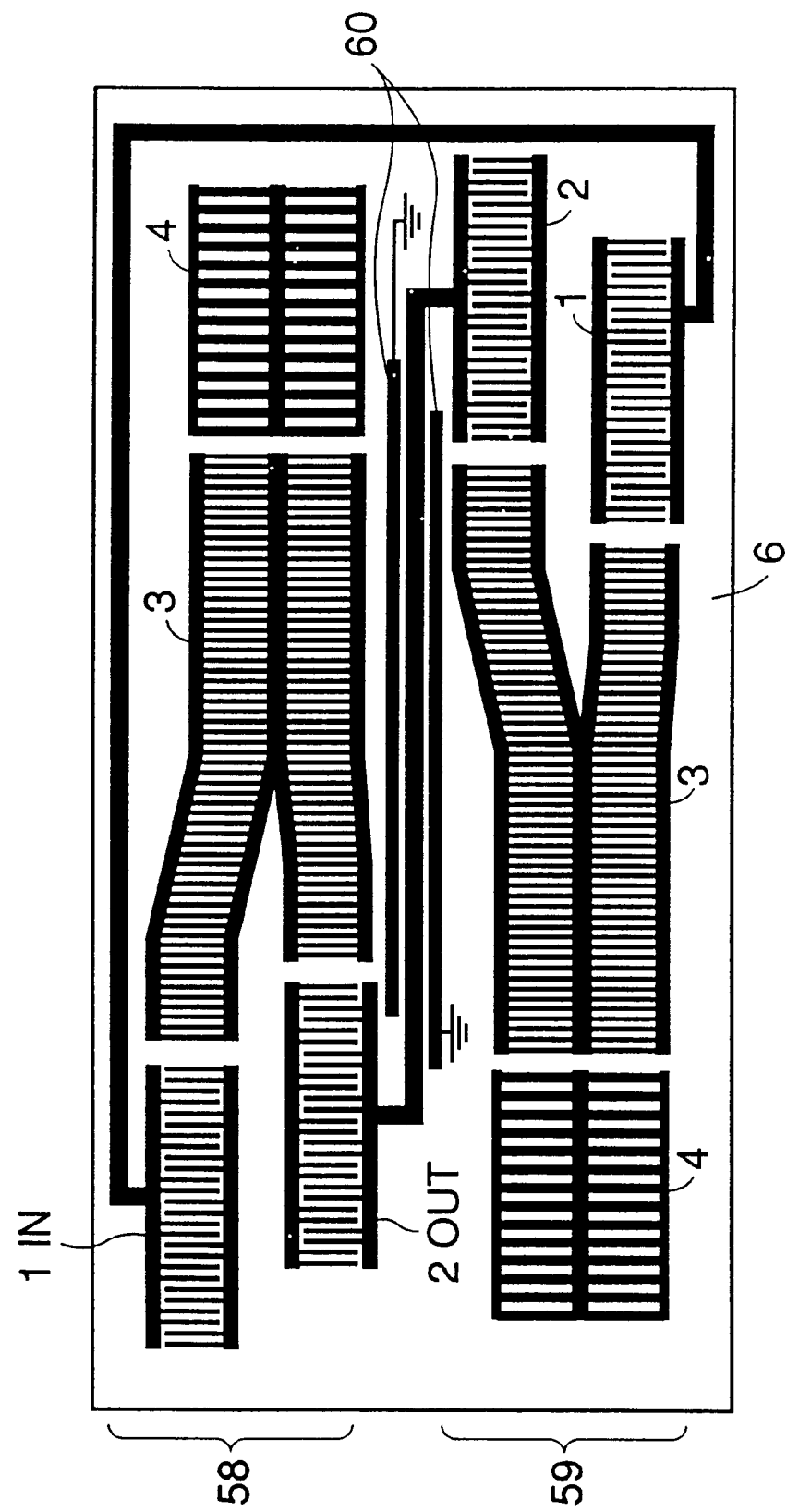
FIG. 76 is a diagram illustrating the construction of Example 8 of the present invention.
Figure 77:
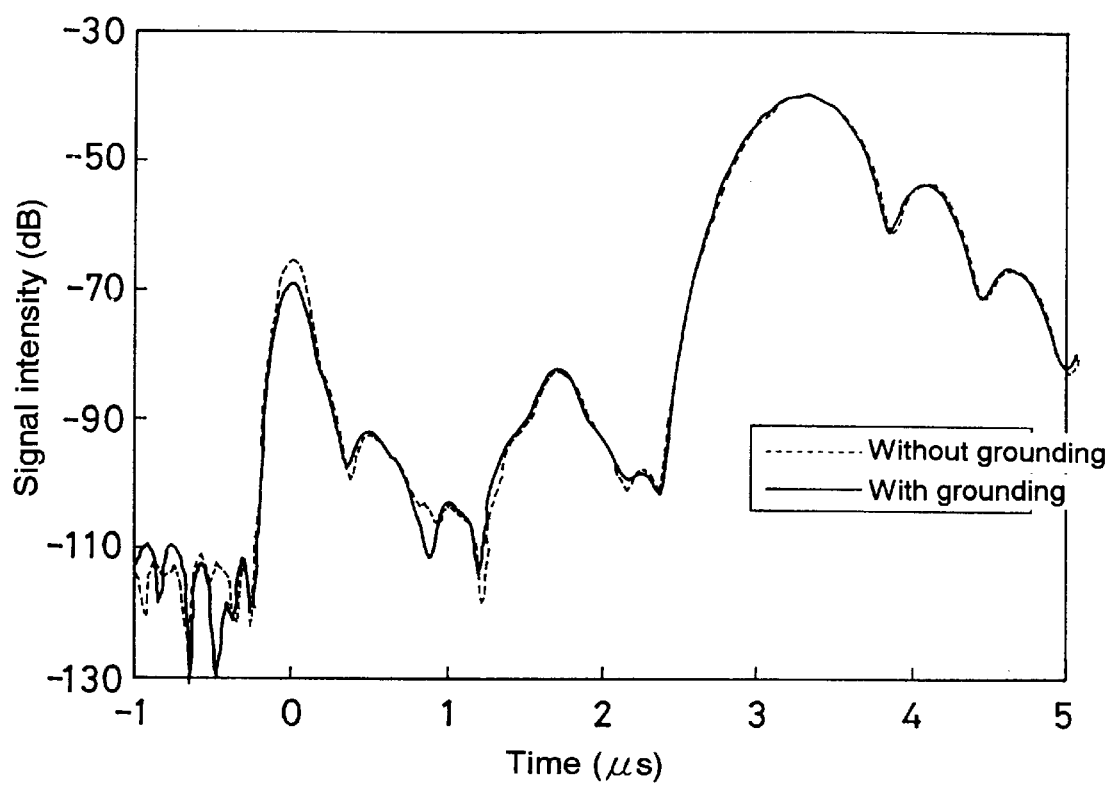
FIG. 77 is a graphical representation of the time response characteristic of Example 8 of the present invention.

An embodiment of the surface acoustic wave filter device shown in FIG. 62 is explained. FIG. 76 shows the construction of a produced surface acoustic wave filter device. Two surface acoustic wave filters 58 and 59 are disposed on a 36° Y-X:quartz substrate. The construction of individual IDTs 1 and 2, couplers 3 and reflectors 4 is the same as that shown in FIG. 6. These two surface acoustic wave filters 58 and 59 are connected in parallel and two earth electrodes 60 are disposed between the surface acoustic wave filters 58 and 59. FIG. 77 shows the time-response characteristic of this filter device. For comparison, a dotted line in FIG. 77 shows the characteristic of a filter device which lacks the earth electrode. It is confirmed that the disposition of the earth electrodes 60 between the surface acoustic waver filters reduces the direct feed-through wave by 3.8 dB.

Figure 78:
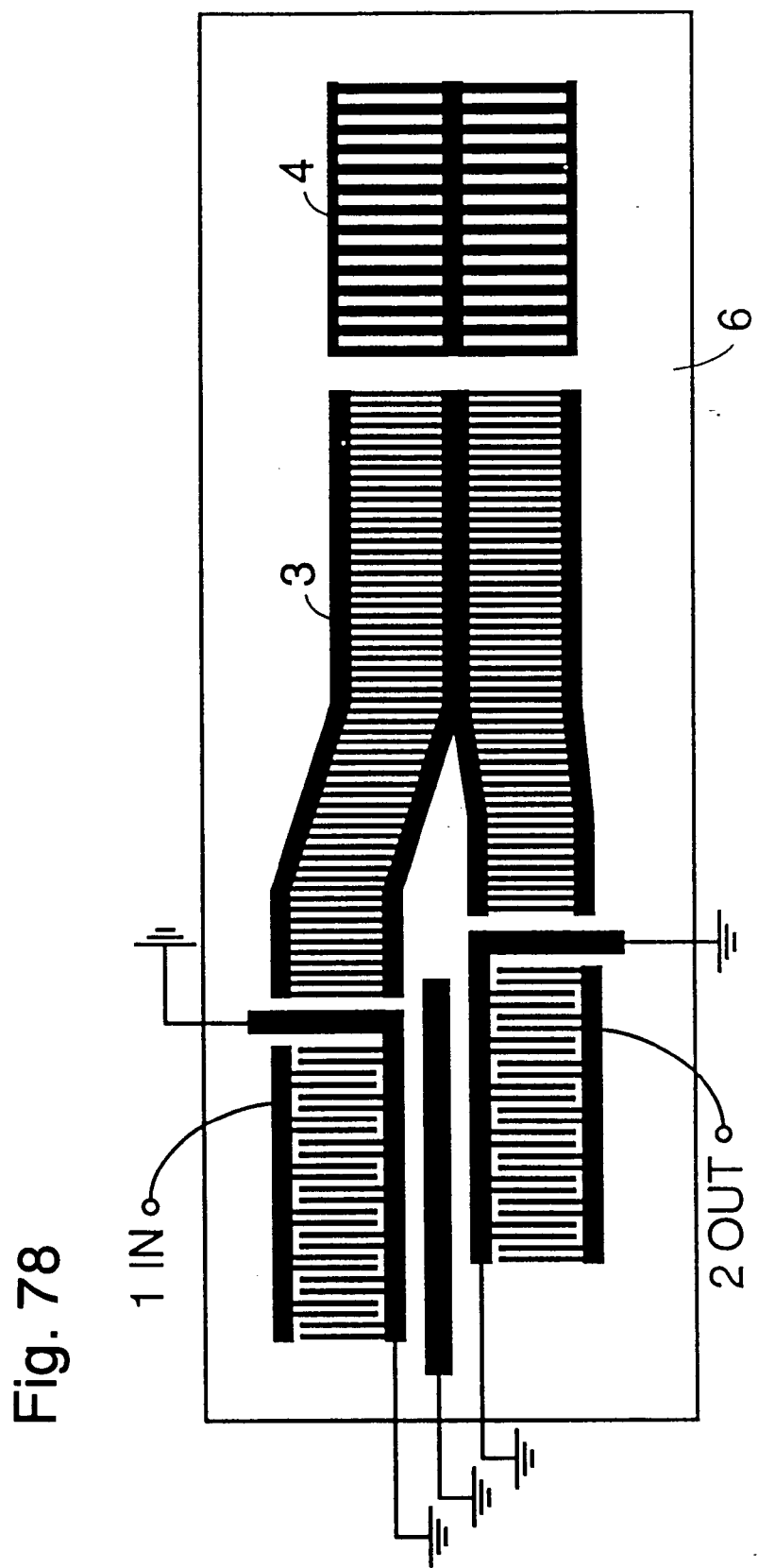
FIG. 78 is a diagram illustrating the construction of a surface acoustic wave filter in which Examples of surface acoustic wave filters of the present invention are combined.

Furthermore, the constructions of the surface acoustic wave filters shown in Examples 1 to 8 described above may be combined for further improvement of the isolation between input and output. For example, FIG. 78 shows a diagram illustrating the construction of a surface acoustic waver filter into which the constructions shown in Example 1, 2, 3 and 4 are integrated.

According to the present invention, the surface acoustic wave filter characterized in that it comprises a piezoelectric substrate, a plurality of surface acoustic wave propagation paths arranged in parallel on the piezoelectric substrate and a coupler for coupling the surface acoustic wave propagation paths, an input interdigital transducer and a first reflector are disposed on at least one of the surface acoustic wave propagation paths with intervention of the coupler, and an output interdigital transducer and a second reflector are disposed on at least one of the other surface acoustic wave propagation paths with intervention of the coupler. Thus, it is possible to reduce the length in the surface acoustic wave propagation direction as compared with the conventional filter and further to provide a surface acoustic wave filter having a frequency characteristic excellent in the shape factor.

Further, if a unidirectional IDT is used as at least one IDT, the SAW energy sent out from the input IDT is effectively incident onto the coupler, and consequently the loss in the surface acoustic wave filter can be reduced.

Further, by rendering the propagation velocity of surface acoustic waves propagating on the gap section of the coupler slower than the propagation velocity on the free surface, the coupling of two waveguide sections can be strengthened. Accordingly, it is possible to form a coupler having a shorter waveguide length in the surface acoustic wave propagation direction so as to reduce the size of the surface acoustic wave filter.

Further, according to the present invention, the propagation velocity of surface acoustic waves in a region outside the waveguide section can be rendered slower than the propagation velocity on the free surface by providing a metal film of a uniform surface structure or a metal film of the grating surface structure in the region. Consequently, the enclosure by the waveguide is weakened and a higher order waveguide mode becomes less liable to be propagated. Accordingly, the SAW energy concentrates on the fundamental mode and it is possible to reduce the loss in the surface acoustic wave filter.

According to the present invention, by weighting the reflector, it is possible to suppress the sidelobe in the frequency characteristic of the reflector and consequently of the surface acoustic wave filter since the sidelobe in the frequency characteristic curve can be suppressed.

Since the period of electrode fingers of the IDT is rendered slightly different from double the period of electrode fingers of the reflector, the center frequency in the frequency characteristic of the reflector can be rendered substantially identical with the center frequency of the center frequency in the frequency characteristic of the IDT. Thus it is possible to make symmetric the frequency characteristic curve of the surface acoustic wave filter and thereby to provide the surface acoustic wave filter having an excellent shape factor.

According to the present invention, the positional relation between the input and output IDTs is shifted or the distance between the input and output IDTs is increased. Thus the isolation between the input and output IDTs of the surface acoustic wave filter can be improved and consequently the degree of suppression outside the passband can be improved.

In other words, if the physical distance between the input and output IDTs is increased, the isolation between input and output can be improved.

By the formation of the SAW waveguides between the input and output IDTs and the coupler, the SAW sent out from the IDT can be lead to the coupler. Thus increase in the loss can be suppressed.

If a bending point is provided in a part of the structure of the SAW waveguide, the SAW sent out from the input IDT becomes incident effectively onto the waveguide. Thus the loss can be reduced.

Further, according to the present invention, the isolation between input and output can be improved further by the formation of the earth electrode between the input and output IDTs or the like.

What is claimed is:

1. A surface acoustic wave filter characterized in that:
   it comprises a piezoelectric substrate, a plurality of surface acoustic wave propagation paths arranged in parallel on the piezoelectric substrate and a coupler for coupling the surface acoustic wave propagation paths,
   an input interdigital transducer and a first reflector are disposed on at least one of the surface acoustic wave propagation paths with intervention of the coupler, and an output interdigital transducer and a second reflector are disposed on at least one of the other surface acoustic wave propagation paths with intervention of the coupler, wherein the first and second reflector are disposed on only one side of the input and output interdigital transducers, respectively, characterized in that the coupler is a waveguide-directional coupler.

2. A surface acoustic wave filter as recited in claim 1 characterized in that the input interdigital transducer and the output interdigital transducer are disposed side by side in a direction perpendicular to a surface acoustic wave propagation direction, and a distance between the input transducer and the output interdigital transducer is longer than a distance between the first reflector and the second reflector.

3. A surface acoustic wave filter as recited in claim 1 characterized in that the input interdigital transducer and the output interdigital transducer comprise a plurality of comb-formed electrode fingers and an electrode finger of at least one of the input interdigital transducer and the output interdigital transducer which electrode finger is the closest to the coupler is grounded.

4. A multistage surface acoustic wave filter characterized in that a plurality of surface acoustic wave filters as set forth in claim 1 are formed on a single piezoelectric substrate and two adjacent surface acoustic wave filters thereof are disposed in parallel but are opposite in an excited surface acoustic wave propagation direction.

5. A multistage surface acoustic wave filter as recited in claim 4 characterized in that an earth electrode is formed on the piezoelectric substrate between the two adjacent surface acoustic wave filters.

6. A multistage surface acoustic wave filter characterized in that a plurality of surface acoustic wave filters as set forth in claim 1 are formed on a single piezoelectric substrate and an earth electrode is formed on the piezoelectric substrate between two adjacent surface acoustic wave filters.

7. A surface acoustic wave filter as recited in claim 1 characterized in that the waveguide-directional coupler comprises a plurality of waveguide sections for propagating a surface acoustic wave excited in one of the surface acoustic wave propagation paths and a gap section located between these waveguide sections and the waveguide sections are formed of a metal film having a uniform surface structure or a metal film having a grating surface structure.

8. A surface acoustic wave filter as recited in claim 7 characterized in that the gap section is formed of a metal film having a uniform surface structure or a metal film having a grating surface structure.

9. A surface acoustic wave filter as recited in claim 8 characterized in that a grating width of the grating surface structure of the waveguide sections and a grating width of the grating surface structure of the gap section are so adjusted that the velocity of a surface acoustic wave propagating in the gap section is higher than the velocity of a surface acoustic wave propagating in the waveguide sections.

10. A surface acoustic wave filter as recited in claim 7 characterized in that a metal film having a uniform surface structure or a metal film having a grating surface structure is formed in a region which is outside the waveguide-directional coupler and does not contact the gap section.

11. A surface acoustic wave filter as recited in claim 1 characterized in that at least one of the reflectors is weighted.

12. A surface acoustic wave filter as recited in claim 1 characterized in that at least one of the reflectors is weighted by withdrawal.

13. A surface acoustic wave filter as recited in claim 1 characterized in that, out of the reflectors disposed on the surface acoustic wave propagation paths, the reflector disposed on at least one of the surface acoustic wave propagation paths is formed of a plurality of reflectors.

14. A surface acoustic wave filter as recited in claim 1 characterized in that the input interdigital transducer and the output interdigital transducer each comprise am excitation section for exciting a surface acoustic wave filter and two bus bar sections disposed at both ends of the excitation section, a bus bar section of the input interdigital transducer and a bus bar section of the output interdigital transducers which are disposed closely to each other are each grounded.

15. A surface acoustic wave filter as recited in claim 14 characterized in that at least one of the grounded bus bar sections is extended to pass between the input interdigital transducer or the output interdigital transducer and the coupler.

16. A surface acoustic wave filter as recited in claim 1 characterized in that the input interdigital transducer and the output interdigital transducer are disposed side by side in a direction perpendicular to a surface acoustic wave propagation direction, and the position of a structural center of at least one of the input interdigital transducer and the output interdigital transducer is shifted in a direction perpendicular to the surface acoustic wave propagation direction with respect to the position of the structural center of the reflector disposed on the same surface acoustic wave propagation path on which said at least one of the input and output interdigital transducers is disposed.

17. A surface acoustic wave filter as recited in claim 16 characterized in that a surface acoustic wave waveguide is formed on the piezoelectric substrate between the shifted interdigital transducer and the coupler.

18. A surface acoustic wave filter as recited in claim 17 characterized in that the surface acoustic wave waveguide is formed of any one of a metal film having a uniform surface structure, an insulating film having a uniform surface structure, a metal film having a grating structure and an insulating film having a grating structure.

19. A surface acoustic wave filter as recited in claim 17 or 18 characterized in that the surface acoustic wave waveguide is in a shape having a bending point therein on the piezoelectric substrate.

20. A surface acoustic wave filter characterized in that:

it comprises a piezoelectric substrate, a plurality of surface acoustic wave propagation paths arranged in parallel on the piezoelectric substrate and a coupler for coupling the surface acoustic wave propagation paths, an input interdigital transducer and a first reflector are disposed on at least one of the surface acoustic wave propagation paths with intervention of the coupler, and an output interdigital transducer and a second reflector are disposed on at least one of the other surface acoustic wave propagation paths with intervention of the coupler, wherein the first and second reflector are disposed on only one side of the input and output interdigital transducers, respectively, characterized in that the input and output interdigital transducers are composed of a plurality of electrode fingers, the first and second reflectors are composed of electrodes of a grating structure having a given period, the period of electrode fingers of the first and second reflectors is slightly different from double the period of the electrode fingers of the interdigital transducers.

21. A surface acoustic wave filter characterized in that:

it comprises a piezoelectric substrate, a plurality of surface acoustic wave propagation paths arranged in parallel on the piezoelectric substrate and a coupler for coupling the surface acoustic wave propagation paths, an input interdigital transducer and a first reflector are disposed on at least one of the surface acoustic wave propagation paths with intervention of the coupler, and an output interdigital transducer and a second reflector are disposed on at least one of the other surface acoustic wave propagation paths with intervention of the coupler, wherein the first and second reflector are disposed on only one side of the input and output interdigital transducers, respectively, characterized in that an earth electrode is formed on the piezoelectric substrate between the input interdigital transducer and output interdigital transducer.

22. A surface acoustic wave filter characterized in that:

it comprises a piezoelectric substrate, a plurality of surface acoustic wave propagation paths arranged in parallel on the piezoelectric substrate and a coupler for coupling the surface acoustic wave propagation paths, an input interdigital transducer and a first reflector are disposed on at least one of the surface acoustic wave propagation paths with intervention of the coupler, and an output interdigital transducer and a second reflector are disposed on at least one of the other surface acoustic wave propagation paths with intervention of the coupler, wherein the first and second reflector are disposed on only one side of the input and output interdigital transducers, respectively, characterized in that the input interdigital transducer and the output interdigital transducer are disposed side by side in a direction perpendicular to a surface acoustic wave propagation direction, and the length in the surface acoustic wave propagation direction of a portion in which the input interdigital transducer and the output interdigital transducer overlay each other in said perpendicular direction is shorter than the length in the surface acoustic wave propagation direction of the shorter one of the input interdigital transducer and output interdigital transducer.

23. A surface acoustic wave filter characterized in that:

it comprises a piezoelectric substrate, a plurality of surface acoustic wave propagation paths arranged in parallel on the piezoelectric substrate and a coupler for coupling the surface acoustic wave propagation paths, an input interdigital transducer and a first reflector are disposed on at least one of the surface acoustic wave propagation paths with intervention of the coupler, and an output interdigital transducer and a second reflector are disposed on at least one of the other surface acoustic wave propagation paths with intervention of the coupler, wherein the first and second reflector are disposed on only one side of the input and output interdigital transducers, respectively, characterized in that the coupler is a wave-guide directional coupler formed using a metallic material and is grounded.

24. A surface acoustic wave filter characterized in that:

it comprises a piezoelectric substrate, a plurality of surface acoustic wave propagation paths arranged in parallel on the piezoelectric substrate and a coupler for coupling the surface acoustic wave propagation paths, an input interdigital transducer and a first reflector are disposed on at least one of the surface acoustic wave propagation paths with intervention of the coupler, and an output interdigital transducer and a second reflector are disposed on at least one of the other surface acoustic wave propagation paths with intervention of the coupler, wherein the first and second reflector are disposed on only one side of the input and output interdigital transducers, respectively, characterized in that an earth electrode is formed on the piezoelectric substrate at least between the input interdigital transducer and the coupler or between the output interdigital transducer and the coupler.

25. A surface acoustic wave filter characterized in that:

it comprises a piezoelectric substrate, a plurality of surface acoustic wave propagation paths arranged in parallel on the piezoelectric substrate and a coupler for coupling the surface acoustic wave propagation paths, an input interdigital transducer and a first reflector are disposed on at least one of the surface acoustic wave propagation paths with intervention of the coupler, and an output interdigital transducer and a second reflector are disposed on at least one of the other surface acoustic wave propagation paths with intervention of the coupler, wherein the first and second reflector are disposed on only one side of the input and output interdigital transducers, respectively, characterized in that at least one of the input interdigital transducer and output interdigital transducer is weighted.

26. A surface acoustic wave filter as recited in claim 25 characterized in that the weighting of the input or output interdigital transducer is weighting by apodization or weighting by withdrawal.

27. A surface acoustic wave filter characterized in that:

it comprises a piezoelectric substrate, a plurality of surface acoustic wave propagation paths arranged in parallel on the piezoelectric substrate and a coupler for coupling the surface acoustic wave propagation paths, an input interdigital transducer and a first reflector are disposed on at least one of the surface acoustic wave propagation paths with intervention of the coupler, and an output interdigital transducer and a second reflector are disposed on at least one of the other surface acoustic wave propagation paths with intervention of the coupler, wherein the first and second reflector are disposed on only one side of the input and output interdigital transducers, respectively, characterized in that at least one of the input interdigital transducer and output interdigital transducer is an unidirectional interdigital transducer.

28. A surface acoustic wave filter as in any one of claims 20, 21, 22, 24, 25, 26 and 27, in which the coupler is a multi-strip coupler.

* * * * *